(12) United States Patent
Brown

(10) Patent No.: US 7,423,981 B2
(45) Date of Patent: Sep. 9, 2008

(54) METHOD AND APPARATUS FOR AN INCREMENTAL UPDATE OF A LONGEST PREFIX MATCH LOOKUP TABLE

(75) Inventor: David A. Brown, Carp (CA)

(73) Assignee: SAtech Group A.B. Limited Liability Company, Wilmington, DE (US)

(*) Notice: Subject to any disclaimer, the term of this patent is extended or adjusted under 35 U.S.C. 154(b) by 661 days.

(21) Appl. No.: 09/733,629

(22) Filed: Dec. 8, 2000

(65) Prior Publication Data

US 2001/0043602 A1 Nov. 22, 2001

Related U.S. Application Data

(60) Provisional application No. 60/212,966, filed on Jun. 21, 2000, provisional application No. 60/170,232, filed on Dec. 10, 1999.

(51) Int. Cl.
*H04L 12/28* (2006.01)
(52) U.S. Cl. .................. 370/256; 370/392; 370/395.31; 370/395.7; 370/408; 709/242; 711/150; 711/157; 711/168
(58) Field of Classification Search ............. 370/381, 370/382, 383, 395.3, 395.31, 395.32, 395.52, 370/395.7, 395.71, 395.72, 399, 408, 409, 370/256; 709/227, 228, 242, 245; 711/140, 711/150, 157, 168, 169, 173
See application file for complete search history.

(56) References Cited

U.S. PATENT DOCUMENTS

| 4,450,525 | A | * | 5/1984 | Demuth et al. ............... 712/243 |
| 4,661,658 | A | | 4/1987 | Matyas ......................... 380/23 |
| 5,202,986 | A | * | 4/1993 | Nickel ............................ 707/3 |
| 5,329,618 | A | | 7/1994 | Moati et al. |
| 5,359,724 | A | | 10/1994 | Earle |
| 5,384,568 | A | * | 1/1995 | Grinberg et al. .............. 341/51 |

(Continued)

FOREIGN PATENT DOCUMENTS

EP 0453707 A2 10/1991

(Continued)

OTHER PUBLICATIONS

Degermark Mikael et al., "Small Forwarding Tables for Fast Routing Lookups", Department of Computer Science and Electrical Engineering, Luleå University of Technology, Sweden, *SigComm '97 Cannes, France* pp. 3-14 (1997).

*Primary Examiner*—Chi H. Pham
*Assistant Examiner*—Shick Hom
(74) *Attorney, Agent, or Firm*—McDonnell Boehnen Hulbert & Berghoff LLP

(57) ABSTRACT

A method and apparatus for performing an incremental update of a lookup table while the lookup table is available for searching is presented. To add or delete a route, a second set of routes is stored in a second memory space in the lookup table, while access is provided to the first set of routes stored in a first memory space in the lookup table. Access is provided to the first memory space through a first pointer stored in a subtree entry. After storing the second set of routes in the second memory space, access is switched to the first set of routes in the first memory space by replacing the first pointer stored in the subtree entry with a second pointer to the second memory space.

17 Claims, 34 Drawing Sheets

U.S. PATENT DOCUMENTS

| | | | |
|---|---|---|---|
| 5,386,413 A | | 1/1995 | McAuley et al. |
| 5,479,401 A | | 12/1995 | Bitz et al. |
| 5,561,786 A | * | 10/1996 | Morse .................. 711/170 |
| 5,787,151 A | * | 7/1998 | Nakatsu et al. .......... 379/88.23 |
| 5,857,196 A | | 1/1999 | Angle et al. ................ 707/102 |
| 5,946,679 A | * | 8/1999 | Ahuja et al. .................... 707/3 |
| 6,014,659 A | | 1/2000 | Wilkinson et al. |
| 6,034,958 A | * | 3/2000 | Wicklund .............. 370/395.32 |
| 6,067,574 A | * | 5/2000 | Tzeng ....................... 709/247 |
| 6,085,188 A | | 7/2000 | Bachmann et al. ............. 707/3 |
| 6,141,655 A | | 10/2000 | Johnson et al. |
| 6,189,143 B1 | * | 2/2001 | Simonyi .................... 717/109 |
| 6,223,172 B1 | | 4/2001 | Hunter et al. |
| 6,247,014 B1 | | 6/2001 | Ladwig et al. |
| 6,266,706 B1 | * | 7/2001 | Brodnik et al. ............. 709/242 |
| 6,338,079 B1 | * | 1/2002 | Kanamori et al. ........... 718/104 |
| 6,452,908 B1 | * | 9/2002 | Yamada et al. .............. 370/256 |
| 6,460,112 B1 | | 10/2002 | Srinivasan et al. .......... 711/108 |
| 6,512,766 B2 | | 1/2003 | Wilford ...................... 370/389 |
| 6,526,055 B1 | | 2/2003 | Perlman et al. ............. 370/392 |
| 6,553,002 B1 | * | 4/2003 | Bremer et al. .............. 370/254 |
| 6,563,823 B1 | * | 5/2003 | Przygienda et al. ......... 370/392 |
| 6,570,866 B1 | | 5/2003 | Murase et al. |
| 6,658,482 B1 | * | 12/2003 | Chen et al. .................. 709/245 |
| 6,687,247 B1 | * | 2/2004 | Wilford et al. .............. 370/392 |
| 6,744,775 B1 | * | 6/2004 | Beshai et al. ............... 370/409 |
| 2001/0056417 A1 | | 12/2001 | Cao et al. ....................... 707/3 |
| 2002/0091856 A1 | | 7/2002 | Brown ....................... 709/238 |

FOREIGN PATENT DOCUMENTS

| | | |
|---|---|---|
| WO | WO 99/14606 | 3/1999 |
| WO | WO 99/14906 | 3/1999 |
| WO | WO 01/10097 A2 | 2/2001 |

* cited by examiner

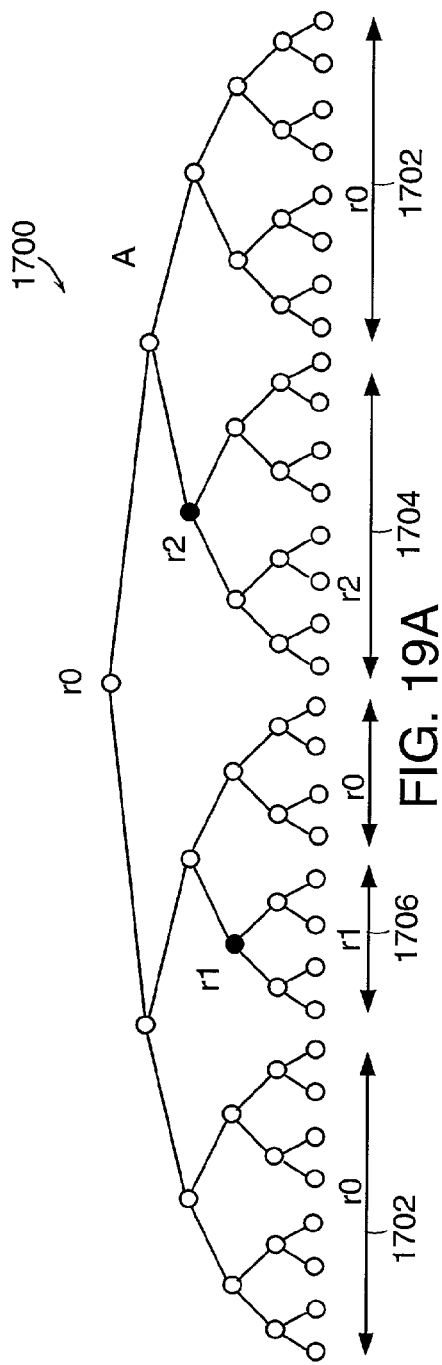
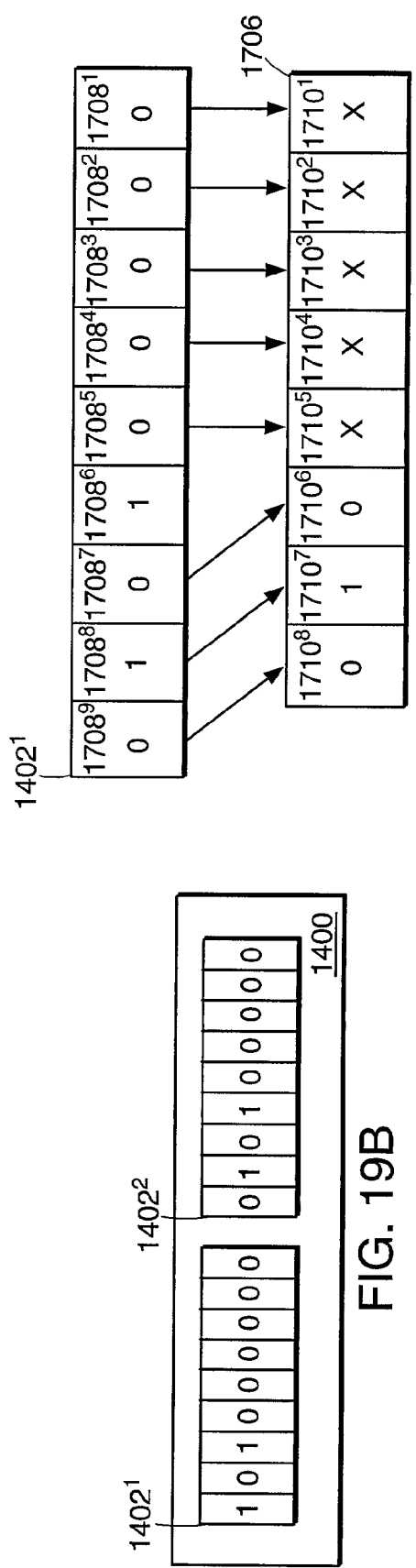
FIG. 19A
FIG. 19B
FIG. 19C

METHOD AND APPARATUS FOR AN INCREMENTAL UPDATE OF A LONGEST PREFIX MATCH LOOKUP TABLE

RELATED APPLICATIONS

This application claims priority to U.S. Provisional Application Ser. Nos. 60/170,232, filed Dec. 10, 1999 and 60/212,966, filed Jun. 21, 2000, the entire teachings of which are incorporated herein by reference.

BACKGROUND OF THE INVENTION

The Internet is a set of networks connected by routers. A router maintains a routing table that indicates for each possible destination network, the next hop to which a received data packet should be forwarded. The next hop may be another router or the final destination.

An Internet Protocol ("IP") data packet received at a port in a router includes an IP destination address. The IP destination address is the final destination of the IP data packet. Currently there are two versions of IP, IP version 4 ("IPv4") and IP version 6 ("IPv6"). IPv4 provides a 32-bit field in an IP header included in the data packeted for storing the IP destination address. The router forwards a received data packet connected to a next-loop router or the final destination if the destination is the local network, dependent on the IP destination address stored in the IP header.

A 32-bit IPv4 destination address provides 4 billion possible routes. An Internet router typically stores 50,000 of the 4 billion possible routes. However, the number of stored routes will increase with the growth of the Internet and the widespread use of IPv6.

Originally, the IP address space was divided into three classes of IP addresses; A, B and C. Each IP address space was divided into a network address and a host address. Class A allowed for 126 networks and 16 million hosts per network. Class B allowed for 16382 networks with 64,000 hosts per network and class C allowed for 2 million networks with 256 hosts per network. However, dividing the IP address space into different classes reduced the number of available IP addresses. Class C only allowed a maximum of 256 hosts per network which is too small for most organizations. Therefore, most organizations were assigned a Class B address, taking up 64,000 host addresses which could not be used by other organizations even if they were not used by the organization to which they were assigned. Hosts in an organization with a Class B IP address all store the same network address in the 16 Most Significant Bits ("MBSs"), for example, 128.32.xx.xx.

Classless InterDomain Routing ("CIDR") was introduced to free up unused IP host addresses. The remaining unused networks are allocated to organization in variable sized blocks. An organization requiring 500 addresses gets 500 continuous addresses. For example, an organization can be assigned 500 available addresses starting at 128.32. xx. The number of routes stored by a router has increased since the introduction of Classless InterDomain Routing. Classless InterDomain Routing requires longest prefix matching to find the corresponding route instead of searching for a matching network address in order to find the corresponding next hop for the IP destination address. For example, a search can no longer stop after the 16 MSBs of a Class B IP address, for example, 128. xx.xx because 128.32.4. xx may be assigned to another organization requiring a different next hop.

One method for searching for a longest prefix match for a key is through the use of a binary tree search. A binary tree search matches a 32-bit input bit by bit down to 32 levels, requiring 32 searches to finding the entry matching the 32-bit key. Another method for searching for a match is through the use of a Patricia tree. A Patricia tree reduces the number of searches required if there are no entries down a leaf of the binary tree.

Yet another method for efficiently searching for a next hop associated with an IP destination address is described in PCT application Ser. No. PCT/SE98/00854 entitled "Method and System for Fast Routing Lookups" by Brodnick et al. filed on May 11, 1998. The method described by Brodnick reduces the number of next hops stored by not storing duplicate routes. By reducing the number of next hops, the memory requirement is reduced so that a route lookup table can be stored in fast cache memory.

Brodnick et al. divides the binary tree into 3-levels. Dividing the binary tree into 3-levels reduces the number of searches to three. The indexed entry in the first level indicates whether the search can end at the first level with the route taken from the entry, or the search must continue to a subsequent level using a further portion of the IP destination address.

FIG. 1A illustrates a prior art 64K (65536) bit map representing the first level of a binary tree. A 64K bit map 30 represents the leaves or nodes 44 of the binary tree at depth 16, with one bit per node 44. The bit map is divided into bit-masks of length 16. There are $2^{12}$=4096 bit masks in the 64 k bit map. One bit mask is shown in FIG. 1A. A bit in the bit map 30 is set to '1' if there is a subtree or a route index stored in an array of pointers corresponding to the node 44. A bit in the bit map 30 is set to '0' if the node shares a route entry with a previous node 44.

FIG. 1B illustrates prior art lookup table implemented in cache memory. The lookup table includes an array of code words 36, an array of base indices 34 and a map table 40. A 32-bit IP address 38 is also shown in FIG. 1B. A codeword 46 is stored in the array of code words 36 for each bit mask in the bit map 30 (FIG. 1A). The code word 46 includes a six-bit value 46a and a 10-bit offset 46b. A base index 42 is stored in the array of base indices 34 for every four code words 46 in the array of code words 36.

The array of code words 36, array of base indices 34 and map table 40 are used to select a pointer in an array of pointers (not shown). The pointer stores a route index or an index to perform a further search.

A group of pointers in the array of pointers is selected by selecting a code word 46 in the array of code words 36 and a base index 42 in the array of base indices 34. The code word 46 is selected using the first 12 bits 50 of the IP address 38. The base index 42 is selected using the first 10 bits 48 of the IP address 38. The correct pointer in the group of pointers is selected using the map table 32.

The 10-bit value 46b in the selected code word 36 is an index into the map table 32. The map table 32 maps bit numbers within a bit-mask to 4-bit offsets. The offset specifies the pointer within the selected group of pointers in the array of pointers. The 10-bit value 46b selects the row in the map table 32 and bits 19:16 of the IP address 52 selects the 4-bit offset 54.

Thus, a search for a pointer requires the following cache memory accesses: (1) read a 16 bit code word 46; (2) read a 16-bit base address 42; (3) read a 4 bit offset 54 from the map table 32; (4) read a pointer at a pointer index where the pointer index is the sum of the base address 42, the code word offset 46a and the 4-bit offset 54.

The same memory accesses are required for each level of the binary tree. Thus, a search of three levels requires 12 memory accesses.

The routes stored in the lookup table may change. A new route can be generated through the use of a routing protocol, based on changing network topology or route congestion. Routing protocols include Open Shortest Path First ("OSPF"), External Gateway Protocol ("EGP"), Border Gateway Protocol ("BGP"), InterDomain Policy Routing ("IDPR") and Routing Information Protocol ("RIP"). The routing protocol uses a routing algorithm to determine a route. Routing information is shared between routers through the use of routing protocol messages. The routing protocol messages allow routers to update and maintain tables. Adding a new route requires a batch update to update the entire lookup table. While the batch update is being performed the lookup table can not be searched.

SUMMARY OF THE INVENTION

We present a method and apparatus for performing an incremental update of a lookup table while the lookup table is available for searching. A first set of routes and associated first subtree entry is stored in a first memory space in the lookup table. Access is provided to the first memory space through a first pointer to the first subtree entry. A second set of routes and associated second subtree entry is stored in a second memory space in the lookup table. Access is switched to the second set of routes stored in the second memory by replacing the first pointer stored to the first subtree entry with a second pointer to the second subtree entry. The first memory space is deallocated after switching access.

The number of routes in the first set of routes may be less than the number of routes in the second set of routes or the number of routes in the first set of routes is greater than the number of routes in the second set of routes.

BRIEF DESCRIPTION OF THE DRAWINGS

FIG. 19A-D illustrate the selection of a block offset for a node in a sparsely populated subtree;

Figure 1A:
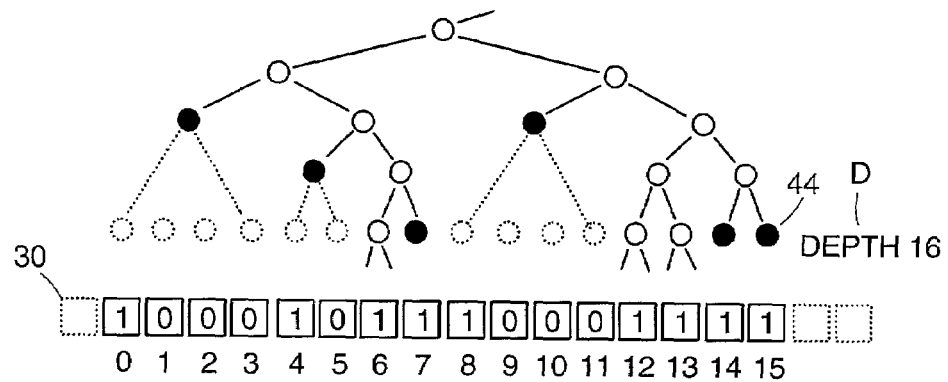
FIG. 1A illustrates a prior art bit map for representing the first level of a binary tree.
Figure 1B:
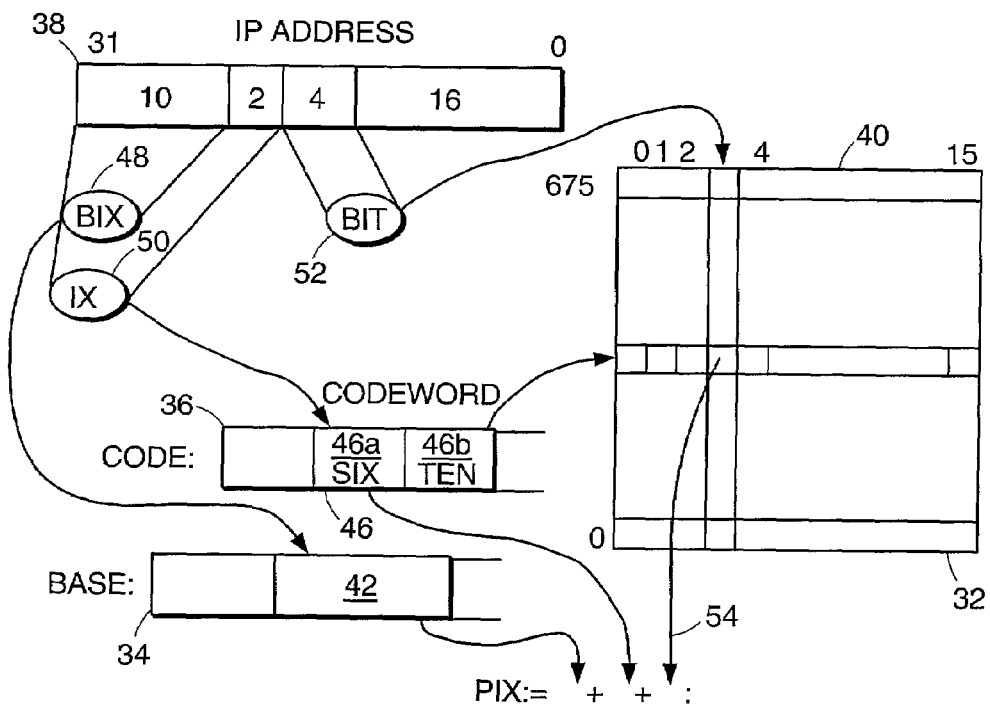
FIG. 1B illustrates a prior art lookup table implemented in cache memory.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Dense Mode

Figure 2A:
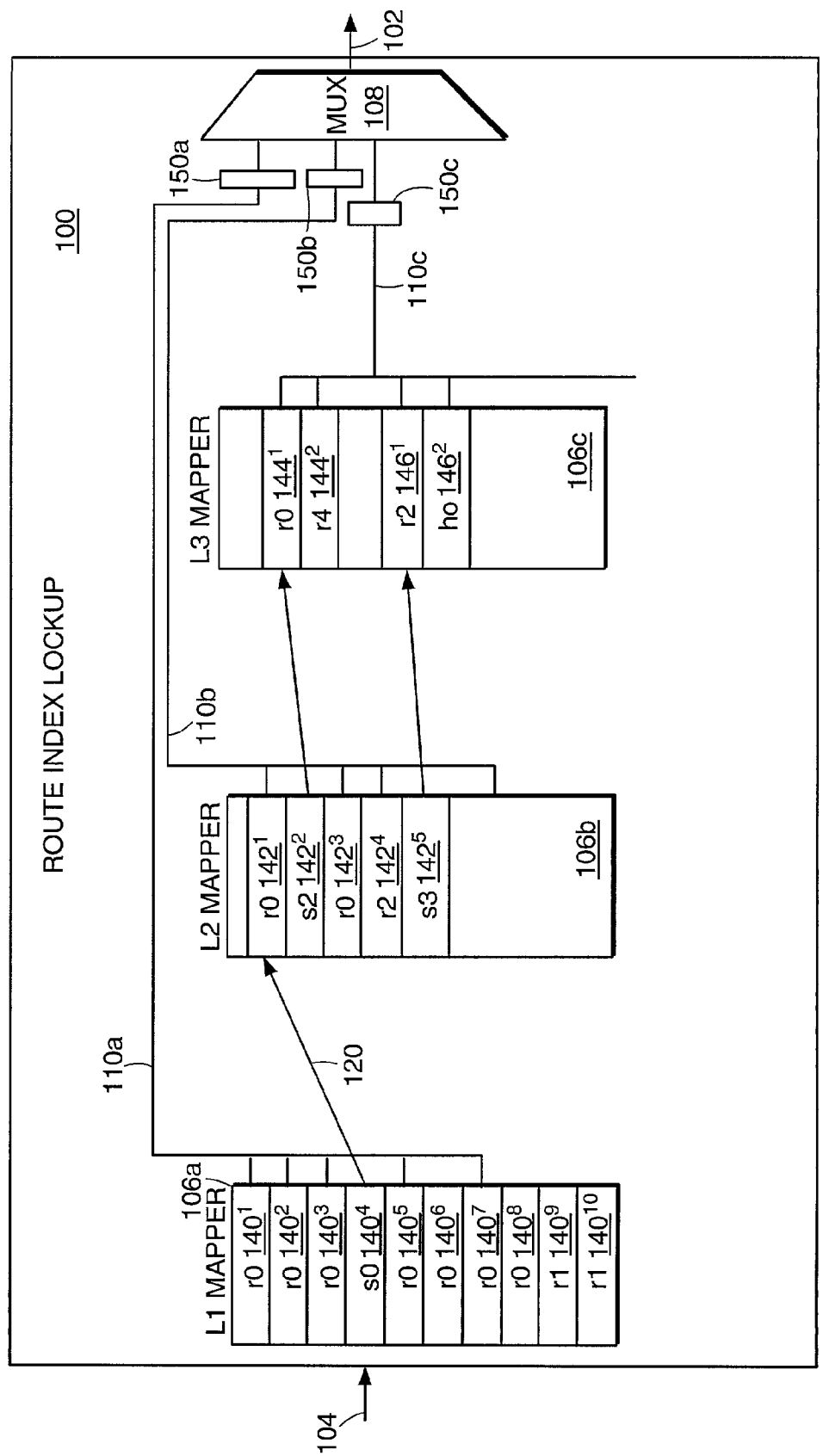
FIG. 2A illustrates a longest match prefix lookup table according to the principles of the present invention.

FIG. 2A illustrates a longest match prefix lookup table 100 according to the principles of the present invention. The lookup table 100 provides a route index 102 for a key 104. The route index 102 is used to access the next hop for the IP destination address. In the embodiment shown in FIG. 2A the key 104 is 32 bits wide, however, the key 104 is not limited to 32 bits. The lookup table 100 includes three mappers 106a-c. Each mapper 106a-c includes a separately addressed memory. The route index 102 or a default route index corresponding to the key 104 is stored in a location in one of the mappers 106a-c. The mapper outputs 110a-c from each mapper are stored in delay memory 150a-c until all mappers 106a-c have been accessed for the key, if multiple mappers are required to be searched.

The multiplexer 108 selects one of the mapper outputs 110a-c forwarded to the inputs of the multiplexer 108 as the route index 102. The mapper output 110a-c is selected dependent on the Most Significant bit ("MSB") of the mapper output 110a-c. The MSB of the mapper output 110a-c is '1' only if the mapper output 110a-c includes a route index 102.

Figure 2B:
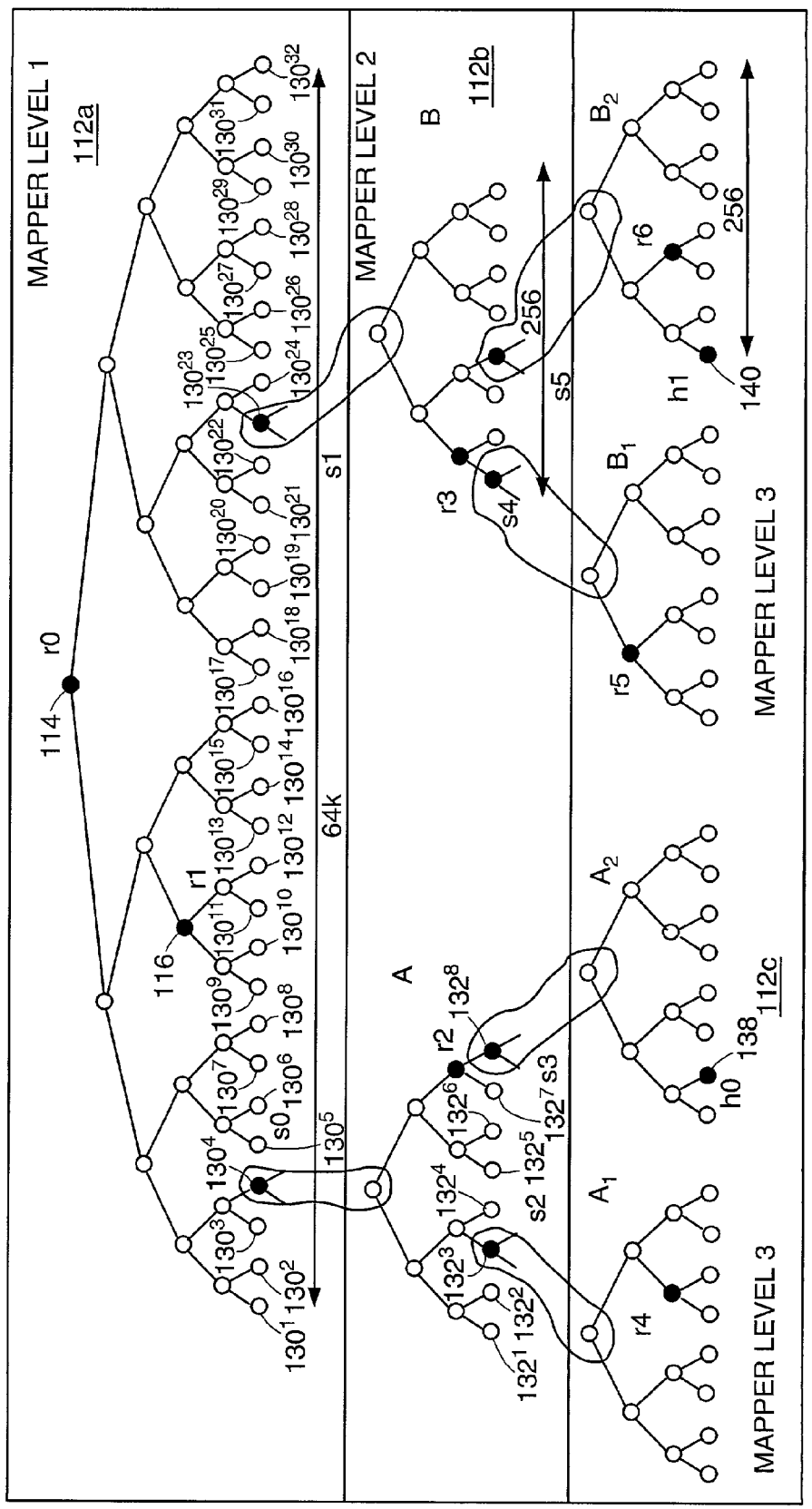
FIG. 2B illustrates a binary tree representation of the route indexes stored in the lookup table shown in FIG. 2A.

FIG. 2B illustrates a binary tree representation of the entries stored in the mappers 106a-c in the lookup table 100 shown in FIG. 2A. FIG. 2B is described in conjunction with FIG. 2A. The 32-bit key 104 can be represented as a 32-level binary tree. A binary tree implementation requires 32 searches to search bit by bit down to 32 levels. To reduce the number of searches, the 32 levels of the binary tree are divided into three mapper levels 112a-c with each mapper level 112a-c corresponding to a mapper 106a-c (FIG. 2A). Mapper level_1 112a includes the first 16 of the 32 levels of the binary tree. However, for simplicity only 5 of the 16 levels are shown in FIG. 2B. Mapper level_2 112b includes the next 8 levels of the 32-level binary tree, with three of the eight levels shown in FIG. 2B. Mapper level_3 includes the last 8 levels of the 32-level binary tree, with three of the eight levels shown in FIG. 2B. Each mapper level 112a-c includes a plurality of nodes. Dividing the 32-levels such that 16-levels (16 MSBs of the key 104) are in mapper level_1 112a, 8-levels in mapper level_2 112b and 8-levels in mapper level_3 appears to be optimal in the current memory technology; however, the invention is not limited to this configuration.

Instead of performing 16 separate bit by bit searches for the first 16 bits of the key 104, the route indices 102 associated with the first 16-bits of the key 104 are stored in mapper 106a (FIG. 2A). The mapper 106a (FIG. 2A) is directly indexed with the first 16-bits MSBs of the key 104. The next mapper 106b is searched dependent on whether the previous mapper 106a stores the route index 102 used to access the next hop information associated with the key 104.

As shown in FIG. 2B, the nodes or leaves shown in mapper level_1 112a include two routes 114, 116 labeled r0 and r1 respectively and two pointers to mapper level_2 112b $130^4$ and $130^{23}$ labeled s0 and s1, respectively. A route index 102 for each route 114, 116 is stored in the L1 mapper 106a. Also, an address pointer 120 for L2 mapper 106b is stored for subtree index $130^4$ and an address pointer (not shown) for L2 mapper 106b is stored for subtree $130^{23}$. An address pointer 120 stored for subtree index $130^4$, in mapper entry $140^4$ in mapper 106a indicates that a search of the next level is required in order to find a route index 102 associated with the key 104.

The value of any node in the tree can be determined by tracing a path from the root 114. Each node in the binary tree is shown with two children, a right child and a left child. The right child is chosen if the parent node is '1.' The left child is chosen if the parent node is '0'. Tracing the path from the root 114 to node 116, r1 is stored as the route index 102 in the L1 mapper 106a for all keys with MSBs set to '010'. Tracing the path from the root node 114 to s0 node $130^4$, s0 is stored in the L1 mapper 106a for all keys with MSBs set to '00011'.

The L1 mapper 106a is a direct mapped mapper and stores a route index 102 for each bottom-level node or leaf in the bottom level of mapper level_1 112a. The bottom level of mapper level_1 112a is the sixteenth level of the 32-level binary tree. The sixteenth level has 64K nodes. However, for illustrative purposes, the bottom level of mapper level_1 112a is shown as level-5 of the 32-level binary tree. The route indices 102 shown in the L1 mapper 106a correspond to level-5 $130^1$-$130^{32}$ nodes of mapper level_1 112a. Tracing the path from the root node 114 to level_5 nodes $130^1$, $130^2$, $130^3$ the route index 102 is r0. Thus r0 is stored in locations $140^1$, $140^2$, $140^3$ of L1 mapper 106a; that is, at index 00000, 00001, and 00010. Node $130^4$ stores a subtree index s0, thus s0 is stored in location $140^4$ in the L1 mapper 106a at address 00011. Similarly the route index 102 for level-5 nodes $130^5$-$130^8$ is r0 thus, locations $140^5$, $140^6$, $140^7$, $140^8$ at addresses 00100, 00101, 00110, and 00111 in the L1 mapper 106a store r0. The route index 102 for level-5 nodes $130^9$-$130^{12}$ is r1, thus locations $140^9$, $140^{10}$ at addresses 01000 and 01001 in the L1 mapper 106a store r1.

Each location in the L1 mapper 106a stores a route index 102 assigned to the level-5 node $300^1$-$300^{32}$ directly or through a parent of the level-5 node $300^{1-32}$ or an address pointer to the next mapper 106b-c. Mapper level_3 112c includes two host nodes h0 at node 138 and h1 at node 140 at the bottom level of the 32-level binary tree. A search for a host node requires a search of all bits of the key 104. As shown in FIG. 2A the route index 102 for h0 is stored in location $146^4$ in L3_mapper 106c. Unlike the L1 mapper 106a, the L2 mapper 106b and L3 mapper 106c are not directly mapped.

In mappers 106b, and 106c, a route index 102 is not stored for each possible input. A route index 102 is stored only if the route index 102 for the node differs from the previously stored route index 102 in the mapper 106b-c. Looking at the level-3 nodes in the first subtree A shown in mapper level_2 112b, the route index 102 for node $132^1$ and node $132^2$ is r0, therefore a route index for r0 is stored in location $142^1$ for both node $132^1$ and node $132^2$ in the L2 mapper 106b. A subtree index s2 for node $132^3$ is stored in location $142^2$. The route index 102 associated with level-3 node $132^4$ and level-3 nodes $132^5$ and $132^6$ is r0, which is different from s2 stored for the previous node $132^3$, thus r0 is stored in the next location $142^3$ in L2 mapper 106b. Route r2 is stored in location $142^4$ in L2 mapper 106b for node $132^7$ because node $132^7$ does not share the same route as the previous node $132^6$. Subtree index s3 is stored for the next level-3 node $132^8$, thus s3 is stored in location $142^5$ in the L2 mapper 106b. By storing a route index only when there is a route change from the previous node, the memory required for storing route indices 102 is reduced. As shown, only five locations are required in the L2 mapper 106b for storing route indices for the eight level-3 nodes $132^{1-8}$ in the first subtree A in mapper level_2 112b. The non-direct mapper 106b, 106c is described in more detail later in conjunction with FIG. 5.

Figure 3:
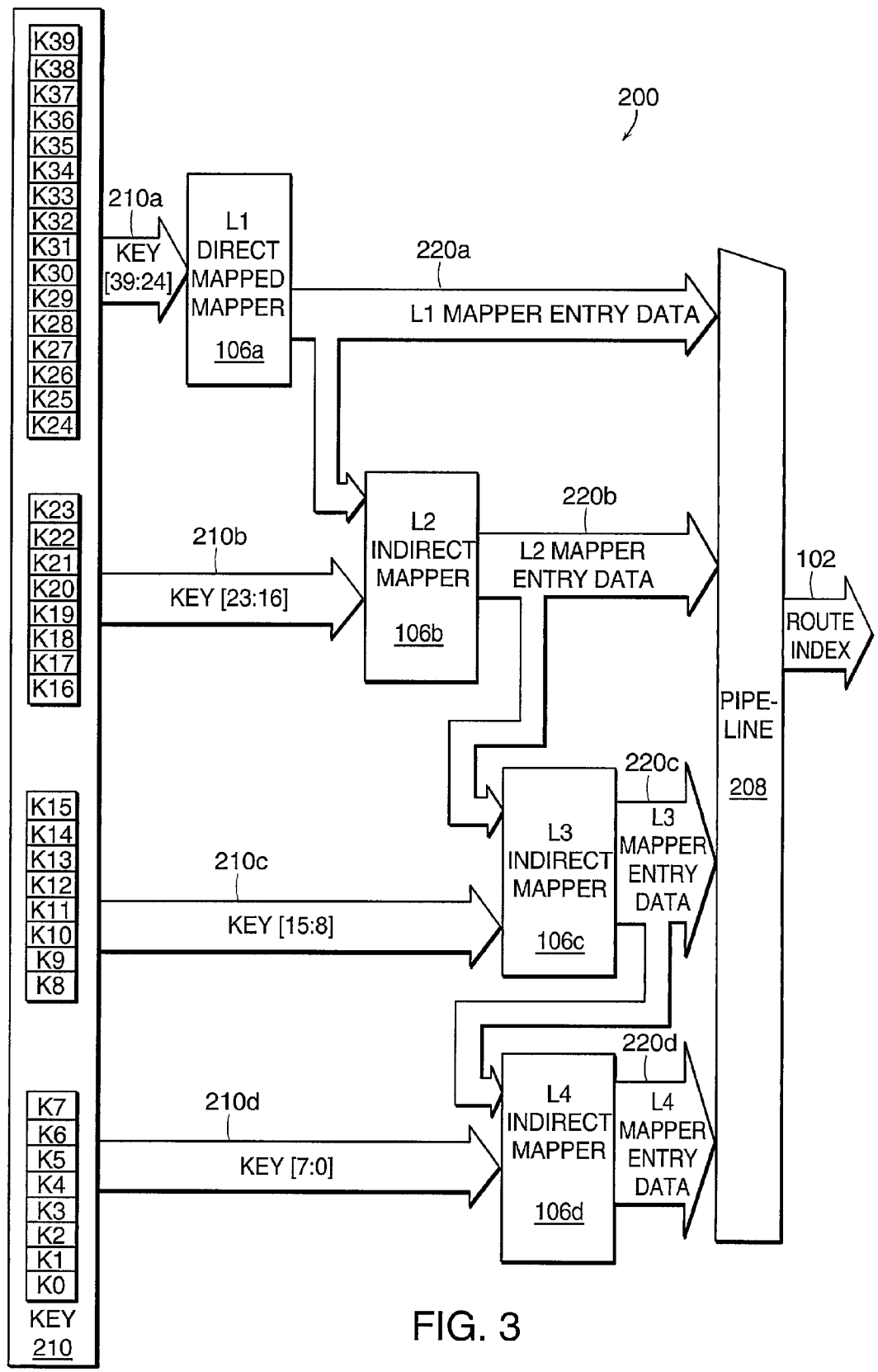
FIG. 3 illustrates a longest match prefix lookup table for a 40-bit key according to the principles of the present invention.

FIG. 3 illustrates a longest match prefix lookup table 200 for a 40-bit key 210 according to the principles of the present invention. In one embodiment the 40-bit key includes an 8-bit prefix and a 32-bit IP address. The 8-bit prefix can be a Virtual Private Network ("VPN") identifier associated with the 32-bit IP address. The lookup table 200 includes four mappers 106a-d. Mapper 106a is a direct mapped mapper as described in conjunction with FIG. 2A. Mappers 106b-d are indirect mappers. Mapper 106a stores a route index 102 or a subtree index for the L2 mapper 106b corresponding to the 16 MSBs of the 40-bit key 210. Thus, the L1 mapper has 64K possible locations, one for each of the 64K nodes in the first mapper level 112a (FIG. 2B). The L1 mapper entry data 220a stored at the corresponding location in the L1 mapper 106a is forwarded to a pipeline 208 and the L2 indirect mapper 106b. If the L1 mapper entry data 220a indicates that a search of the next level is required using the next eight bits of the key 210b, a search is performed in the L2 indirect mapper 106b dependent on the next eight bits of the key 210b, and the L1 mapper entry data 220a.

The result of the second level search is provided on L2 mapper entry data 220b which is forwarded to the pipeline 208 and the L3 indirect mapper 106c. A third level search is performed in the L3 indirect mapper 106c dependent on the next eight bits of the key 210c and the L2 mapper entry data 220b.

The result of the search is provided on L3 mapper entry data 220c to the pipeline 208 and to the L4 indirect mapper 106d. The L3 mapper entry data 220c determines if a fourth search is performed in the L4 indirect mapper 106d dependent on the last eight bits of the key 210d and the L3 mapper entry data 220c.

The result of the fourth search is provided on L4 mapper entry data 220d. The route index 102 associated with the longest match prefix for key 210 is stored in only one location in one of the mappers 106a-d. Thus, the route index 102 forwarded to the pipeline 208 is included in only one mapper entry data 220a-d. If the route index 102 is found in one of the mappers 106a-d, for example, mapper 106b a search of the remaining mappers 106c-d is not necessary and mappers 106c-d are not accessed. The pipeline 208 includes a multiplexer 108 (FIG. 2A) for selecting the route index 102 included in one of the mapper entry data 220a-d. For example, the MSB of the mapper entry data 220a-d can provide an indication of whether a route index is included.

By using a pipeline 208 in conjunction with the mappers 106a-d, multiple searches of the longest match prefix table 200 with different keys 210 can be performed in parallel. The pipeline 208 allows multiple searches of the 40-bit lookup table 200 to take place in parallel by storing the mapper entry data 220a-d for each mapper 106a-d associated with the 40-bit key 210 until a search of each of the other mappers 106a-d has been completed, if required, to find route index corresponding to the 40-bit key 210. Thus, a search request for a route index corresponding to a received IP address is issued to the lookup table 200 by performing a single memory access to the direct mapped mapper 106a. A subsequent search for a route index corresponding to another key can be issued to the lookup table 200 in the next memory access cycle for the direct mapped mapper 106a.

Figure 4:
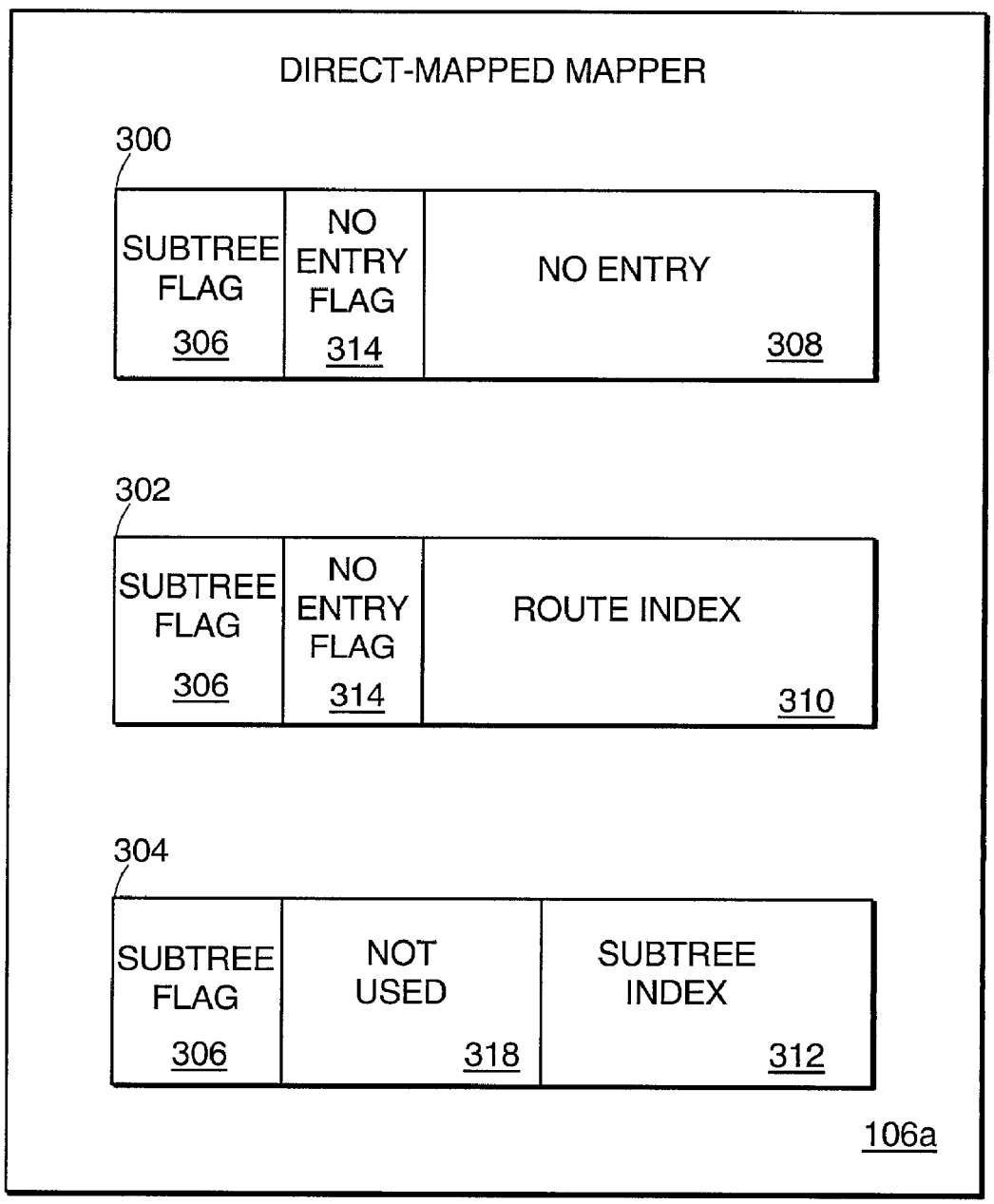
FIG. 4 illustrates the types of mapper entries which can be stored in the direct mapped mapper shown in FIG. 2A.

FIG. 4 illustrates the types of mapper entries which can be stored in the direct mapped mapper 106a shown in FIG. 3. A mapper entry for any node in the binary tree shown in FIG. 2B can store, a no-entry 300, a route entry 302 or a subtree entry descriptor 304. Each type of mapper entry 300, 302, 304 includes a subtree flag 306. The state of the subtree flag 306 indicates whether the mapper entry is a subtree entry descriptor 304. If the subtree flag 306 is set to '1', the mapper entry is a subtree entry descriptor 304 and includes a subtree index 312. The subtree index 312 is the address of the subtree entry descriptor 304 stored in the next non-direct mapped mapper 106b-d. The subtree entry is described later in conjunction with FIG. 5. If the subtree flag 306 is '0', the no-entry flag 314 is checked to determine if the mapper entry is a no-entry 300 or a route entry 302. If the no-entry flag 314 is '0', the entry is a no-entry 300. If the no-entry flag 314 is '1', the entry is a route entry 302 and stores the route index 102 (FIG. 3) associated with the key 104 in the route index field 310. The subtree flag 306 is used by the multiplexer 108 (FIG. 2A) to select the mapper entry data 220a-d including the route index 102 (FIG. 3).

Figure 5:
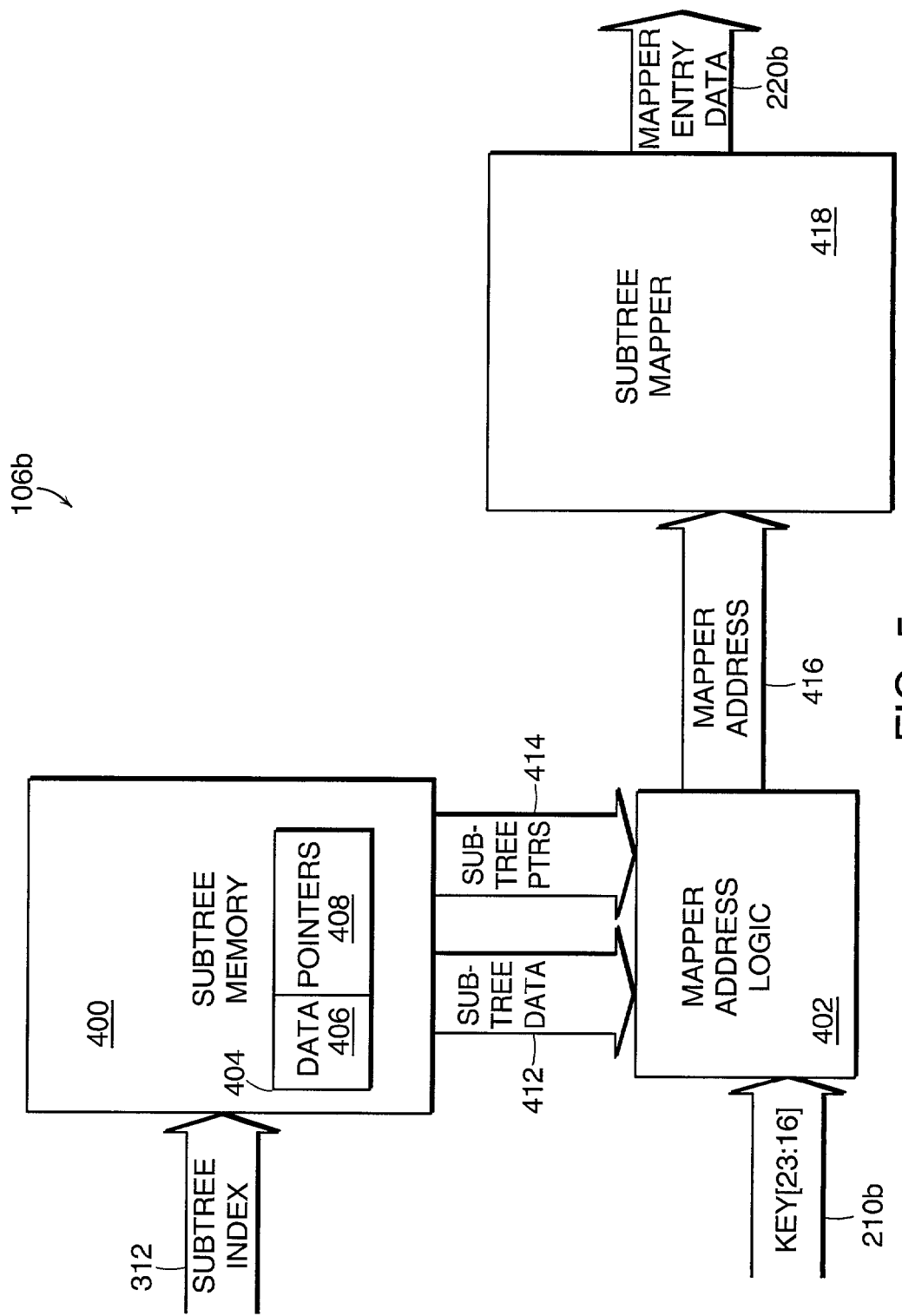
FIG. 5 illustrates the mapper corresponding to the nodes in mapper level_2 112b shown in FIG. 2B.

FIG. 5 illustrates the mapper 106b corresponding to the nodes in mapper level_2 112b shown in FIG. 2B. The mapper 106b includes a subtree memory 400, mapper address logic 402 and a subtree mapper 418. The subtree index 312 selected by the first portion of the key 210a stored in mapper 106a is forwarded to the subtree memory 400. The subtree memory 400 includes a subtree entry 404 selected by the subtree index 312. The subtree entry 404 includes a data field 406 and a pointers field 408.

Returning to FIG. 2B, the subtree entry 404 corresponds to the bottom level of one of the subtrees shown in mapper level_2 112b. If mapper level_2 112b has eight levels, the bottom level of each subtree (not shown) has a maximum of 256 routes, one for each node.

Continuing with FIG. 5, the subtree entry 404 provides access to 256 possible route indices 102 (FIG. 3) corresponding to each node on the bottom level of the subtree. The route indices 102 (FIG. 3) are stored in the subtree mapper 418. To provide access to 256 possible route indices, a dense subtree descriptor is stored in the data field 406. The data field 406 is 256 bits wide, providing one bit for each node at the bottom level of the subtree. The data field 406 is described in more detail later in conjunction with FIG. 6A and FIG. 6B. The pointers field 408 is 256 bits wide to allow for the storage of sixteen 16-bit pointers, with each pointer storing the base address for 16 contiguous mapper entries in the subtree mapper 418 to provide access to the 256 route indices. Thus, the pointers field 408 can indirectly provide a pointer to a mapper entry in the subtree mapper 418 for each node in the bottom level of the subtree. The pointers field 408 is described in more detail in conjunction with FIG. 7.

The subtree data 412 stored in the dense subtree descriptor in the data field 406 and the subtree pointer 414 stored in the pointers field 408 are forwarded to the mapper address logic 402. The mapper address logic 402 also receives the next portion of the key 210b (the next eight bits).

The mapper address logic 402 determines the mapper address 416 of the mapper entry associated with the node in the bottom level of the subtree dependent on the next eight bits of the key 212b, the subtree data 412 and the subtree pointers 414 associated with the subtree. The mapper address 416 selects the mapper entry in the subtree mapper 418. The subtree mapper 418 includes the same types of mapper entries as described in conjunction with FIG. 4 for the direct mapped mapper 106a. The contents of mapper data entry 220b determines whether a subsequent search is required. A subsequent search is required if the mapper entry data 220b includes a subtree index 312 (FIG. 4) indicating that there is another subtree entry 404 in the next mapper level 112c (FIG. 2B).

The second portion of the key 210b selects the node in the bottom level of the selected subtree. The subtree pointers 414 selects the base address associated with the node in the subtree and the subtree data 412 selects the offset within the block of mapper entries associated with the base address. The mapper address logic 402 is described later in conjunction with FIG. 8.

Figure 6A:
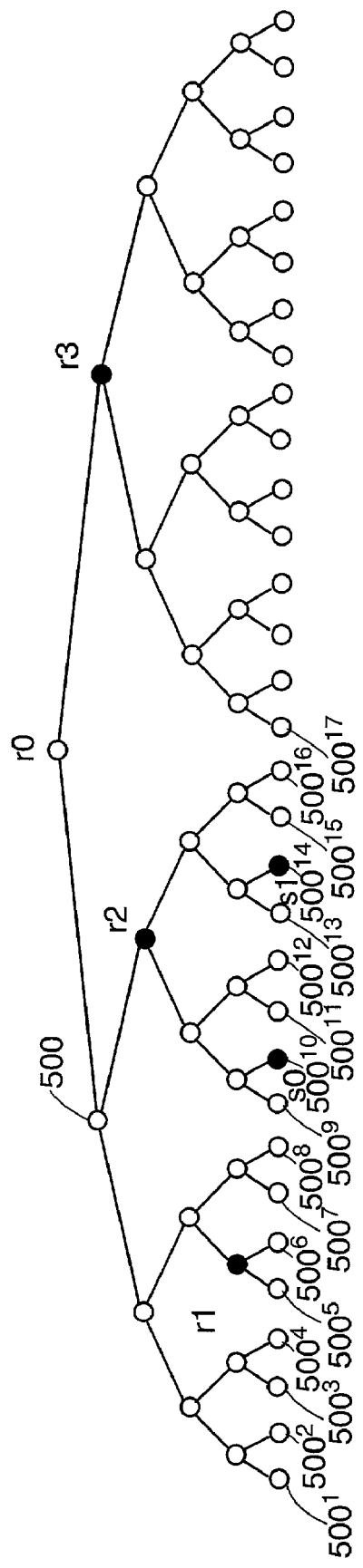
FIG. 6A is a binary tree representation of a subtree.

FIG. 6A is a binary tree representation of a subtree. The subtree shown includes 5-levels. The subtree includes three route indices r1, r2, and r3 and two subtree indices s0 and s1. There are 32 nodes $500^1$-$500^{32}$ on the bottom level of the subtree. The route index or subtree index associated with each node $500^1$-$500^{32}$ in the bottom level is shown in Table 1 below.

TABLE 1

| Subtree Bits | Route/Subtree |
|---|---|
| 00000 | r0 |
| 00001 | r0 |
| 00010 | r0 |
| 00011 | r0 |
| 00100 | r1 |
| 00101 | r1 |
| 00110 | r0 |
| 00111 | r0 |
| 01000 | r2 |
| 01001 | s0 |
| 01010 | r2 |
| 01011 | r2 |
| 01100 | r2 |
| 01101 | s1 |
| 01110 | r2 |
| 01111 | r2 |
| 1xxxx | r3 |

Figure 6B:
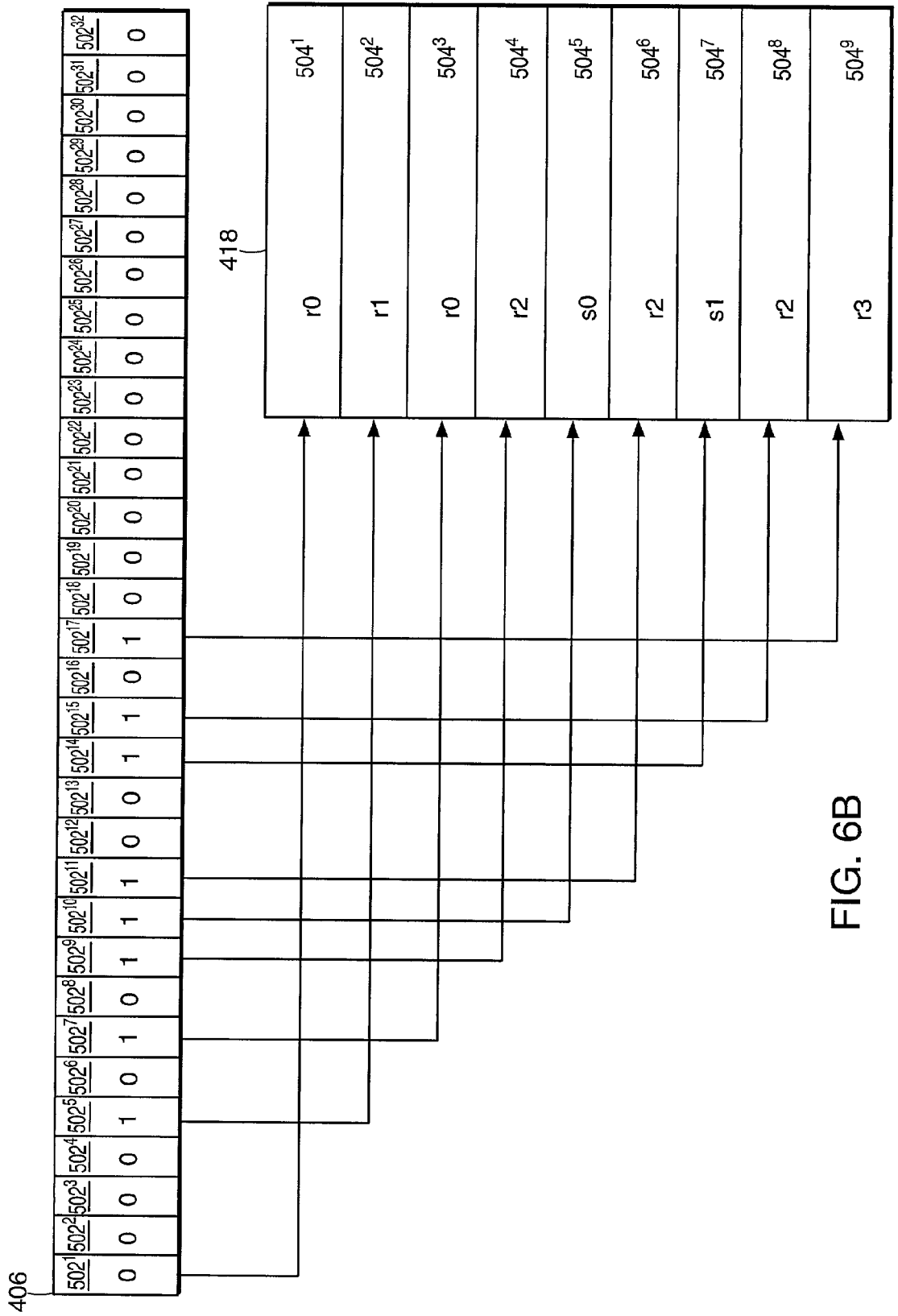
FIG. 6B illustrates the dense subtree descriptor stored in the data field shown in FIG. 5 corresponding to the nodes in the bottom level of the subtree shown in FIG. 6A.

FIG. 6B illustrates the dense subtree descriptor stored in the data field 406 shown in FIG. 5 corresponding to the nodes in the bottom level of the subtree shown in FIG. 6A. The data field 406 includes 32 bits, one bit for each node 500 in the bottom level of the subtree shown in FIG. 6A. The bits $502^1$-$502^{32}$ in the data field 406 are assigned as follows: a bit in the data field 406 is set to '0' if the route index for the previous node is to be used and set to '1' to increment to the next mapper entry address if the next route index stored in the subtree mapper 418 (FIG. 5) is to be used. The first bit in the data field 402 selects the default route r0 stored in mapper entry $504^1$ unless a route is specified. Thus, bit $502^1$ is set to '0' to select the default route because there is no route specified. The default route r0 stored in mapper entry $504^1$ is selected for the next three nodes $500^2$-$500^4$, therefore, corresponding bits $502^2$-$502^4$, are set to '0' in the data field 406 to use the previous route index used by $502^1$. There is a route change at node $500^5$.

The route r1 used for node $500^5$ stored in mapper entry $504^2$ is shared by node $500^6$. Therefore bit $502^5$ is '1' indicating a route change to select the mapper entry $504^2$ in the subtree mapper 418 (FIG. 5). Bit $502^6$ is '0' indicating that the route index stored in $502^5$ is to be used for this node. No route is provided for node $500^7$, therefore there is a route change and a '1' is stored in bit $502^7$ requiring a mapper entry $504^3$ in the subtree mapper 418 (FIG. 5) storing the default route r0.

Node $500^8$ shares the same route as the previous node $500^7$, a new mapper entry is not required in the subtree mapper 418 (FIG. 5). Bit $502^8$ corresponding to node $500^8$ is set to '0'. Node $500^9$ has a different route from the previous node $500^8$, a new mapper entry is required in the subtree mapper 418 (FIG. 5). Bit $502^9$ corresponding to node $500^9$ is set to '1' and mapper entry $504^4$ storing r2 is added to the subtree mapper 418 (FIG. 5) in the next contiguous memory location.

Node $500^{10}$ has a different route from the previous node $500^9$, a new route entry is required in the subtree mapper 418 (FIG. 5). Bit $502^{10}$ corresponding to node $500^{10}$ is set to '1' and mapper entry $504^5$ storing s0 is added to the subtree mapper 418 (FIG. 5) in the next contiguous memory location.

Node $500^{11}$ has a different route from the previous node $500^{10}$, a new mapper entry is required in the subtree mapper 418 (FIG. 5). Bit $502^{11}$ corresponding to node $500^{11}$ is set to '1' and mapper entry $504^6$ storing r2 is added to the subtree mapper 418 (FIG. 5) in the next contiguous memory location.

Nodes $500^{12}$ and $500^{13}$ share the same route as previous node $500^{11}$, a new mapper entry is not required in the subtree mapper 418 (FIG. 5). Bit $502^{12}$ corresponding to node $500^{12}$ and bit $502^{13}$ corresponding to node $500^{13}$ are set to '0' in the data field 406.

Node $500^{14}$ has a different route from the previous node $500^{13}$, a new mapper entry is required in the subtree mapper 418 (FIG. 5). Bit $502^{14}$ in data field 406 corresponding to node $500^{14}$ is set to '1' and mapper entry $504^7$ storing s1 is added to the subtree mapper 418 (FIG. 5). Node $500^{15}$ has a different route from the previous node $500^{14}$, a new mapper entry is required in the subtree mapper 418 (FIG. 5). Bit $502^{15}$ in the data field corresponding to node $500^{15}$ is set to '1' and mapper entry $504^8$ storing r2 is added to the subtree mapper 418 (FIG. 5). Node $500^{16}$ shares the same route as the previous node $500^{15}$, a new mapper entry is not required in the subtree mapper 418 (FIG. 5).

Node $500^{17}$ has a different route from the previous node $500^{16}$, a new mapper entry is required in the subtree mapper 418 (FIG. 5). Bit $502^{17}$ in the data field 406 corresponding to node $500^{17}$ is set to '1' and mapper entry $504^9$ storing r3 is added to the subtree mapper 418 (FIG. 5).

Nodes $500^{18}$-$500^{32}$ all share the same route as node $500^{17}$, a new mapper entry is not required in the subtree mapper 418 (FIG. 5). Corresponding bits $502^{18}$-$502^{32}$ are set to '0'. Thus nine mapper entries $504^{1-9}$ are required to store route entries 302 (FIG. 4) or subtree entries 304 (FIG. 4) for the 32 nodes $500^1$-$500^{32}$.

A mapper entry $504^1$-$504^9$ corresponding to a node $500^1$-$500^{32}$ is indexed in the subtree mapper 418 (FIG. 5) by computing the number of '1's stored in the dense subtree descriptor stored in the data field 406. For example, to find the mapper entry $504^1$-$504^9$ corresponding to node $500^{28}$, the number of '1's stored in bits $502^1$-$502^{28}$ of the data field 406 are counted. The number of '1's is 8, and the corresponding mapper entry is the eighth location from the default route; that is, mapper entry $504^9$.

Storing mapper entries only when there is a route change reduces the number of mapper entries $504^1$-$504^9$ per subtree in the subtree mapper 418 (FIG. 5).

Figure 7:
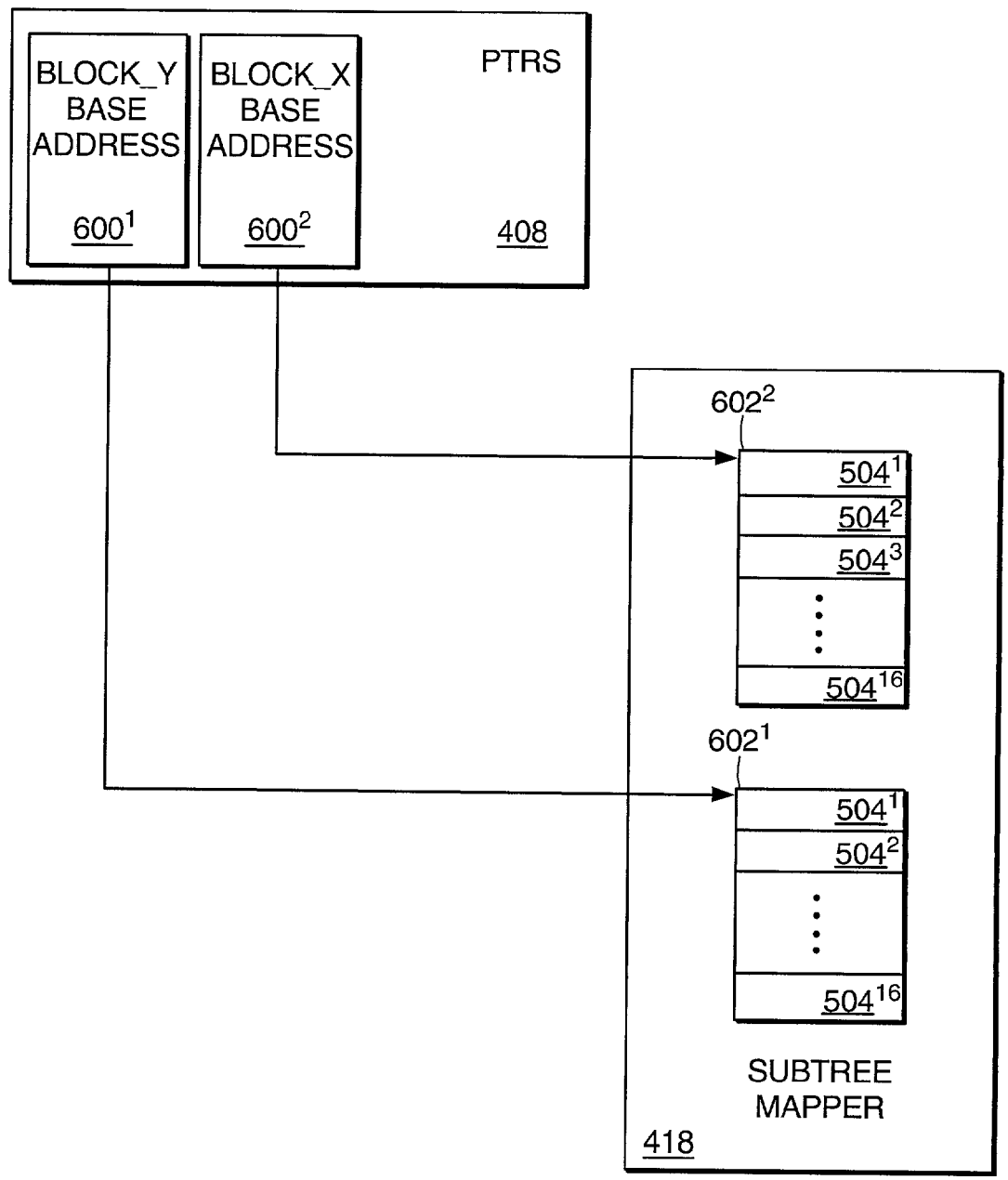
FIG. 7 illustrates the ptr field shown in FIG. 5.

FIG. 7 illustrates the pointers field 408 shown in FIG. 5. The pointers field 408 includes block base address fields $600^1$, $600^2$ for storing base addresses for blocks of 16 contiguous mapper entry locations $504^1$-$504^{16}$ (FIG. 6B) in the subtree mapper 418 (FIG. 5). Memory is allocated in the subtree mapper 418 (FIG. 5) in blocks $602^1$, $602^2$ of 16 contiguous mapper entries. An 8-level subtree can have up to 256 different routes requiring 16 blocks $602^1$, $602^2$ in order to store all 256 routes. The number of blocks 602 required is dependent on the number of routes for the subtree. A block 602 is allocated to a particular subtree by removing the block base address $602^1$, $602^2$ from a free list of block base addresses (not shown). Methods for providing a free list of addresses for a memory are well-known in the art.

By allocating memory blocks of 16 mapper entries $504^{1-16}$, the memory in the subtree mapper 418 (FIG. 5) is easier to manage because the allocated 16 locations are contiguous.

Figure 8:
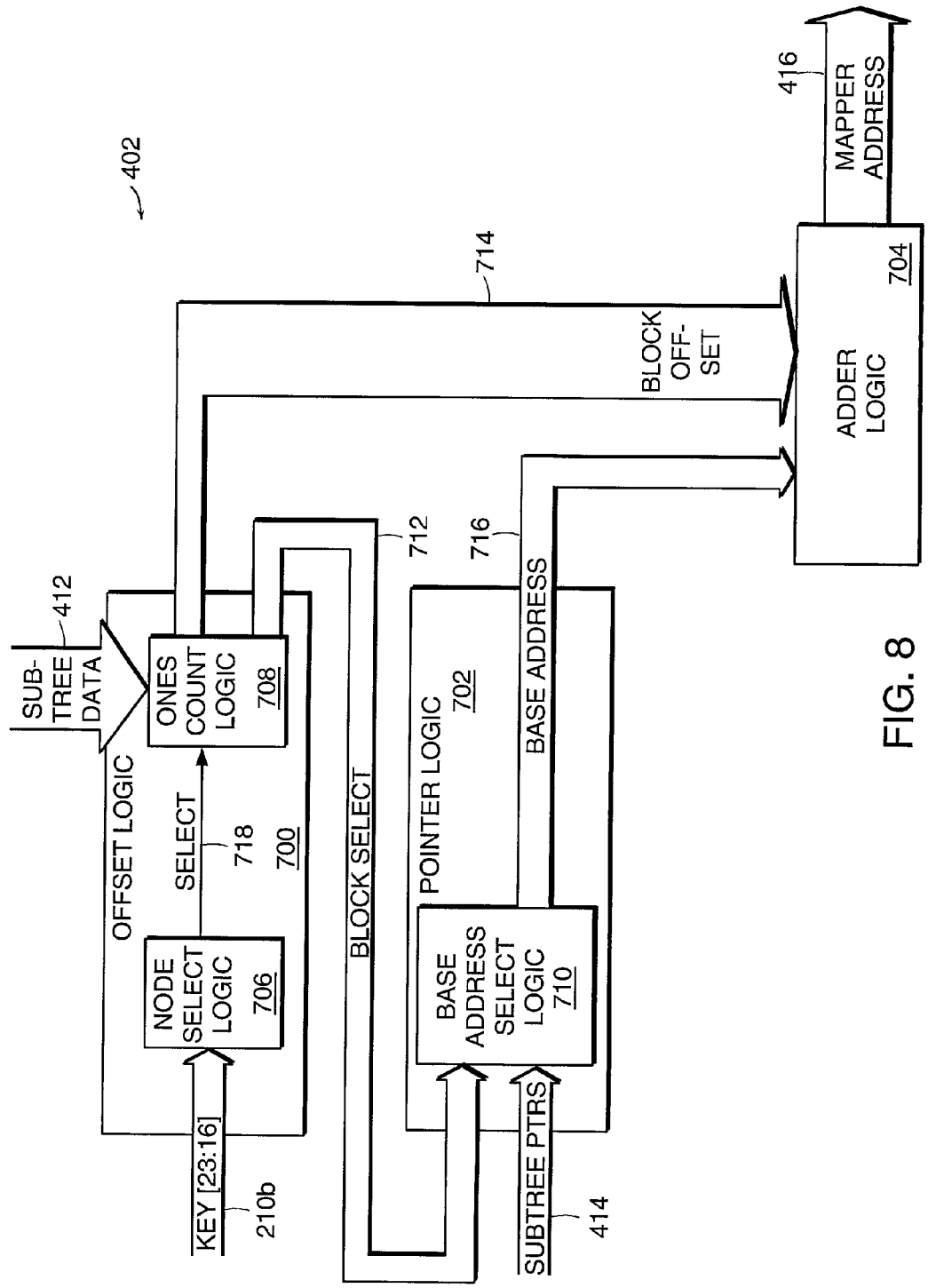
FIG. 8 illustrates the mapper address logic shown in FIG. 5.

FIG. 8 illustrates the mapper address logic 402 shown in FIG. 5. The mapper address logic 402 includes offset logic 700, pointer logic 702 and adder logic 704. The offset logic 700 includes node select logic 706 and ones count logic 708. The pointer logic includes base address select logic 710.

The node select logic 706 selects the node 500 (FIG. 6A) in the subtree data 412 corresponding to the eight bits of the key 210b. The corresponding node number is forwarded on node select 718 to the ones count logic 708. The ones count logic 708 counts the number of '1's stored in the subtree data field 406 up to the bit corresponding to the selected node 500. The number of ones is forwarded on block select 712 to the pointer logic 702 and block offset 714 to the adder logic 704.

There can be a maximum of 256 '1's stored in a 256 bit subtree data field 406 requiring an 8-bit wide count field. The 8-bit count field is divided into two fields, with the 4 MSBs providing the block select 712 and the 4 Least Significant Bits ("LSBs") providing the block offset 714.

For example, if the eight bit key 210b is 0100 0100, to select node number 68 and there are 27 '1's stored in the first 68 bits of subtree data 412, the count is 1C Hex (0001 1100), the MSBs (0001); that is, block select 714, select block $602^1$ (FIG. 7) and the LSBs (1100); that is, base block offset select mapper entry $504^{11}$ (FIG. 6), that is, the twelfth entry in block $602^1$.

The base address select logic 710 selects the base address 716 from the subtree pointer 414 dependent on the block select 712 forwarded from the offset logic 700. The adder logic 704 adds the block offset 714 forwarded from the offset logic 700 to the base address 716 and provides the mapper address 416. The mapper address 416 is the index of the mapper entry 504 (FIG. 6B) in the mapper 106b-d.

Figure 9:
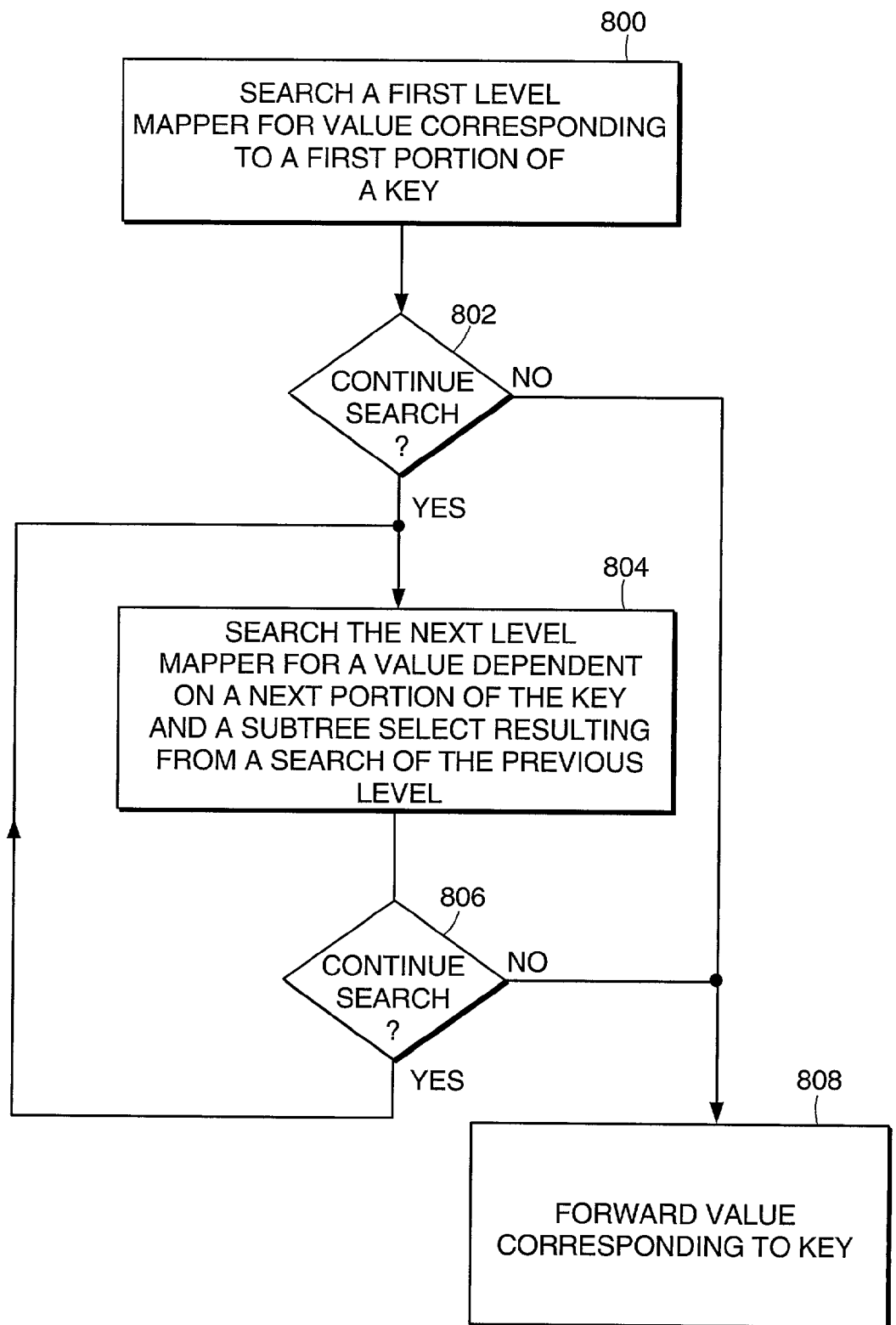
FIG. 9 is a flowchart illustrating the steps for searching for the longest match.

FIG. 9 is a flowchart illustrating the steps for searching for the longest match prefix for a key 210 (FIG. 3) in lookup table 200 according to the principles of the present invention.

At step 800, the first portion of the key 210a (FIG. 3) is forwarded as the index to mapper 106a. Processing continues with step 802.

At step 802, the mapper entry data 220a (FIG. 3) stored in the mapper entry 504 (FIG. 6B) in the first level mapper indexed by the first portion of the key 210a (FIG. 3) determines whether a further search of the next level is required. If so, processing continues with step 804. If not, the route entry 302 (FIG. 4) in the indexed mapper entry 504 (FIG. 6B) in the first level mapper stores the corresponding longest prefix route for the key and processing continues with step 808.

At step 804, the next level mapper 106b-d is searched. The index for the next level mapper is dependent on the subtree index 312 stored in the subtree entry descriptor 304 (FIG. 4) in the indexed mapper entry 504 (FIG. 6B) in the previous level mapper and the next portion of the key 210b-d. Processing continues with step 806.

At step 806, the indexed mapper entry 504 (FIG. 6B) in the next level mapper stores the corresponding longest prefix route index for the key or a subtree index indicating a further search is required. If a further search is required, processing continues with step 804. If not, processing continues with step 808.

At step 808, the route index 102 (FIG. 3) stored in a mapper entry 504 (FIG. 6B) in one of the mappers 106a-d is forwarded from the lookup table 200 as the route index 102 (FIG. 3). Processing is complete.

Depth Expansion

The number of route indices 102 (FIG. 3) which can be stored in the lookup table 200 shown in FIG. 3 is limited by the number of available mapper entries 504 (FIG. 6B) in the subtree mapper 418 (FIG. 5). For example, if each subtree mapper 418 (FIG. 5) includes 128K mapper entries and there are two subtree mappers 418 (FIG. 5) in the lookup table, a maximum of 256K route indices 102 (FIG. 3) can be stored in the lookup table 200. A subtree mapper 418 (FIG. 5) with 128K mapper entries requires a 17-bit index. A subtree mapper 418 (FIG. 5) with 512K mapper entries requires a 19-bit index. Two 512K subtree mappers 418 (FIG. 5) in the lookup table 200 provides storage for 1 million out of a possible 4 billion route indices 102 (FIG. 3) for a 32-bit IPv4 destination address.

The number of mapper entries 504 (FIG. 6B) for storing route indices 102 (FIG. 3) can be increased by providing a plurality of lookup tables 200. The plurality of lookup tables are searched in parallel for the value corresponding to a search key 210 stored in a mapper entry 504 (FIG. 6B) in subtree mapper 418 (FIG. 5) in one of the lookup tables 200.

Figure 10A:
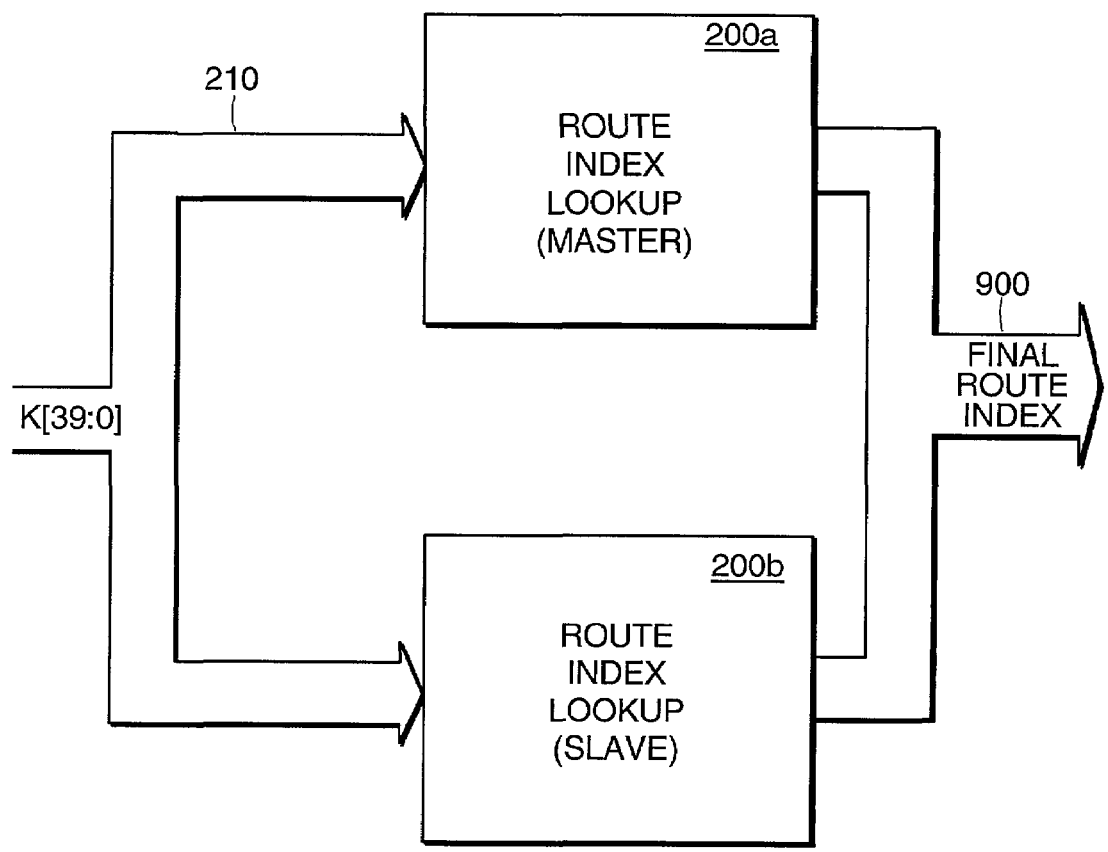
FIG. 10A illustrates an embodiment for providing depth expansion.

FIG. 10A illustrates an embodiment for depth expansion. Two lookup tables are shown, a master lookup table 200a and a slave lookup table 200b. However, the number of lookup tables is not limited to the two shown, more than one slave lookup table 200b can be added.

Each of the lookup tables 200a-b is searched in parallel with the same search key 210. The route index 102 (FIG. 3) corresponding to the search key 210 is stored in a subtree mapper 418 (FIG. 5) in one of the lookup tables 200a-b or in direct mapper 106a in both of the lookup tables 200a, 200b. The final route index 900 is found after a search in parallel of both lookup tables 200a, 200b.

Figure 10B:
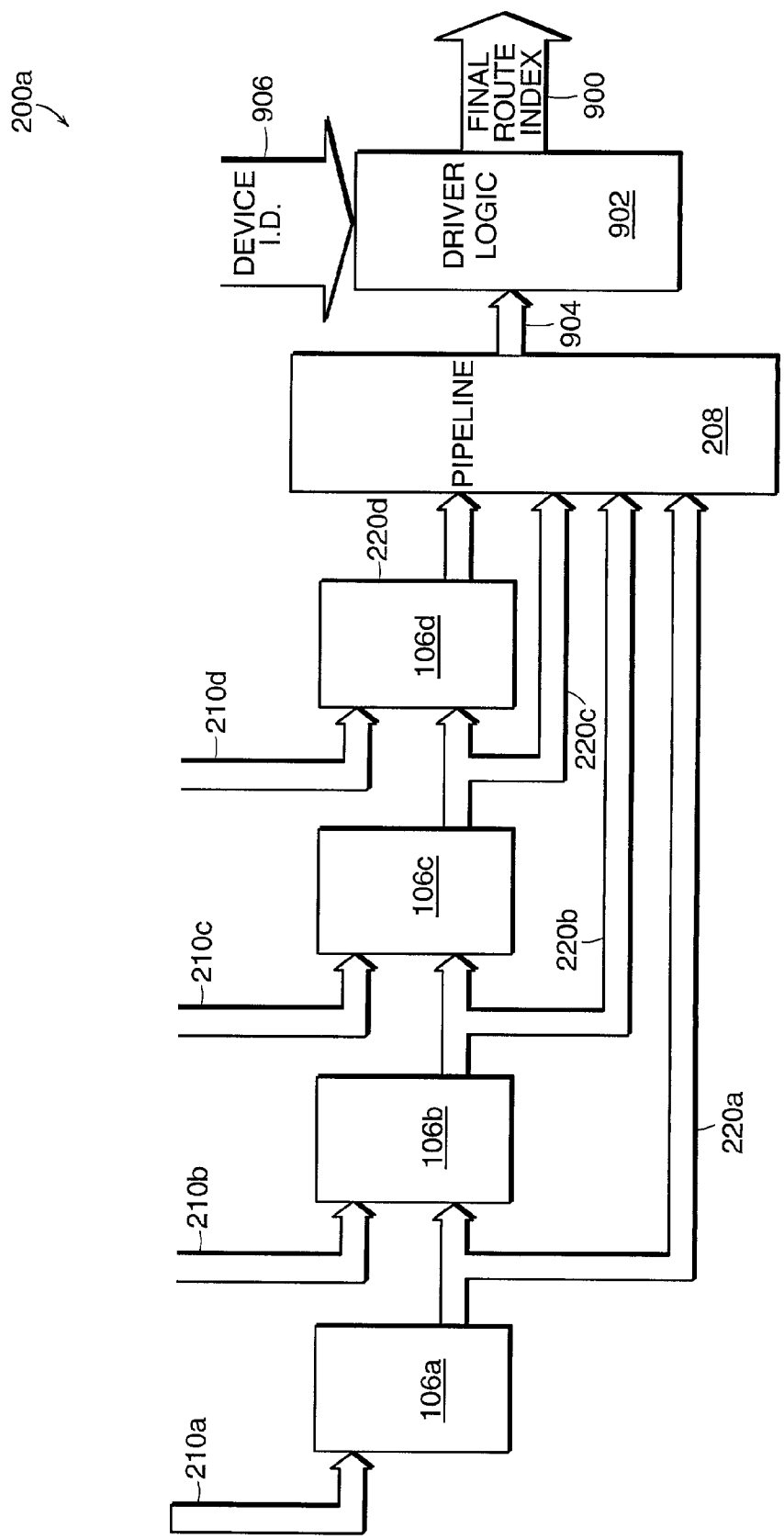
FIG. 10B illustrates one of lookup tables in the embodiment shown in FIG. 10A.

FIG. 10B illustrates one of the lookup tables 200a in the embodiment shown in FIG. 10A. Each of the lookup tables 200a-b includes mappers 106a-d and a pipeline 208 as has already been described for lookup table 200 in conjunction with FIG. 3, and driver logic 902. The lookup table 200a performs a multi-level search in the mappers 106a-d for a route index corresponding to the search key. The result of each level search is forwarded on mapper entry data 220a-d to the pipeline 208. The pipeline 208 forwards the result of the search 904 to driver logic 902. Mapper entries 504 (FIG. 6B) in mapper 106a in each of the lookup tables 200a-b store subtree entries 304 (FIG. 4) but route entries 302 (FIG. 4) are only stored in the mapper 106a in master lookup table 200a. No-entry 300 (FIG. 4) is stored in mapper entries 504 (FIG. 6B) in mapper 106a in slave lookup table 200b instead of route entries 302. Populating only one lookup table with the route indices in mapper 106a avoids selecting a lookup table to provide the final route index 900. This results in 64K of memory in the slave lookup table 200b which can not be used to store route indices but allows the same lookup table to be configured as a master lookup table or a slave lookup table as described in conjunction with FIG. 3. In an alternative embodiment, a slave lookup device without mapper 106a can be provided. A search ends in mapper 106a in the master lookup table 200a if a route index 102 (FIG. 3) is stored in a route entry 302 (FIG. 4) in mapper 106a.

As shown in FIG. 10A, master lookup table 200a and slave lookup table 200b share the final route index 900. The lookup table 200a, 200b in which the final route index 900 is stored provides the route index 102 (FIG. 3). If each of the lookup tables 200a, 200b is a separate device, sharing the final route index 900 reduces each device's external pin count. Only one of the lookup tables 200a, b drives the final route index 900 at any time.

To avoid an error condition in which the route index associated with the search key 210, is stored in both lookup tables 200a, 200b where both lookup tables would drive the final route index 900 at the same time, each lookup table 200a,b stores a device code 906. A 3-bit device code allows the expanded lookup table to include 8 devices.

The driver logic 902 determines if the result of the search 904 includes a route index 102 (FIG. 3). If so, the driver logic 902 in the lookup table 200a, signals an intention to drive the final route index 900 on a bus request signal (not shown). If two or more lookup tables 200a, 200b signal the intention to drive the route index signals at the same time, the route index is provided by the lookup table 200a, 200b with the lowest device code. Methods for resolving bus conflicts through the use of a bus request signal are well-known in the art.

Figure 10C:
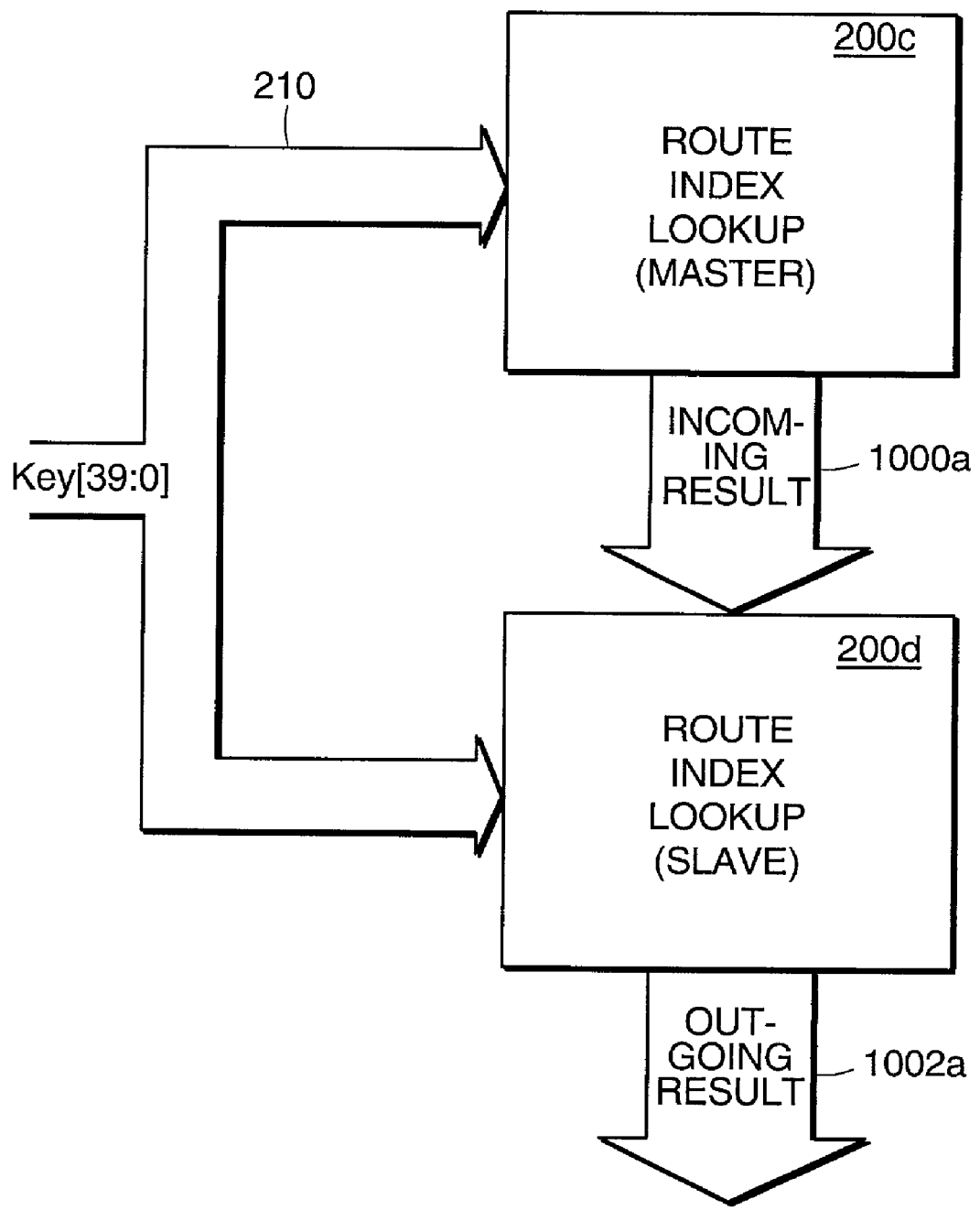
FIG. 10C illustrates another embodiment for providing depth expansion to increase the number of mapper entries available for storing values.

FIG. 10C illustrates another embodiment for providing depth expansion to increase the number of mapper entries available for storing a value corresponding to a search key 210. In the embodiment shown in FIG. 10C, two lookup tables 200c-d are provided for storing values, a master lookup table 200c and a slave lookup table 200d. However, the number of lookup tables is not limited to the two shown, the number of mapper entries can be increased by adding more slave lookup tables 200d. A search for the value stored in a mapper entry in one of the lookup tables 200c-d corresponding to the search key [39:0] 210 is performed in parallel in the lookup tables 200c-d.

Figure 10D:
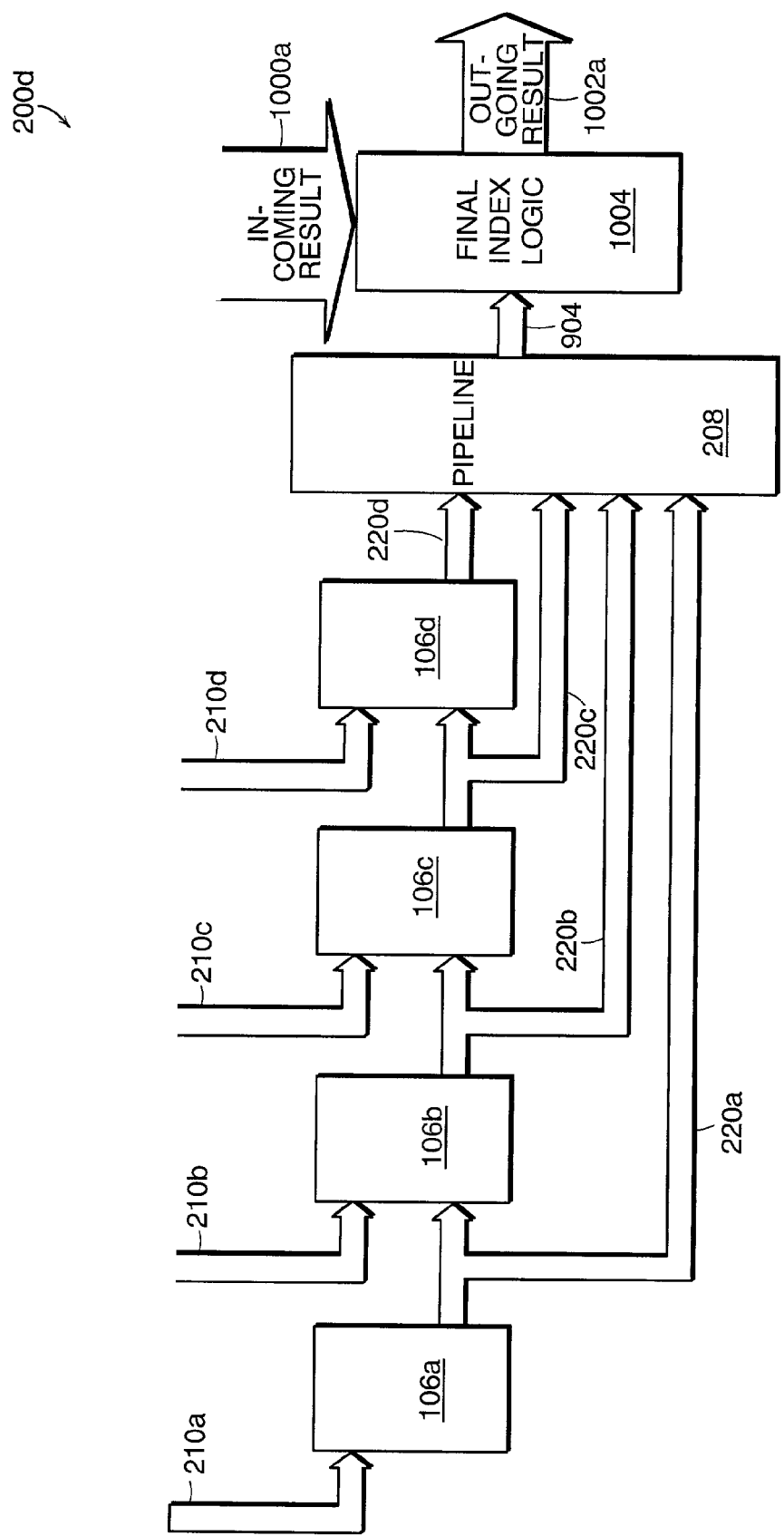
FIG. 10D illustrates the slave lookup table in the embodiment shown in FIG. 10C.

FIG. 10D illustrates the slave lookup table 200d in the embodiment shown in FIG. 10C. Each lookup table includes mappers 106a-d as described for lookup table 200 in conjunction with FIG. 3. Mapper entries in mapper 106a in each of the lookup tables 200c-d store subtree entries 304 (FIG. 4). Each lookup table 200c-d forwards a subtree index 312 stored in a subtree entry descriptor 304 (FIG. 4) stored in a mapper entry 504 (FIG. 6B) in mapper 106a to the next mapper 106b-d. However, a route index 102 (FIG. 3) is only stored in mapper 106a in a master lookup table 200c. A no-entry is stored in mapper 106a in a slave lookup table 200d to avoid storing a route index corresponding to the key in more than one lookup table 200b, 200d.

The result of the multi-level search 904 in the slave lookup 200d is forwarded to the final index logic 1004. The final index logic 1004 forwards the result of the multi-level search 904 or the incoming result 1000a forwarded from the master lookup table 200c as the outgoing result 1002a. If a route index 102 (FIG. 3) is included in the result of the multi-level search 904, the result of the multi-level search is forwarded as the outgoing result 1002a. If the route index 102 (FIG. 3) is included in the incoming result 1000a, the incoming result 1000a is forwarded as the outgoing result 1002a. If the route index 102 (FIG. 3) is included in neither the incoming result 1000a or the result of the multi-level search 904, the result of the multi-level search 904 is forwarded as the outgoing result 1002a.

As shown in FIG. 10C, master lookup table 200c and slave lookup table 200d are connected through a common bus labeled incoming result 1000a. The route index 102 (FIG. 3) is only forwarded from slave lookup table 200d on outgoing result 1002a. If there is more than one slave lookup table 200d, the route index 102 (FIG. 3) for the expanded lookup table is provided by the last slave lookup table. This embodiment avoids the implementation of multi-driver final route index 900 described in conjunction with FIG. 10A but requires more device external pins for incoming result 1000a.

Figure 11A:
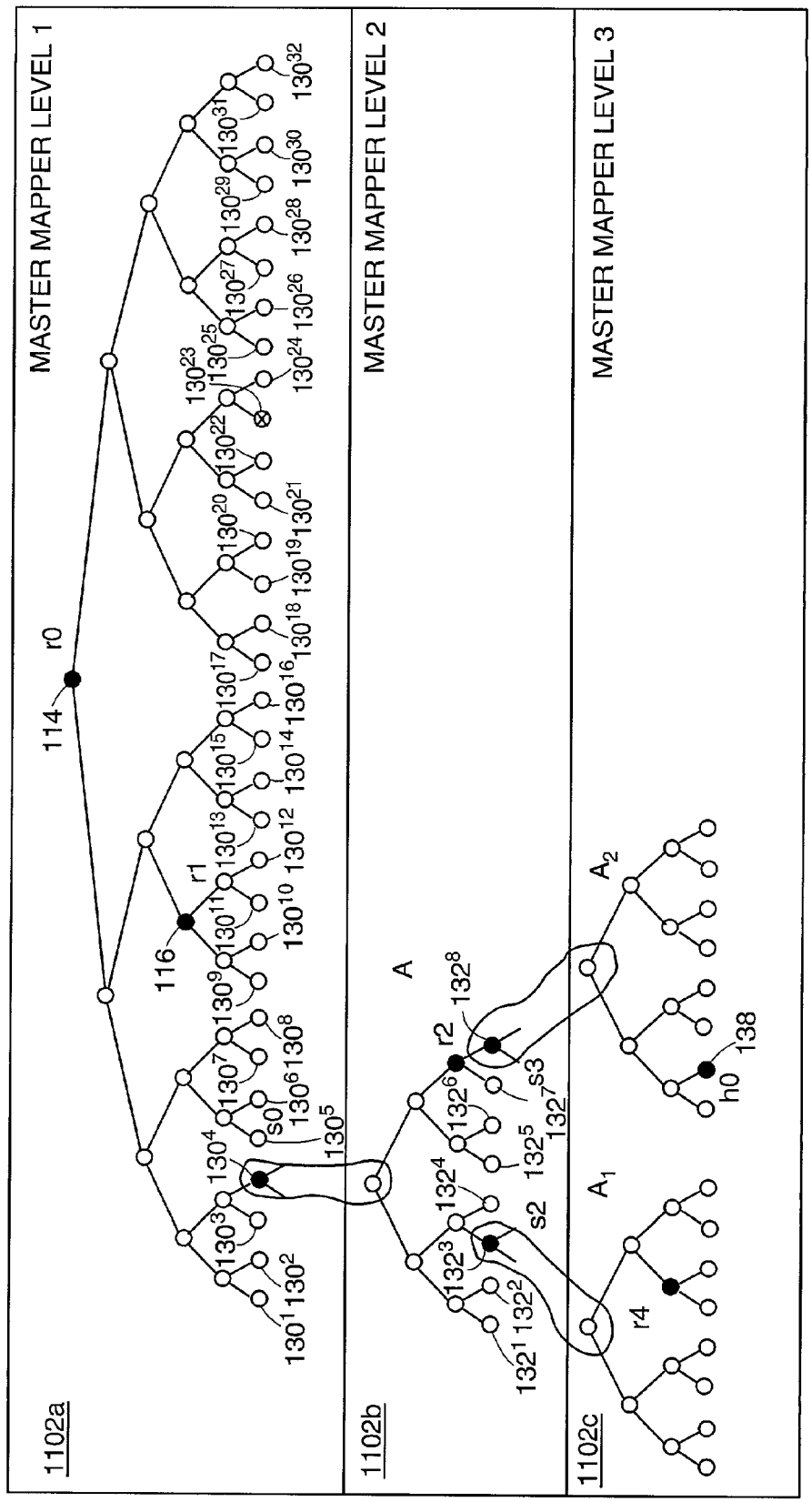
FIGS. 11A-B illustrate a binary tree representation of the distribution of the nodes in the binary tree representation of route indices shown in FIG. 2B amongst the mapper entries in the lookup tables shown in FIGS. 10A and 10C.
Figure 11B:
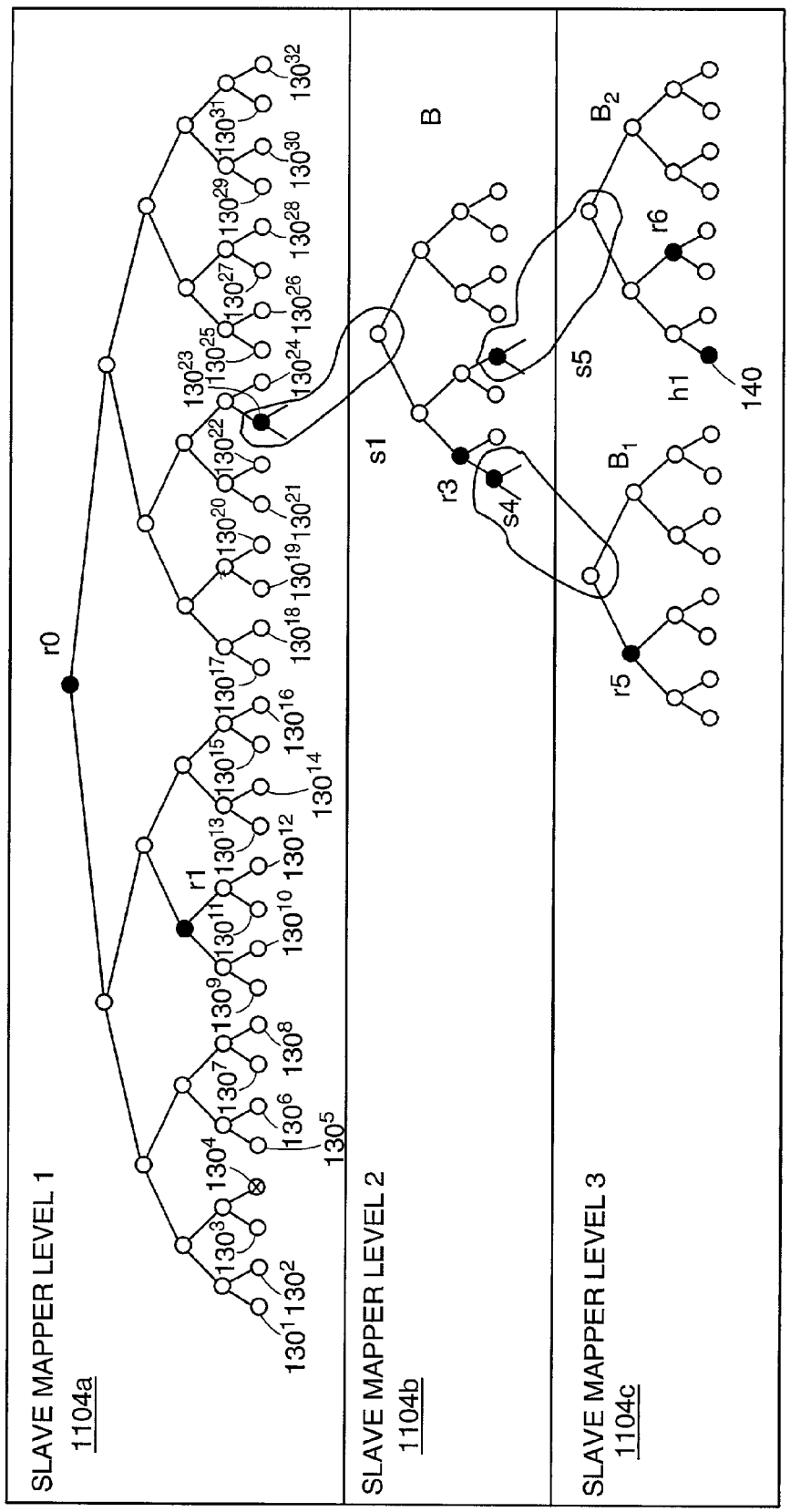

FIGS. 11A-B illustrate a binary tree representation of the distribution of the routes shown in FIG. 2B among the lookup tables 200a-b (FIG. 10A) or 200c-d (FIG. 10C).

FIG. 11A illustrates a binary tree representation of the routes stored in master lookup table 200a (FIG. 10A) or 200c (FIG. 10C). Subtree B shown in the binary tree representation of the routes shown in FIG. 2B is not included in master lookup table 200a. Nodes $130^1$-$130^{22}$ and $130^{24-32}$ are coded in mapper 106a in lookup table 200a as described in conjunction with FIG. 3. The node at which subtree B would be indexed, if stored in the master lookup table 200a, is graphically represented with an X, indicating a pruned subtree. The mapper entry 504 (FIG. 6B) corresponding to node $130^{23}$ in master lookup table 200a no longer stores a subtree index 312 (FIG. 4) to subtree B. Instead no-entry 300 (FIG. 4) is stored in the mapper entry 504 (FIG. 6B) corresponding to node $130^{23}$ in master lookup table 200a indicating that the mapper entry corresponding to node $130^{23}$ is stored in a subtree mapper 418 (FIG. 5) in another slave lookup table 200b.

FIG. 11B illustrates a binary tree representation of the routes stored in mapper entries 504 (FIG. 6B) in the subtree mappers 418 (FIG. 5) in slave lookup table 200b (FIG. 10A) or 200d (FIG. 10C). The binary tree representation of the routes stored in slave lookup table 200b differs from the binary tree representation shown in FIG. 2B in that subtree A is not included. Thus, nodes $130^1$-$130^3$ and $130^5$-$130^{32}$ are coded as described in conjunction with FIG. 2B. The mapper entry 504 (FIG. 6B) corresponding to node $130^4$ in slave lookup table 200b no longer stores a subtree index 312 (FIG. 4) to subtree A. Instead, the mapper entry corresponding to node 1304 in slave lookup table 200b stores no-entry 300 (FIG. 4) indicating that the mapper entry corresponding to node $130^4$ is stored in another lookup table. The subtree index for subtree A and thus the route index for host 138 (FIG. 11A) is stored in master lookup table 200a, and the subtree index for subtree B and thus the route index for host 140 is stored in slave lookup table 200b. The slave lookup table 200b, 200d only stores results for a subtree; that is, a slave lookup table 200b, 200d does not store a result in the first level mapper 106a.

Referring to FIG. 11A and FIG. 11B, a search for any of the nodes $130^9$-$130^{12}$ in master mapper level_1 1102 (FIG. 3)a or slave mapper level_1 1104a with a first portion of the key 210a results in r1 116 stored in a route entry 302 (FIG. 4) in a mapper entry 504 (FIG. 6B) in mapper 106a in the master lookup table 200a, 200c and a no-entry 300 (FIG. 4) stored in a mapper entry 504 (FIG. 6B) in mapper 106a in the slave lookup table 200b, 200d. The route entry 302 (FIG. 4) stored in the master lookup table 200a, 200c is forwarded on incoming result 1000a to the slave lookup table 200b, 200d and forwarded by the slave lookup table 200b, 200d on outgoing result 1002a.

A search for node $130^4$ with a first portion of the key 210a results in a subtree index 312 (FIG. 4) for subtree A stored in a subtree entry descriptor 304 (FIG. 4) in a mapper entry 504 (FIG. 6B) in mapper 106a in master lookup table 200a. The subtree index 312 is forwarded to mapper 106b in master lookup table 200a to continue the search for the route entry 302 (FIG. 4) stored in master lookup table 200a.

A search for node $130^{23}$ with a first portion of the key 210 a results in a no-entry 300 (FIG. 4) stored in a mapper entry 504 (FIG. 6B) in mapper 106a in master lookup table 200a and a subtree entry descriptor 304 (FIG. 4) stored in a mapper entry 504 (FIG. 6B) in mapper 106a in slave lookup table 200b. Thus, the search for the route entry 302 (FIG. 4) continues with the next portion of the key 210b in mapper 106b in slave lookup table 200b.

Figure 12:
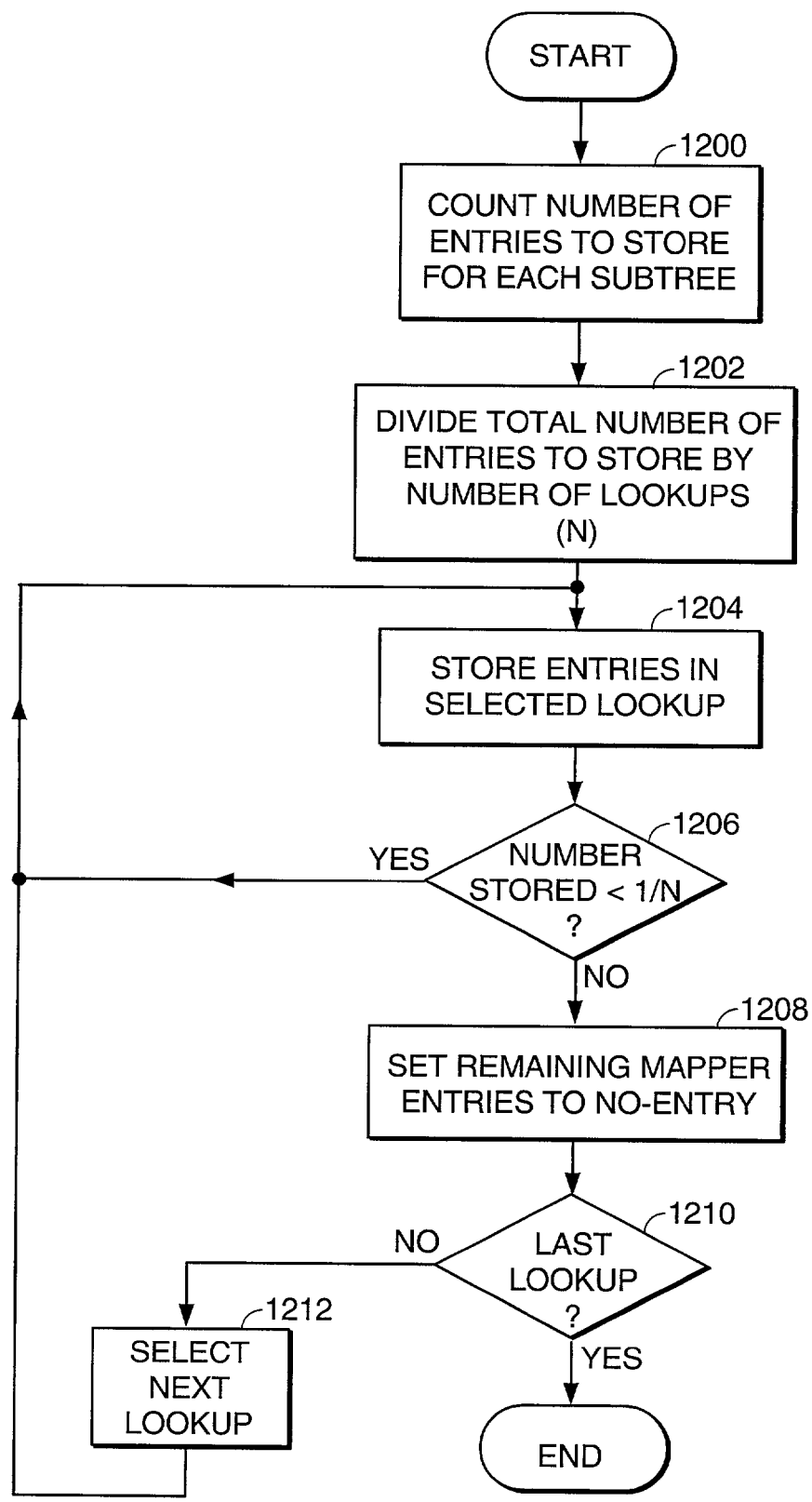
FIG. 12 is a flowchart illustrating a method for distributing values amongst the mapper entries in the lookup tables shown in FIGS. 10A and 10C.

FIG. 12 is a flowchart illustrating a method for distributing route entries 302 (FIG. 4) to be stored in mapper entries 504 (FIG. 6B) amongst the lookup tables 200a-b shown in FIG. 10A. The same method applies to the lookup tables 200c-d shown in FIG. 10C. The route entries 302 (FIG. 4) to be stored in mapper entries are initially stored in a memory by a processor (not shown) prior to being stored in the lookup tables 200a-b.

While the route entries 302 (FIG. 4) are stored in memory, the number of route entries 302 (FIG. 4) to be stored in each of the lookup tables 200a-b (FIG. 10A) are counted. The route entries 302 (FIG. 4) for mapper level_1 1104a (FIG. 11B) are stored in mapper 106a in lookup table 200a. The subtree entries 304 (FIG. 4) for mapper level_1 1104a (FIG. 11B) are stored in mapper 106a in each of the lookup tables 200a-200b.

At step 1200, the number of route entries 302 (FIG. 4) to be stored for each of the subtree entries 304 (FIG. 4) in mapper 106a in each of the lookup tables 200a-200b (FIG. 10A) are computed in order to determine how to distribute the route entries 302 (FIG. 4) amongst the lookup tables 200a-b (FIG. 10A). After the total number of mapper entries 504 (FIG. 6B) required to store the route entries 302 (FIG. 4) has been determined, processing continues with step 1202.

At step 1202, the total number of mapper entries 504 (FIG. 6B) to be stored for the subtrees is divided by the number of lookup tables 200a-b (FIG. 10A) to determine the number of route entries 302 (FIG. 4) to store in each lookup table 200a-b (FIG. 10A). Processing continues with step 1204.

At step 1204, a route entry 302 (FIG. 4)is stored in a mapper entry 504 (FIG. 6B) in a subtree mapper 418 (FIG. 5) in the selected lookup table 200a-b. Processing continues with step 1206.

At step 1206, if the number of route entries stored in mapper entries 504 (FIG. 6B) in subtree mapper 418 (FIG. 5) in the selected lookup table 200a-b (FIG. 10A) is less than 1/n where n is the number of available lookup tables 200a-b (FIG. 10A), processing continues with step 1204. If not, the selected lookup table 200a-b already stores 1/n of the total number of mapper entries and processing continues with step 1208.

At step 1208, the selected lookup table 2000a-b stores 1/n of the total number of mapper entries, a no-entry 300 (FIG. 4) is stored for any remaining subtree nodes in the selected lookup table 200a-b because route indices for the respective subtree are not stored in the currently selected lookup table. Processing continues with step 1210.

At step 1210, if all the route entries have been stored, processing is complete. If not, processing continues with step 1212.

At step 1212, the next lookup table 200a-b (FIG. 10A) is selected. Processing continues with step 1204.

Route entries are distributed amongst the lookup tables 200a-b (FIG. 10A) before searching for a route index corresponding to an IP address. The search is performed in parallel in each of the lookup tables 200a-b (FIG. 10A). The method for searching implemented in parallel in each of the lookup tables is described for one of the lookup tables 200a-b (FIG. 10A).

Figure 13:
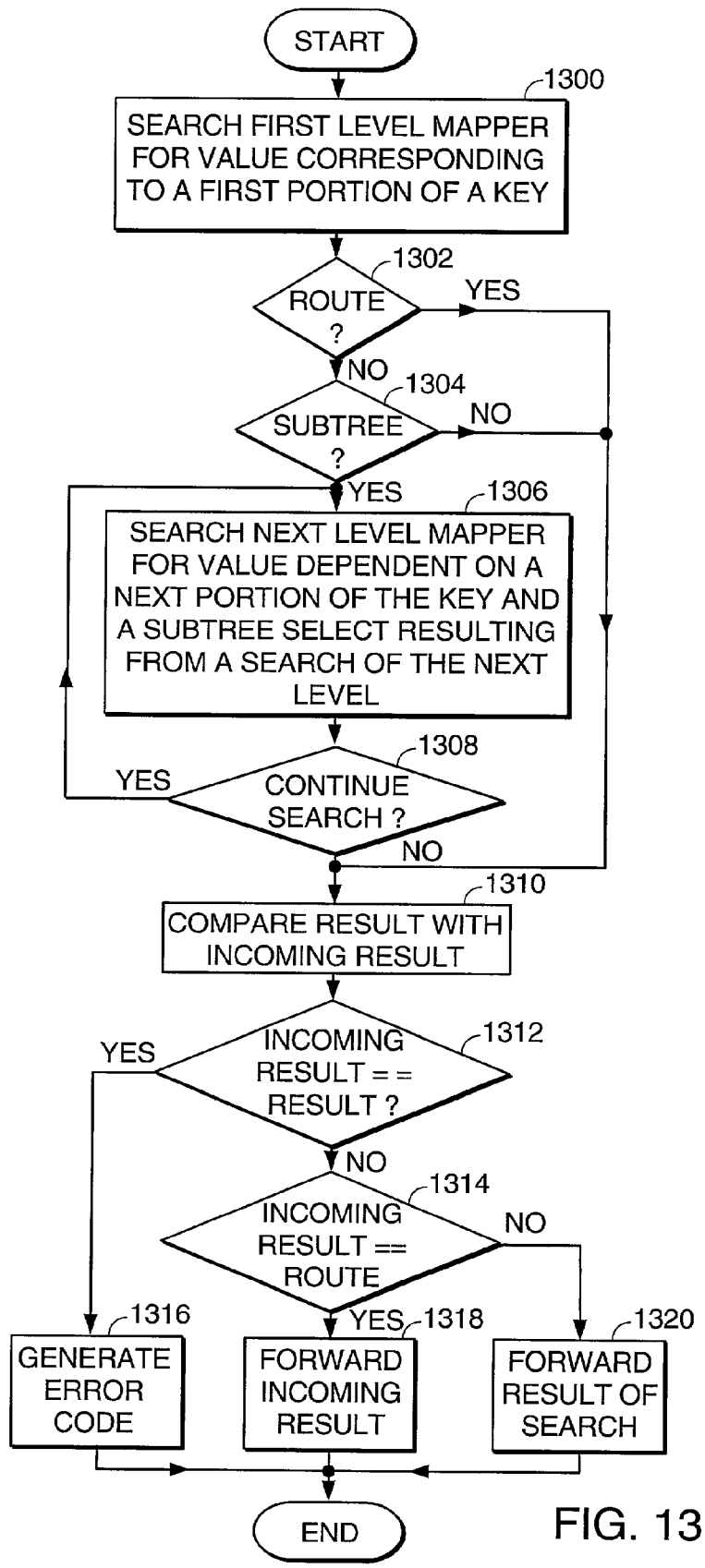
FIG. 13 is a flowchart illustrating a method for searching for a value corresponding to a search key stored in one of mapper entries in the lookup tables shown in FIG. 10C.

FIG. 13 is a flowchart illustrating a method for searching with a search key for a value corresponding to the search key stored in any one of the lookup tables 200c-d shown in FIG. 10C.

At step 1300, each of the lookup tables 200c-d (FIG. 10C) receives a search key 210. Mapper 106a in each of the lookup tables 200c-d is searched for a value corresponding to the first portion of the key 210a. Processing continues with step 1302.

At step 1302, the entry stored in mapper entry 504 (FIG. 6B) in mapper 106a is read. The mapper entry 504 (FIG. 6B) in master lookup table 200c can store no-entry 300 (FIG. 4), a route entry 302 (FIG. 4) or a subtree entry descriptor 304 (FIG. 4). The mapper entry 504 (FIG. 6B) in slave lookup table 200d can store no-entry 300 (FIG. 4) and subtree entry descriptor 304 (FIG. 4). If the mapper entry in the respective lookup table 200 stores a route entry 302 (FIG. 4), the entry is a valid value, no further searching of subsequent mappers 106b-d in the lookup table 200c-d is required, processing continues with step 1310. If not, processing continues with step 1304.

At step 1304, if the entry stores a subtree entry descriptor 304 (FIG. 4), a further search in the lookup table 200c-d is required and processing continues with step 1306. If not, the entry stores no-entry, indicating that a further search is not required, processing continues with step 1310.

At step 1306, the search continues in the selected subtree. The next level mapper 106b-d (FIG. 3) is searched dependent on a next portion of the key 210b-d and a subtree index 312 (FIG. 4) resulting from a search of the previous level. Processing continues with step 1308.

At step 1308, a determination is made as to whether to continue the search dependent on the mapper entry resulting from the search in the current level mapper 106b-d. If the mapper entry 504 (FIG. 6B) stores a subtree entry descriptor 304 (FIG. 4), the search continues with the next level mapper 106b-d and processing continues with step 1306. If the mapper entry 504 (FIG. 6B) does not store a subtree entry descriptor 304 (FIG. 4), a further search is not required, processing continues with step 1310.

At step 1310, the result of the search is compared with the incoming result 1000a received from another lookup table. For example, if the lookup table is slave lookup table 200d, the incoming result from the search in master lookup table 200c is forwarded on incoming result 1000a to lookup table 200d and compared with the result of the search in slave lookup table 200d. Processing continues with step 1312.

At step 1312, if the incoming result 1000a and the result of the search in the current lookup table 200d are different, processing continues with step 1314. If both the incoming result 1000a and the result of the search in the current lookup table 200d are the same, two valid results have been stored in mapper entries 504 (FIG. 6B) in separate lookup tables 200c-d. Two valid results should not be stored for the same key 210, processing continues with step 1316.

At step 1314, the incoming result 1000a is checked to determine if it is valid. An incoming result 1000a is valid if it is a route entry 302 (FIG. 4). The incoming result 1000a is invalid if it is a no-entry 300 (FIG. 4) or a subtree entry descriptor 304 (FIG. 4). subtree entry descriptor 304 (FIG. 4), route entry 302 (FIG. 4) and no-entry 300 (FIG. 4) have already been described in conjunction with FIG. 4. If the incoming result 1000a is invalid, processing continues with step 1318. If not, processing continues with step 1320.

At step 1318, the incoming result 1000a is valid and the result resulting from the search in the current lookup table 200d is invalid. The incoming result 1000a is forwarded on outgoing result 1002a from the current lookup table 200d. The incoming result 1000a is forwarded as the route index 102 (FIG. 3) if the current lookup table 200d is the last lookup table or is forwarded as the incoming result 1000a to the next lookup table. Processing is complete.

At step 1316, two valid result values are stored for the key in different lookup tables. An error occurred during the storing of the route entries in the lookup tables 200c-d. An error code is generated so that the error can be corrected. Processing is complete.

At step 1320, neither the result from a search of the current lookup table 200d or the incoming result 1000a is valid. The result of search in the current lookup table 200d, even though invalid, is forwarded as the incoming result 1000a to the next lookup table. Processing is complete.

Figure 14:
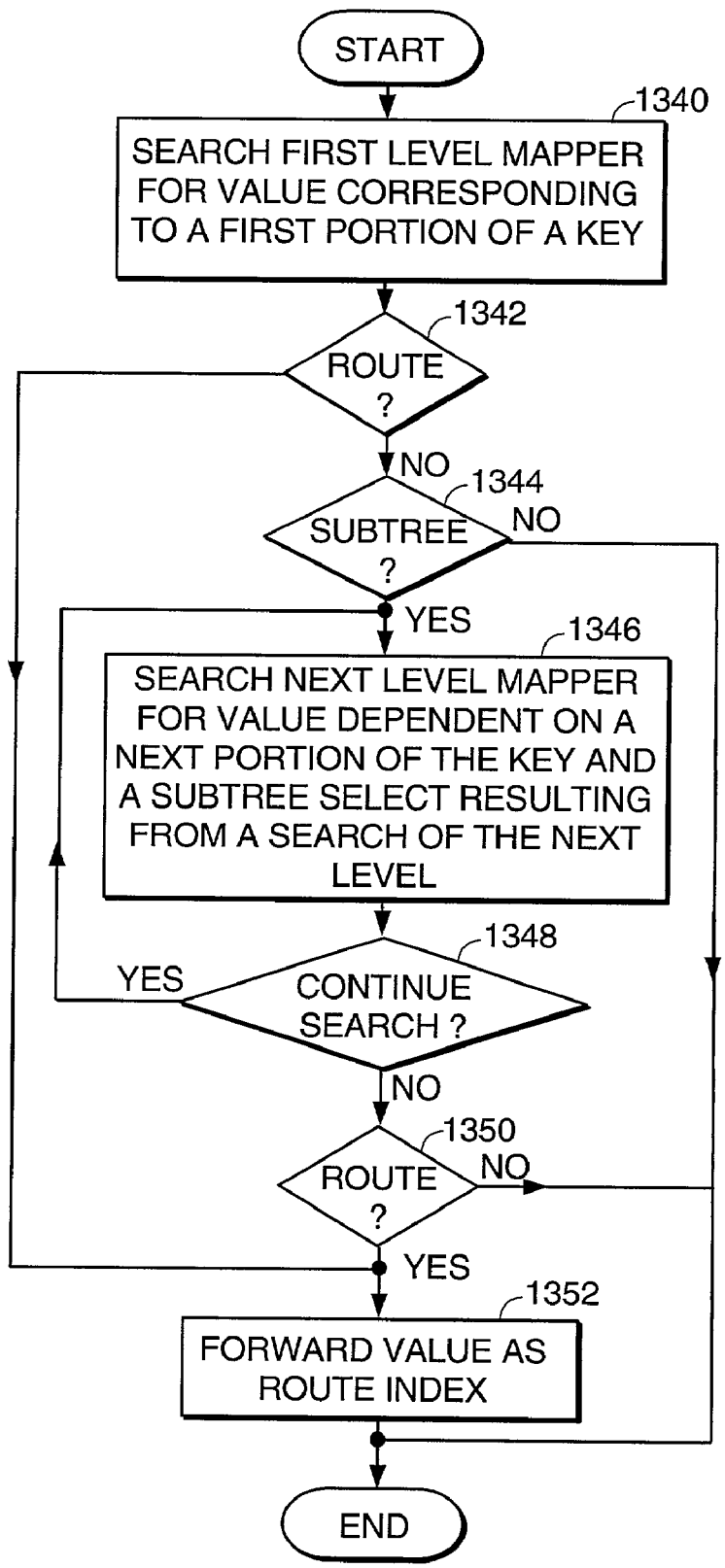
FIG. 14 is a flowchart illustrating a method for searching for a value corresponding to a search key stored in one of the mapper entries in the lookup tables shown in FIG. 10A.

FIG. 14 is a flowchart illustrating a method for searching for a value corresponding to a search key stored in one of the lookup tables 200a-b shown in FIG. 10A.

At step 1340, the first level mapper 106a in both lookup tables 200a-b is searched for a value corresponding to a first portion of a key 210a. Processing continues with step 1342.

At step 1342, if a valid result value is found after searching the first level mapper 106a with the first portion of the key 210a, processing continues with step 1352. If not, processing continues with step 1344.

At step 1344, if the value resulting from the search of the first level mapper 106a with the first portion of the key 210a is a subtree entry descriptor 304 (FIG. 4), processing continues with step 1346. If not, the valid value for the key is not stored in the current lookup table, processing is complete.

At step 1346, the search for a valid value continues in the subtree identified in the subtree entry descriptor 304 (FIG. 4) found during the search of the previous level mapper. The next level mapper is searched for a value dependent on a next portion of the key 210b-c and a subtree select resulting from a search of the next level. Processing continues with step 1348.

At step 1348, the result of the search determines if a search of a next level mapper is required. The entry resulting from the current search can store a route entry 302, a no-entry 300 (FIG. 4) or a subtree entry descriptor 304 (FIG. 4). If the entry stores a subtree entry descriptor 304 (FIG. 4), a further search is necessary and processing continues with step 1346. If the entry does not store a subtree entry descriptor 304 (FIG. 4), processing continues with step 1350.

At step 1350, if the entry stores a route index 102 (FIG. 3), processing continues with step 1352. If not, the entry is stored in another lookup table. Processing is complete.

At step 1352, a valid value corresponding to the key is stored in the current lookup table. The valid value is forwarded as the route index 102 (FIG. 3) corresponding to the key. Processing is complete.

Sparse Mode

Returning to FIG. 5, the subtree entry 404 provides for the access of up to 256 possible route indices, one per node in the 256 node subtree. The route indices are stored in mapper entries $504^1$-$504^n$ in the subtree mapper 418 (FIG. 5) (FIG. 5). The mapper address 416 for a mapper entry 504 (FIG. 6B) in the subtree mapper 418 (FIG. 5) is determined dependent on a dense subtree descriptor stored in the data field 406 and a subtree pointer stored in the pointers field 408 in the subtree entry 404. The format of dense subtree descriptor has already been described in conjunction with FIGS. 6A-6B. The dense subtree descriptor stores a node bit 502 (FIG. 6B) for each node in the 256 node subtree. However, all subtrees have a different route index for each of the 256 nodes, for example, a subtree may only have one route index.

Figure 15:
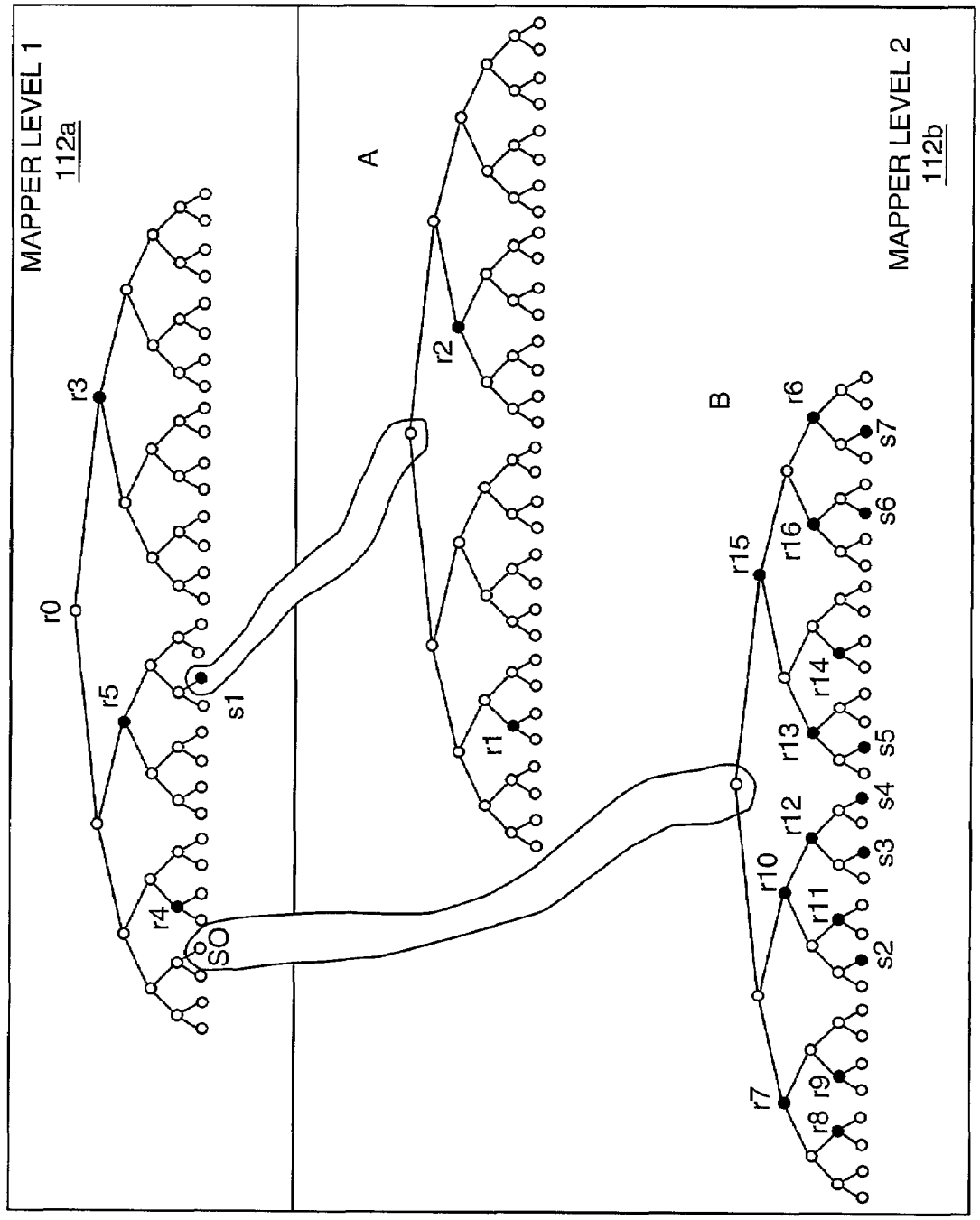
FIG. 15 illustrates a binary tree representation of a sparse subtree and a dense subtree in the second mapper level indexed by the first mapper level.

FIG. 15 illustrates a binary tree representation of a sparse subtree A and a dense subtree B in the second mapper level 112b indexed by subtree entries 304 (FIG. 4) in the first mapper level 112a. A subtree entry descriptor 304 (FIG. 4) for s1 in mapper 106a stores a subtree index 312 for the subtree entry 404 for subtree A. A subtree entry descriptor 304 (FIG. 4) for s0 in mapper 106a stores a subtree index 312 for the subtree entry 404 for subtree B.

Densely populated subtree B has eleven route indices; that is, r6-r16 and six subtree entries; that is, s2-s7. The mapper addresses 416 corresponding to the mapper entries 504 (FIG. 6B) storing route entries 302 (FIG. 4) and subtree entries 304 (FIG. 4) for subtree B are coded in a dense subtree descriptor as has already been described in conjunction with FIG. 6B Sparsely populated subtree A stores two route indices; that is r1 and r2. If they are stored in a dense subtree descriptor an entire subtree entry 404 is used to provide three mapper addresses 416 for the mapper entries 504 (FIG. 6B); that is, r0, r1 and r2.

The number of routes stored in the lookup table 200 can be increased by coding a sparse subtree in one of a plurality of sparse subtree descriptors and coding a densely populated subtree in a dense subtree descriptor in a subtree entry 404.

A densely populated subtree has 16 or more mapper entries 504 (FIG. 6B), the data field 406 in the subtree entry 404 stores a dense subtree descriptor as described in conjunction with FIGS. 6A-6B. A sparsely populated subtree has 15 or less mapper entries 504 (FIG. 6B); the data field in the subtree entry 404 stores a plurality of sparse subtree descriptors. By providing the ability to store sparsely populated subtrees in sparse subtree descriptors, more subtrees can be stored in the subtree memory 400 and thus more route entries can be stored in the lookup table 200.

Figure 16A:
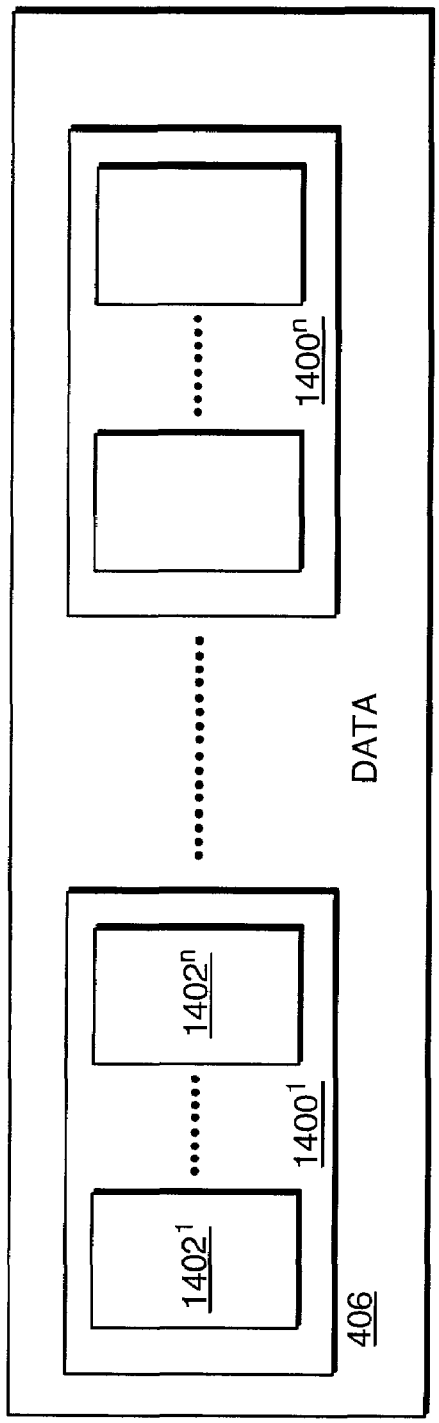
FIG. 16A-C illustrate the modification to the data field and the pointer field in the subtree entry shown in FIG. 5 and the subtree entry shown in FIG. 4 to permit storage of a plurality of sparse subtree descriptors in the subtree entry.
Figure 16B:
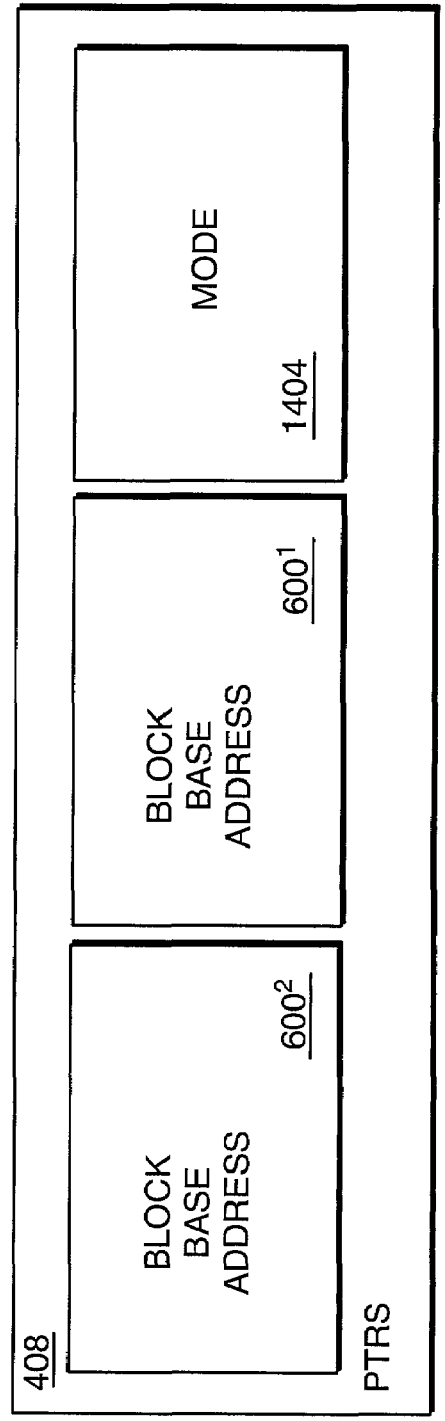
Figure 16C:
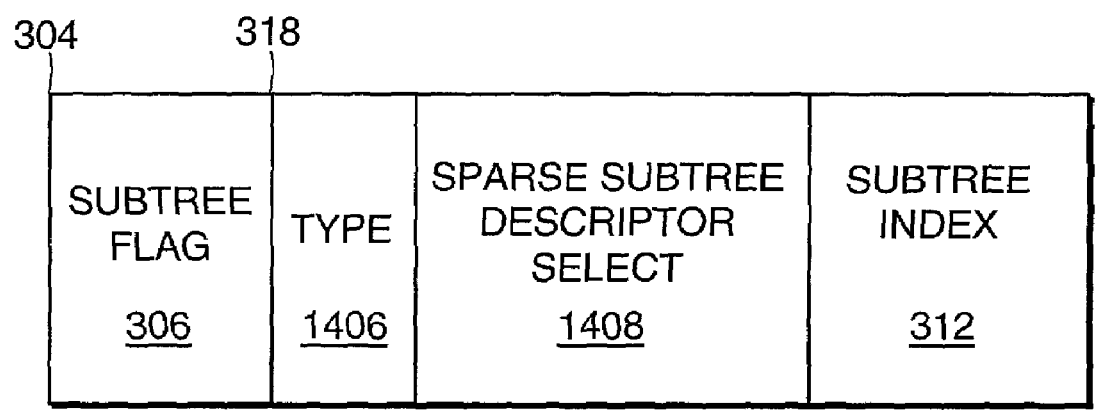

FIG. 16A-C illustrate the modifications to the data field 406 and the pointers field 408 in the subtree entry 404 shown in FIG. 5 and the subtree entry descriptor 304 (FIG. 4) shown in FIG. 4 to permit storage of a plurality of sparse subtree descriptors in the subtree entry 404.

Turning to FIG. 16A, the data field 406 in a subtree entry 404 configured in sparse mode includes a plurality of sparse subtree descriptors $1400^1$-$1400^n$ instead of the dense subtree descriptor with one bit per node of the subtree described in conjunction with FIG. 6B. Each sparse subtree descriptor $1400^1$-$1400^n$ includes a node descriptor $1402^1$-$1402^n$. A node descriptor $1402^1$-$1402^n$ is a 9-bit value representing a fully encoded route in the subtree. The node descriptor $1402^1$-$1402^n$ describes a single node or a plurality of nodes in the subtree.

Turning to FIG. 16B, to support storage of sparse subtree descriptors, a mode field 1404 is added to the pointers field 408 in the subtree entry 404. The pointers field 408 also stores block base address $600^1$ and block base address $600^2$ with each block including 16 allocated mapper addresses 416 providing a total of 32 mapper addresses 416 per subtree entry 404. The mode field 1404 stores a mode value. The mode value stored in the mode field 1404 indicates the number of sparse subtree descriptors $1400^1$-$1400^n$ stored in the subtree entry 404 and the number of node descriptors $1402^1$-$1402^n$ stored in each sparse subtree descriptor $1400^1$-$1400^n$. Table 2 illustrates the configuration of the subtree entry 404 for each mode.

TABLE 2

| | nodes/subtree | | | subtrees/ subtree | routes/subtree entry | | | mapper entries required for a subtree entry | |
|---|---|---|---|---|---|---|---|---|---|
| mode | max | min | bits | entry | max | min | unused | max | min |
| 0 | 1 | 1 | 9 | 16 | 16 | 16 | 112 | 32 | 32 |
| 1 | 2 | 2 | 18 | 10 | 20 | 20 | 76 | 30 | 30 |
| 2 | 3 | 3 | 27 | 8 | 24 | 24 | 40 | 32 | 32 |

TABLE 2-continued

| | nodes/subtree | | | subtrees/ subtree | routes/subtree entry | | | mapper entries required for a subtree entry | |
|---|---|---|---|---|---|---|---|---|---|
| mode | max | min | bits | entry | max | min | unused | max | min |
| 3 | 4 | 4 | 36 | 6 | 24 | 24 | 40 | 30 | 30 |
| 4 | 7 | 5 | 63 | 4 | 28 | 20 | 4 | 32 | 24 |
| 5 | 15 | 8 | 135 | 2 | 30 | 16 | −14 | 32 | 18 |

Referring to Table 2, for example, if the mode value stored in mode field 1404 in the pointers field 408 in the subtree entry 404 is set to '4', each sparse subtree descriptor 1400 in the subtree entry 404 stores between 5 and 7 node descriptors $1402^1$-$1402^n$. Each node descriptor $1402^1$-$1402^n$ stores 9 bits. The total number of bits stored in the sparse subtree descriptor 1400 is calculated by multiplying the number of node descriptors $1402^1$-$1402^n$ per sparse subtree descriptor $1402^1$-$1402^n$ by 9 (the number of bits per node descriptor $1402^1$-$1402^n$). Computing the number of bits per sparse subtree descriptor 1400 for mode 4, a sparse subtree descriptor 1400 with 7 node descriptors 1402 stores 63 bits (7 node descriptors * 9 bits=63).

The number of sparse subtree descriptors 1400 per subtree entry 404 is computed by dividing the number of bits in the data field 406 by the number of bits in the sparse subtree descriptor $1400^1$-$1400^n$. For mode 4, the number of bits in the data field 406 is 256 and the number of bits in the sparse subtree descriptor is 63. Thus, the number of sparse subtree descriptors $1401^1$-$1401^n$ is 4 ( int(256/63)=4).

The total number of node descriptors $1402^1$-$1402^n$ per subtree entry 404 is the number of nodes per subtree multiplied by the number of subtrees per subtree entry 404. Computing for mode 4, the total number of node descriptors 1402 per subtree entry 404 is 28, if there are 7 node descriptors $1402^1$-$1402^n$ stored in a sparse subtree descriptor $1400^1$-$1400^n$ (7*4=28), and 20 if there are 5 node descriptors 1402 per sparse subtree descriptor $1400^1$-$1400^n$ (5*4=20).

The mapper entries column in Table 2 indicates how many mapper entries 504 (FIG. 6B) in the subtree mapper 418 (FIG. 5) are used by the subtree entry 404. The mapper value is computed by incrementing the nodes per subtree by one and by multiplying by the number of subtrees in the sparse subtree descriptor. The nodes per subtree is incremented by one because one more mapper entry than the number of nodes per subtree is required to store the default entry for the subtree.

Referring to the mode 4 row in Table 2, 32 ((7+1) * 4=32) mapper entries are required per subtree entry 404 if there are seven node descriptors 1402 per sparse subtree descriptor 1400, and 24 ((5+1) * 4=24) node descriptors 1402 are required per sparse subtree descriptor 1400 if there are five node descriptors 1402 per sparse subtree descriptor 1400. The number of nodes per subtree and subtrees per subtree entry 404 are selected so that the maximum number of node descriptors per subtree entry 404 does not exceed 30 because mapper addresses 416 in subtree mapper 418 (FIG. 5) are allocated in 16 block increments. The 32 mapper addresses 416 are provided by storing two block base addresses $600^1$, $600^2$ stored in the pointers field 408.

Turning to FIG. 16C, each subtree entry 404 in the subtree memory 400 can be configured in dense mode as described in conjunction with FIG. 6B or in sparse mode. The subtree entry descriptor 304 (FIG.4) stored in subtree mapper 418 (FIG. 5) which has been described in conjunction with FIG. 4 for dense mode is modified to allow sparse mode by providing an indication of whether the subtree entry 404 is coded in dense mode or in sparse mode. The indicator is provided by the type field 1406.

The state of the type field 1406 indicates whether the subtree entry 404 is configured in dense mode or sparse mode. If the subtree entry 404 is configured in sparse mode, the values stored in the sparse subtree descriptor select field 1408 and subtree index 312 are used to select a sparse subtree descriptor 1400. The sparse subtree descriptor select 1408 will be described in more detail later in conjunction with FIG. 16.

Figure 17:
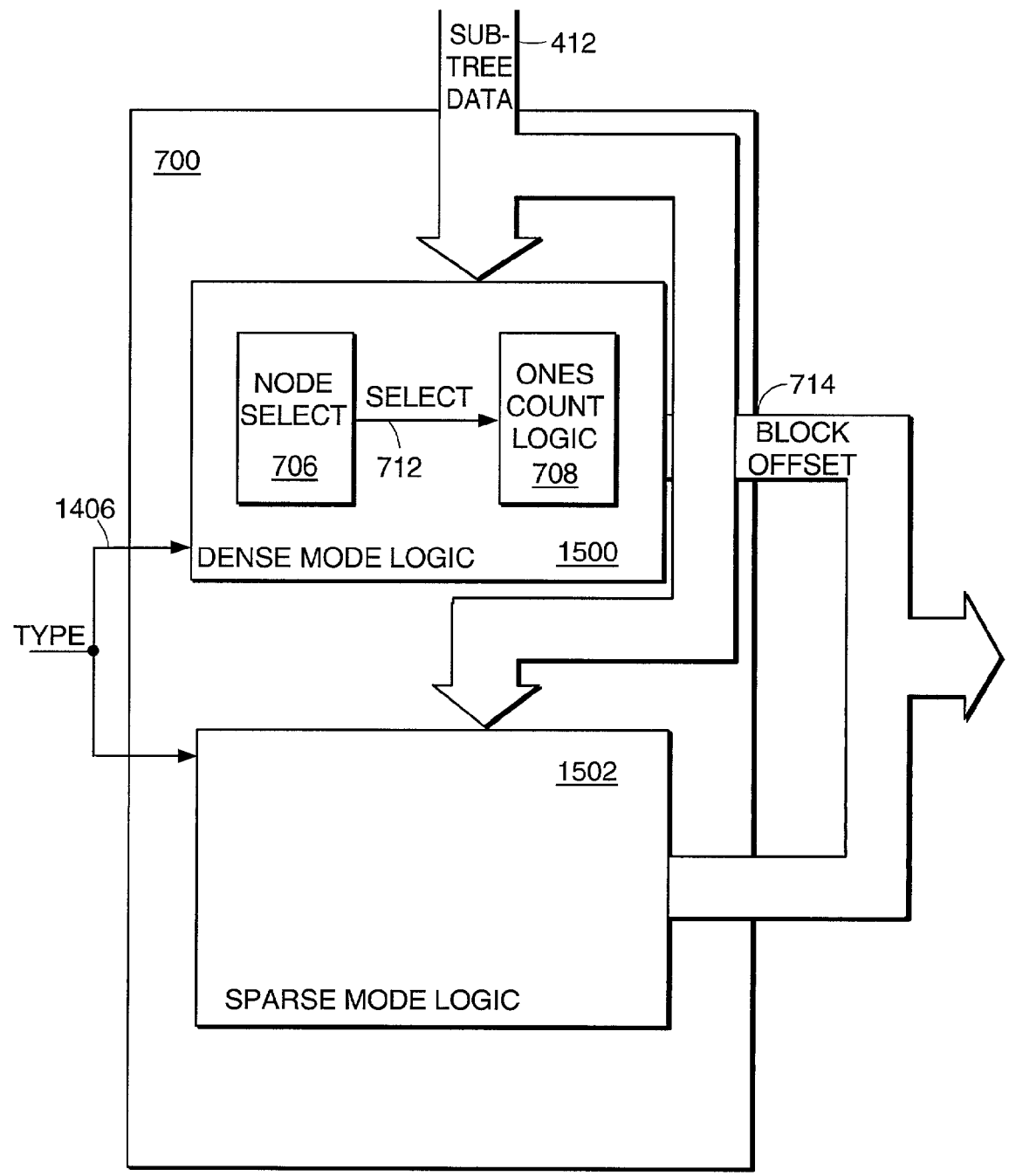
FIG. 17 illustrates the sparse mode subtree logic in the offset logic shown in FIG. 8 to select a block offset for a node in a sparsely populated subtree.

FIG. 17 illustrates the sparse mode logic 1502 in the offset logic 700 shown in FIG. 8 for providing a block offset 714 to select a mapper entry 504 (FIG. 6B) for a node in a sparsely populated subtree. The sparse mode logic 1502 provides the block offset 714 dependent on a node descriptor 1402 stored in a sparse subtree descriptor 1400 in a subtree entry 404. The offset logic 700 also includes dense mode logic 1500. Dense mode logic 1500 includes node select 706 and ones count logic 708 for providing a block offset 714 for a route in a densely populated subtree. Dense mode logic 1500 has already been described in conjunction with FIG. 8.

If the state of the type field 1406 indicates that the subtree entry 404 is configured in sparse mode, the subtree data 412 from the subtree entry 404 is forwarded to the sparse mode logic 1502. The sparse mode subtree logic 1502 is described in conjunction with FIG. 18.

Figure 18:
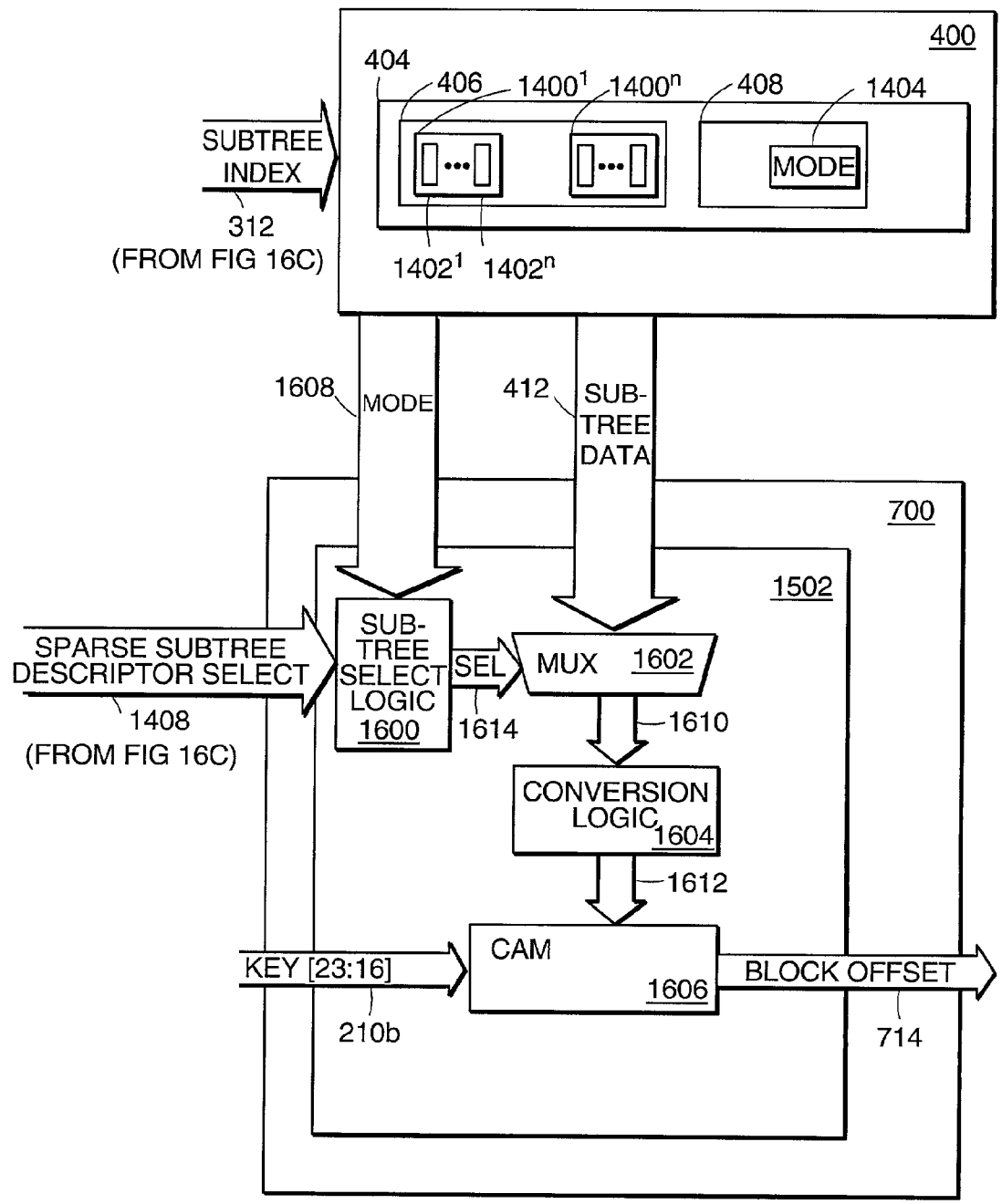
FIG. 18 illustrates the sparse mode logic shown in the offset logic in FIG. 17.

FIG. 18 illustrates the sparse mode logic 1502 shown in the offset logic 700 in FIG. 17. The sparse mode logic 1502 includes subtree select logic 1600, a multiplexer 1602, a Content Addressable Memory ("CAM") 1606 and conversion logic 1604. The sparse subtree descriptors $1400^1$-$1400^n$ stored in the data field 406 in the selected subtree entry 404 are forwarded on subtree data 412 to the offset logic 700. The offset logic 700 forwards the sparse subtree descriptors $1400^1$-$1400^n$ to the multiplexor 1602 in the sparse mode logic 1502. One of the sparse subtree descriptors $1400^1$ in the subtree data 412 is selected by select 1614 generated by the subtree select logic 1600.

The subtree select logic 1600 generates select 1614 to select the sparse subtree descriptor $1400^1$ dependent on the state of sparse subtree descriptor select 1408 forwarded from the mapper entry selected in the previous mapper level and mode 1404 stored in the pointers field 408 in the selected subtree entry 404. Table 3 illustrates the selected sparse subtree descriptor $1400^1$ and the respective subtree data bits 412 forwarded on selected sparse subtree descriptor 1610 from the multiplexer 1602 for a mode 4 subtree entry 404. Referring to the mode 4 row in Table 2, four sparse subtree descriptors can be stored in the mode 4 subtree entry 404. Each of the four sparse subtree descriptors 1400 is 63 bits and can store from seven to five node descriptors 1402. Thus, each of the four sparse subtree descriptors 1400 starts on a 63 bit boundary. The first sparse subtree descriptor $1400^1$ is stored at bits 62:0 in the data field 406. The second sparse subtree descriptor 1400² is stored at bits 125:63 in the data field 406. The third sparse subtree descriptor 1400³ is stored at bits 188:126 in the data field 406 and the fourth sparse subtree descriptor 14004 is stored at bits 251:189 in the data field. The respective bits in the data field 406 are selected by the sparse subtree descriptor select 1408. For example, looking at Table 3, if sparse subtree descriptor select 1408 is '0001', the second sparse subtree descriptor 1400² is selected and Bits 125:63 of the 256 bit subtree data 412 are forwarded through the multiplexor 1602 on selected sparse subtree descriptor 1610 to the conversion logic 1604.

TABLE 3

| Sparse subtree descriptor select | Subtree data | Sparse Subtree Descriptor |
|---|---|---|
| 0000 | Bits 62:0 | 1 |
| 0001 | Bits 125:63 | 2 |
| 0010 | Bits 188:126 | 3 |
| 0011 | Bits 251:189 | 4 |

Each subtree entry 404 in the subtree memory 400 can be configured in sparse mode or dense mode. Each subtree entry 404 configured in sparse mode can be configured to store a different number of node descriptors 1402 per sparse subtree descriptor 1400 through mode 1404. All sparse subtree descriptors 1400 in subtree entry 404 configured in sparse mode store the same number of node descriptors 1402 per sparse subtree descriptor 1400.

A node descriptor 1402 can be coded to represent multiple nodes in the subtree. Multiple eight bit nodes represented by the node descriptor 1402 are identified by masking some of the eight bits. Instead of storing mask bits with each node descriptor 1402, a nine bit node descriptor 1402 is used to fully encode the eight bit wide nodes represented by the node descriptor 1402. The eight bit wide node is encoded in a nine bit wide node descriptor 1402 using run bit length encoding. Run bit length encoding permits identification of which of the eight bits of the node are masked.

The conversion logic 1604 converts the nine bit wide node descriptors 1402¹-1402ⁿ stored in the selected sparse subtree descriptor 1400 into eight bit CAM values 1612 including bits set to 'X' (don't care) and loads the eight bit CAM values 1612 into the CAM 1606. An example of the conversion of the 9-bit node descriptors 1402 into 8-bit CAM values 1612 by the conversion logic 1604 is shown in Table 4 below.

TABLE 4

| 8-bit value | 9-bit code |
|---|---|
| 101100XX | 101100100 |
| 100XXXXX | 100100000 |
| 001111XX | 001111100 |
| 0011XXXX | 001110000 |

The 9-bit code column illustrates values stored in node descriptors 1402. Looking at the first row in Table 4, the 9-bit code stored in the node descriptor 1402 is '101100100' and the corresponding 8-bit value '01100XX' is stored in the CAM 1606. The conversion logic 1604 converts the 9-bit code by searching the 9-bit code from right to left for the first bit set to '1'. Looking at the bits in the 9-bit code from right to left, the first two bits are set to '0' and the third bit is set to '1'. The conversion logic 1604 converts the '100' to two don't cares ('XX') because there are two '0's to the right of the first '1'. The first '1' is ignored and the remaining bits are directly copied into the next bits of the 8-bit value.

Looking at the second row in Table 4, the 9-bit code stored in the node descriptor 1402 is '100100000'. The conversion logic 1604 converts the 9-bit code by searching the 9-bit code from right to left for the first '1'. The fifth digit stores a '1'. The 9-bit code is converted to an 8-bit value with the five Least Significant Bits ("LSBs") set to "don't cares"("X"). By storing the node descriptors 1402 using 9-bit run bit length encoding, the number of bits required per node descriptor 1402 is minimized, thereby increasing the number of node descriptors 1402 which can be stored in the lookup table 200.

After converting the 9-bit node descriptors 1402 into 8-bit values, the conversion logic 1604 loads the 8-bit values into the CAM 1606. The 8-bit values are loaded into the CAM 1606 in the same order as the node descriptors 1402 are stored in the selected sparse subtree descriptor 1400; that is, from shortest to longest match. The CAM 1606 provides storage for storing the maximum number of node descriptors 1402 per sparse subtree descriptor 1400. Thus, the CAM 1606 is 8 bits wide by sixteen entries deep to provide fifteen entries to store the maximum number of node descriptors 1402 for a mode 5 sparse subtree descriptor 1400 and a default mapper address. The CAM 1606 has ternary capability and multi-match resolver built in. A small size CAM 1606 can be implemented in gates, as opposed to providing a true contents addressable memory; that is, the CAM 1606 can be implemented in hardware circuitry which emulates a CAM.

The number of node descriptors 1402 stored in a sparse subtree descriptor 1400 determines the subtree entry 404 in which the sparse subtree descriptor 1400 is stored. Sparse subtree descriptors 1400 storing node descriptors 1402 within the range for a particular mode are stored in the same subtree entry 404. A default mapper address is computed for a default route for each subtree. A default 8-bit value is permanently stored in the first location in the CAM 1606 to compute the default mapper address.

After the 8-bit values for the selected sparse subtree 1400 have been loaded into the CAM 1606, the CAM 1606 is searched with the next portion of the key 210b. The entry in the CAM 1606 matching the greatest number of bits in the next portion of the key 210b is selected. The match address resulting from the search of the CAM is forwarded as the block offset 714. The block offset 714 is used to determine the mapper address 416 for the mapper entry corresponding to the route stored in the subtree mapper 418 (FIG. 5).

FIGS. 19A-D illustrate the selection of a block offset 714 for a node in a sparsely populated subtree 1700. FIG. 17A is a graphical representation of the routes in the sparsely populated subtree 1700. Nodes in the subtree 1700 correspond to one of three routes, r0, r1 and r2. r0 is the default route for the subtree 1700. Two routes r1, r2 are encoded in node descriptors 1402¹ and 1402² in a sparse subtree descriptor 1400. A value for the default route r0 is permanently stored in the first entry 1702 in the CAM 1606. Referring to Table 2, a sparse subtree descriptor 1400 with two node descriptors 1402 is stored in subtree entry 404 with the mode field 1404 set to '1'.

Looking at subtree 1700, r2 corresponds to all nodes matching 10xxxxxx and r1 corresponds to all nodes matching 010xxxxx. In order to minimize the number of bits required by each node descriptor 1402¹, 1402² to describe each route in the sparse subtree descriptor 1400, the node descriptor 1402¹,1402² is coded using run bit length encoding. The method for coding uses one bit more than the number of bits used to fully encode the node. A '1' is inserted in the location of the first 'X' ('don't care') and the remaining Xs are coded as 0's. Thus, route 10xxxxxx is translated to 10100000 and 010xxxxx is translated to 010100000.

FIG. 19B illustrates the storage of the node descriptors $1402^1$ and $1402^2$ in the sparse subtree descriptor 1400. The node descriptors $1402^1$ and $1402^2$ are stored in a subtree entry 404 with the mode field 1404 set to '1' because there are two node descriptors $1402^1$ and $1402^2$ stored in the sparse subtree descriptor 1400. The longest match for the subtree is r1 because r1 requires a match of the first three bits and r2 requires a match of the first two bits. The node descriptors $1402^1$ and $1402^2$ are stored in shortest to longest match order in the sparse subtree descriptor 1400, with the node descriptor $1402^1$ for r2 stored first and the node descriptor $1402^2$ for r1 stored next.

FIG. 19C illustrates the conversion of the node descriptor $1402^2$ to an 8-bit masked value 1706. Looking at the node descriptor bits $1708^1$-$1708^9$ from left to right, the first '1' is stored in bit $1708^6$, this marks the end of the mask bits for the 8-bit masked value 1706. To convert the node descriptor $1402^2$ to an 8-bit masked value 1706, the following bit conversions are performed. The '0' stored in node descriptor bit $1708^1$ is converted to 'X' and stored in 8-bit masked value bit $1710^1$. The '0' stored in node descriptor bit $1708^2$ is converted to 'X' and stored in 8-bit masked value bit $1710^2$. The '0' stored in node descriptor bit $1708^3$ is converted to 'X' and stored in 8-bit masked value bit $1710^3$. The '0' stored in node descriptor bit $1708^4$ is converted to 'X' and stored in 8-bit masked value bit $1710^4$. The '0' stored in node descriptor bit $1708^5$ is converted to 'X' and stored in 8-bit masked value bit $1710^5$. The '1' stored in node descriptor bit $1708^6$ is ignored. The '0' stored in node descriptor bit $1708^7$ is stored in 8-bit masked value bit $1710^6$. The '1' stored in node descriptor bit $1708^8$ is stored in 8-bit masked value bit $1710^7$. The '0' stored in node descriptor bit $1708^9$ is stored in 8-bit masked value bit $1710^8$.

Figure 19D:
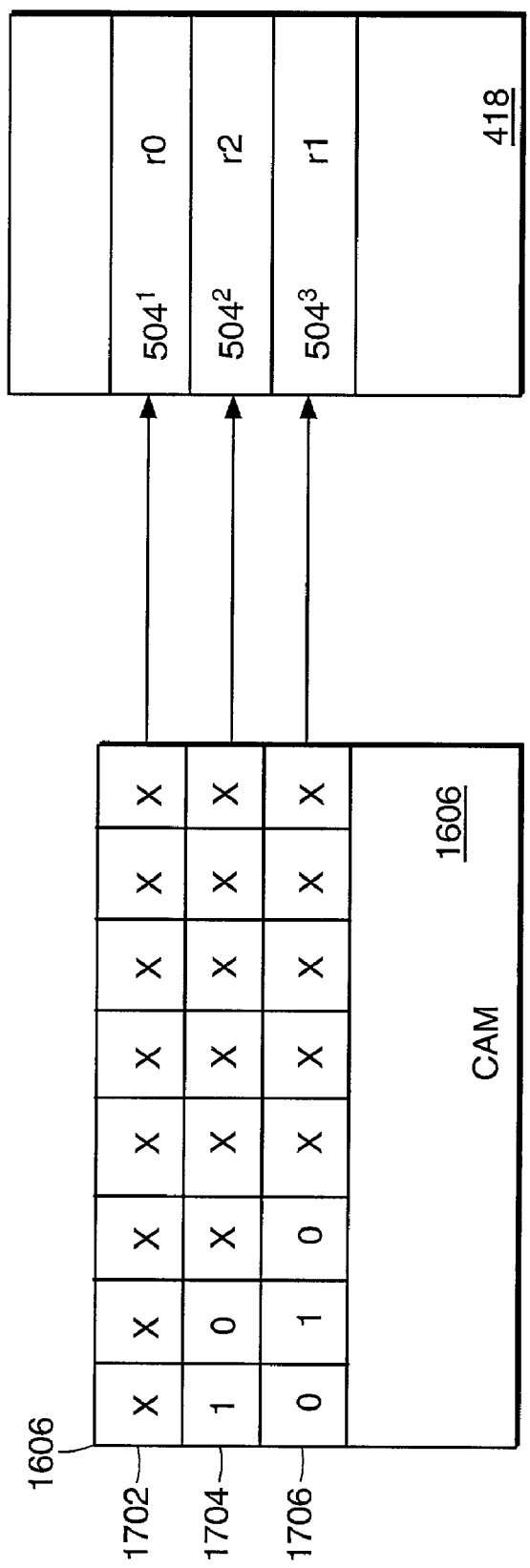

FIG. 19D illustrates the storage of node descriptors $1402^1$ and $1402^2$ in the CAM 1606 and the corresponding mapper entries $504^1$-$504^3$ stored in the subtree mapper 418 (FIG. 5) for the selected sparse subtree descriptor 1400. The 9-bit node descriptors $1402^1$ and $1402^2$ stored in the selected subtree descriptor 1400 are converted in the conversion logic 1604 (FIG. 18) and loaded into CAM 1606. The first entry 1702 in the CAM 1606 is the default entry for r0 shown in subtree 1700 in FIG. 19A. The second entry 1704 is converted from the first node descriptor $1402^1$ stored in the selected sparse subtree descriptor 1400. The second entry 1704 is the shortest match which is converted for r2. The second node descriptor $1402^2$ stored in the selected subtree descriptor 1400 is converted from 010100000 to 010XXXXX and stored in the third entry 1706 in the CAM 1606.

A search of the CAM 1606 results in the block offset 714 (FIG. 18). The block offset 714 is used to determine the mapper address 416 for the mapper entry $504^1$-$504^3$ stored in the subtree mapper 418 (FIG. 5). The CAM 1606 is searched with the second portion of the key 210b for the entry 1702, 1704, 1706 storing the longest match. The block offset 714 provided by the CAM 1606 is combined with a subtree base address dependent on one of the block base addresses $600^1$, $600^2$ stored in the pointers field 408 in the selected subtree entry 404.

Figure 20:
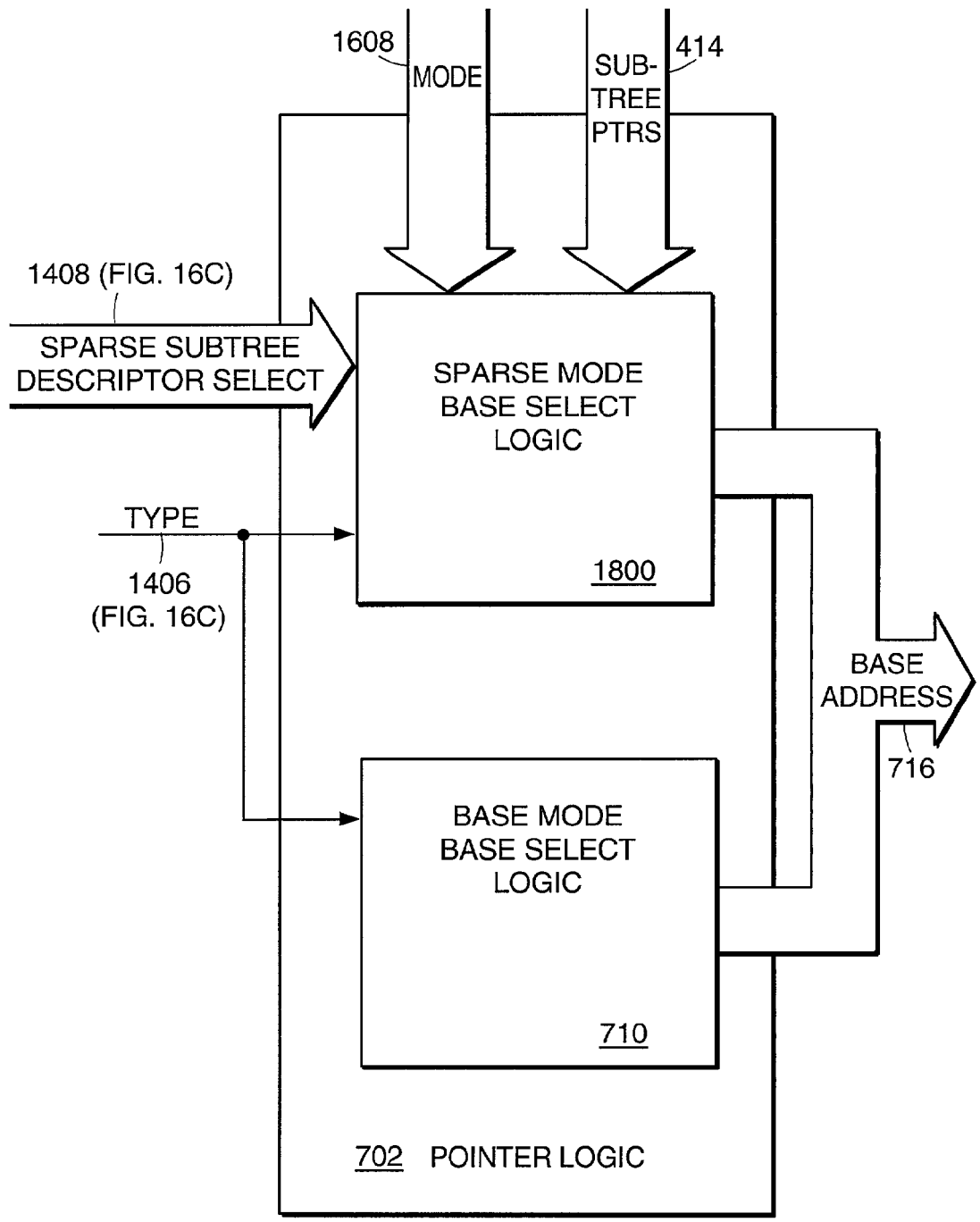
FIG. 20 is a block diagram illustrating the sparse mode base select logic in the pointer logic shown in FIG. 8.

FIG. 20 is a block diagram illustrating the sparse mode base select logic 1800 in the pointer logic 702 shown in FIG. 8. The pointer logic 702 selects the base address 716 used to compute the mapper address 416 for the mapper entry 504 (FIG. 6B) in the subtree mapper 418 (FIG. 5). The pointer logic 702 includes dense mode base select logic 710 and sparse mode base select logic 1800, one of which is selected, dependent on the state of type 1406 stored in the subtree entry descriptor 304 (FIG. 4), forwarded from the previous mapper level. As has already been described, the state of type 1406 indicates whether the subtree entry 404 is configured in dense mode.

Sparse mode base select logic 1800 computes the base address 716 for the sparse subtree descriptor 1400 if the subtree entry 404 stores a plurality of sparse subtree descriptors 1400. The sparse mode base select logic 1800 computes the base address 716 using the mode value 1608 stored in the mode field 1404 and subtree pointers 414 stored in block base address field $600^1$, $600^2$ in the subtree entry 404 and the sparse subtree descriptor select 1408 stored in the subtree entry descriptor 304 (FIG. 4) forwarded from the previous mapper level. The base address 716 is computed as follows:

base address (for the sparse subtree descriptor)=block base address+base offset where base offset=((1+nodes/subtree) * sparse subtree descriptor select))

For example, to find the base address 716 for the start of subtree number 2 in a subtree entry 404 configured in sparse mode 4, the base offset is computed first. The sparse subtree descriptor select 1408 for subtree number 2 is '1' and the number of nodes/subtree is 7 (See Table 2). The base offset is 8 ((1+7)* 1). Each block base address $600^1$, $600^2$ is the base address for a block of 16 mapper addresses allocated for the subtree entry 404. The base offset for subtree number 2 is 8 which is less than 16 therefore the block base address for subtree 2 is block base address $600^1$ and the base address 716 for the sparse subtree descriptor is block base address $600^1$+8. Table 5 below illustrates the subtree base address for each of the four subtrees in a subtree entry 404 configured in mode 4.

TABLE 5

| Subtree base address | Subtree |
|---|---|
| block base address 1 + 0 | 1 |
| block base address 2 + 8 | 2 |
| block base address 2 + 0 | 3 |
| block base address 2 + 8 | 4 |

Figure 21:
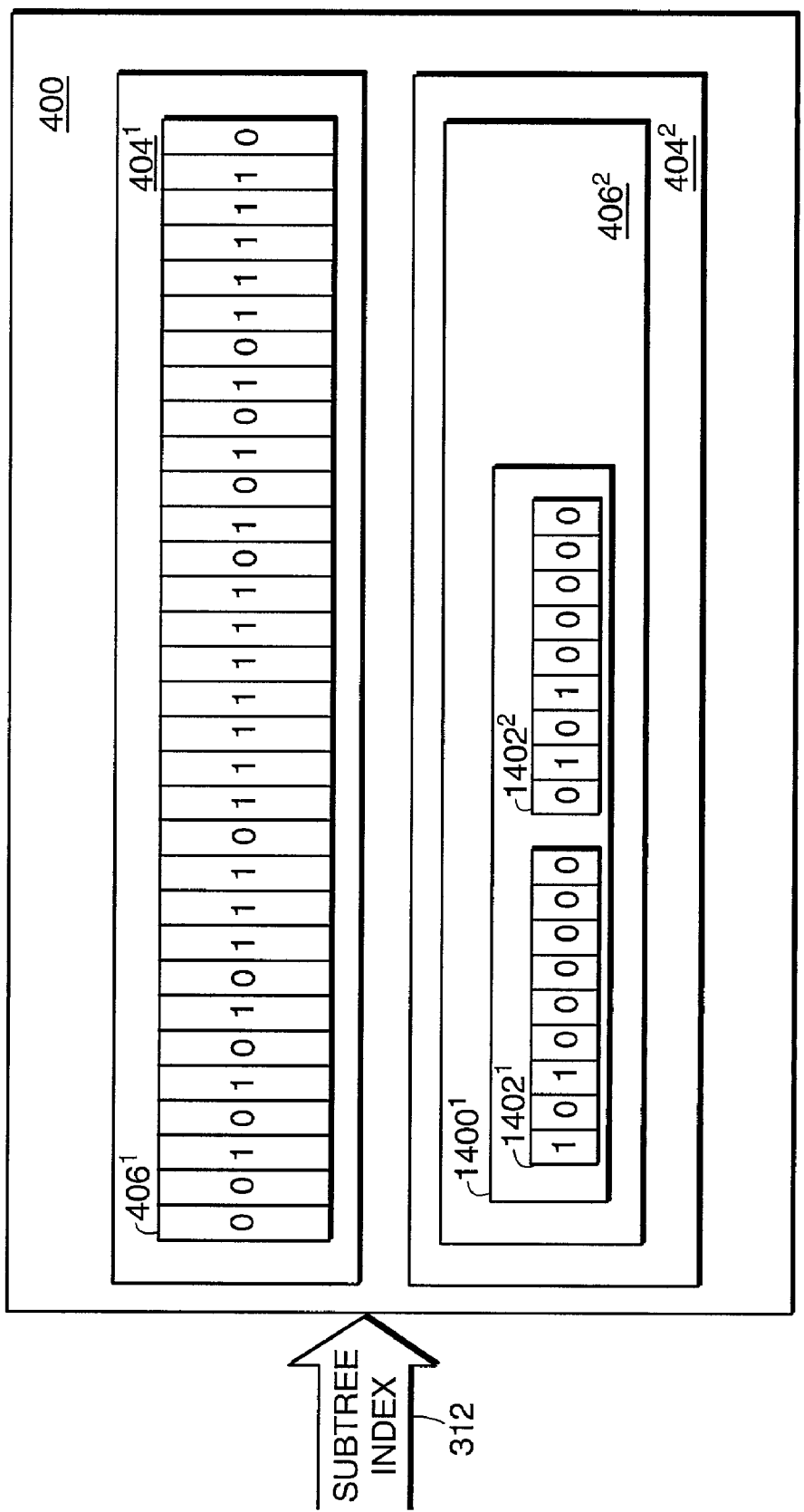
FIG. 21 illustrates a dense subtree descriptor and a sparse subtree descriptor stored in the subtree memory.

FIG. 21 illustrates a dense subtree descriptor and a sparse subtree descriptor stored in the subtree memory 400. FIG. 21 is described in conjunction with FIG. 15. A dense subtree descriptor for subtree B (FIG. 21) is stored in the data field $406^1$ in subtree entry $404^1$. A sparse subtree descriptor $1400^1$ for subtree A (FIG. 21) is stored in the data field $406^2$ in subtree entry $404^2$. The dense subtree descriptor stores a node bit for each node in the bottom level of subtree B as has already been described in conjunction with FIG. 6B. The sparse mode descriptor $1400^1$ includes node descriptors $1402^1$ and $1402^2$ corresponding to routes r4 and r5 as has been described in conjunction with FIG. 19B. The subtree index 312 selects the subtree entry $404^1$, $404^2$.

The subtree index 312 stored in a subtree entry descriptor 304 (FIG. 4) in a mapper entry 504 (FIG. 6B) in mapper 106a for s0 (FIG. 15) selects subtree entry $404^1$. The subtree index 312 stored in a subtree entry descriptor 304 (FIG. 4) in a mapper entry 504 (FIG. 6B) in mapper 106a for s1 (FIG. 15) selects subtree entry $404^2$. Thus, the subtree memory 400 can store subtree entries $404^1$, $404^2$ for sparse subtrees and dense subtrees.

Figure 22:
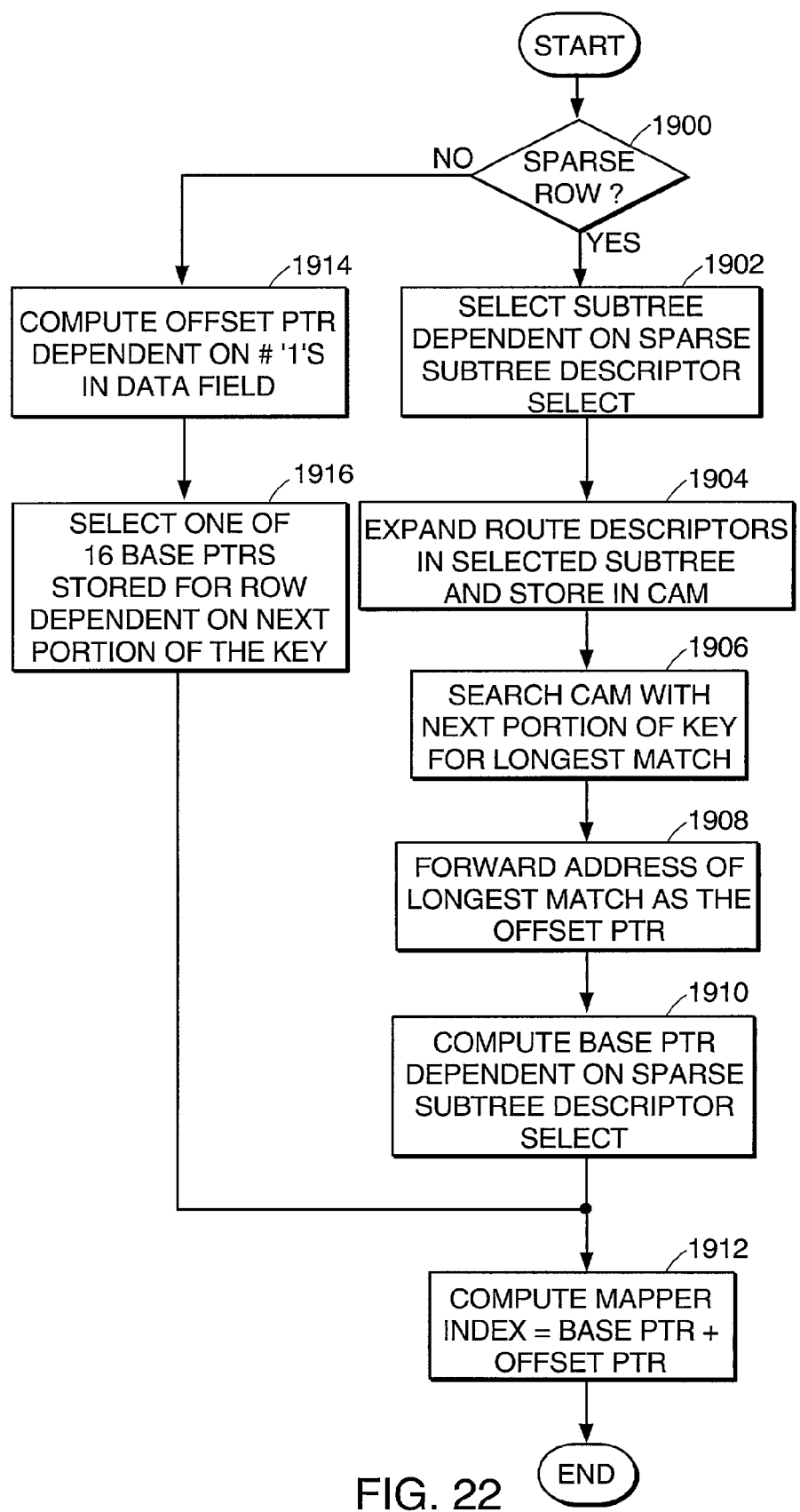
FIG. 22 is a flow chart illustrating a method for providing a mapper address for a mapper entry in a subtree mapper storing a route for a node in a sparsely populated subtree and a densely populated subtree.

FIG. 22 is a flow chart illustrating a method for providing a mapper address 416 (FIG. 5) for a mapper entry 504 (FIG. 6B) in a subtree mapper 418 (FIG. 5) storing a route for a node in a sparsely populated subtree and a densely populated subtree. Any subtree entry 404 may store a plurality of sparse subtree descriptors or a single dense subtree descriptor. Any combination of sparse subtree descriptors and dense subtree descriptors is possible dependent on how the routes are distributed in the binary tree. The flexibility to mix and match sparse mode and dense subtree descriptors in subtree entries 404 in the subtree memory 400 allows better utilization of the subtree memory 400.

At step 1900, the configuration of the selected subtree entry 404 is determined from the state of type 1406 (FIG. 16C) stored in the subtree entry descriptor 304 (FIG. 4) selected in the previous mapper level. If the subtree entry 404 type is configured in sparse mode, processing continues with step 1902. If not, processing continues with step 1914.

At step 1902, the subtree entry 404 is configured in sparse mode. A subtree entry 404 configured in sparse mode stores a plurality of sparse subtree descriptors 1400. The number of sparse subtree descriptors 1400 stored in the subtree entry 404 is dependent on the state of the mode field 1404. The sparse mode logic 1502 in the offset logic 700 selects the sparse subtree descriptor 1400 from the subtree entry 404 dependent on the sparse subtree descriptor select 1408 stored in the subtree entry descriptor 304 (FIG. 4) forwarded from the previous mapper level and the contents of the mode field 1404 as was described earlier in conjunction with FIG. 14. Processing continues with step 1904.

At step 1904, the 9-bit coded values stored in the node descriptors 1402 in the selected sparse subtree descriptor 1400 are converted into 8-bit values and stored in order of shortest to longest match in the CAM 1606. Processing continues with step 1906.

At step 1906, the CAM 1606 is searched with the next portion of the key 210b for the CAM entry storing the longest match. Processing continues with step 1908.

At step 1908, the address of the location in the CAM 1606 storing the longest match for the next portion of the key 210b is forwarded as the block offset 714. The block offset 714 is used to compute the mapper address 416 (FIG. 5) of the mapper entry 504 (FIG. 6B) in the subtree mapper 418 (FIG. 5). Processing continues with step 1910.

At step 1910, the base address 716 (FIG. 20) for the selected sparse subtree descriptor 1400 is computed dependent on the sparse subtree descriptor select 1408 stored in the subtree entry descriptor 304 (FIG. 4) forwarded from the previous mapper level and the contents of the mode field 1404 stored in the selected subtree entry 404. Processing continues with step 1912

At step 1912, the mapper address 416 is computed by adding the block offset 714 and the base address 716 in the adder logic 704 (FIG. 8). The mapper entry 504 (FIG. 6B) identified by the mapper address 416 in the subtree mapper 418 (FIG. 5) either stores a route entry 302 (FIG. 4) or a subtree entry descriptor 304 (FIG. 4). If the mapper entry 504 (FIG. 6B) stores a route entry 302 (FIG. 4) the search is complete. If the mapper entry 504 (FIG. 6B) stores a subtree entry descriptor 304 (FIG. 4), the search for the value corresponding to the key 210 continues in the next mapper level.

At step 1914, the subtree entry 404 is configured in dense mode and stores a single dense subtree descriptor in the data field 406. The block offset 714 is computed by counting the number of '1's stored in dense subtree descriptor stored in the data field 406 in the subtree entry 404 as has been described earlier in conjunction with FIG. 6B. Processing continues with step 1916.

At step 1916, the subtree entry 404 stores sixteen block base addresses 600 in the pointers field 408 in the subtree entry 404. One of the block base pointers 600 is selected by the dense mode base select logic 710 in the pointers logic 702 described earlier in conjunction with FIG. 8. Processing continues with step 1912.

Incremental Update

Figure 23:
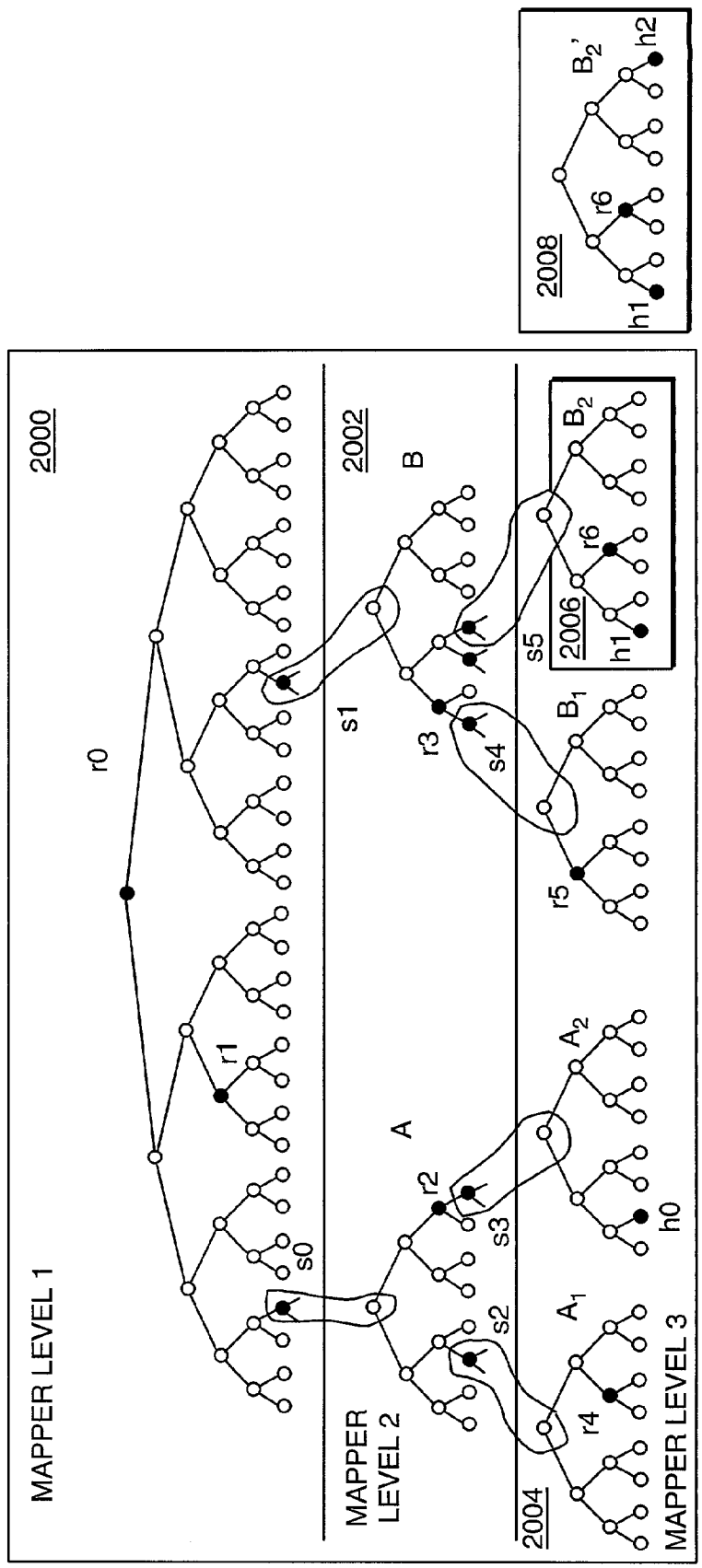
FIG. 23 illustrates a binary tree representation of a new route to be added to the lookup table.

FIG. 23 illustrates a binary tree representation of a new route to be added to the lookup table 200. The binary tree illustrates routes stored in the lookup table 200 for mapper level_1 2000, mapper level_2 2002 and mapper level_3 2004. Mapper level_2 2002 stores routes for subtrees A and B. Mapper level_3 2004 stores routes for subtrees $A_1$, $A_2$, $B_1$ and $B_2$. s5 represents a subtree entry descriptor 304 (FIG. 4) stored in a subtree mapper 418 (FIG. 5). The subtree entry descriptor 304 (FIG. 4) for s5 stores a pointer to Subtree $B_2$ allowing the search for a longest match route for a key 210 to continue in mapper level_3 2004.

Subtree $B_2$ 2006 is a sparse subtree because it has only two routes, r6 and h1. Thus, node descriptors 1402 (FIG. 16A) for nodes r6 and h1 are stored in a sparse subtree descriptor 1400, as has already been described in conjunction with FIG. 14A. The sparse subtree descriptor 1400 for Subtree $B_2$ 2006 is stored in a subtree entry 404 with mode field 1404 set to 1 in the subtree memory 400 because there are two node descriptors 1402 stored in the sparse subtree descriptor 1400.

A new route h2 shown in subtree $B_2'$ 2008 is to be added to the lookup table 200. The new route h1 can not be added directly to subtree $B_2$ 2006 in the lookup table because the addition of a route to subtree $B_2$ 2006 increases the number of node descriptors 1402 stored in the sparse subtree descriptor 1400 from 2 to 3. The addition of a node descriptor 1402 to a sparse subtree descriptor 1400 requires the allocation of a new sparse subtree descriptor 1400 in a subtree entry 404 with mode field 1404 set to '2'. Thus, the addition of new route h1 requires the replacement of subtree $B_2$ 2006 by subtree $B_2'$ 2008.

Figure 24:
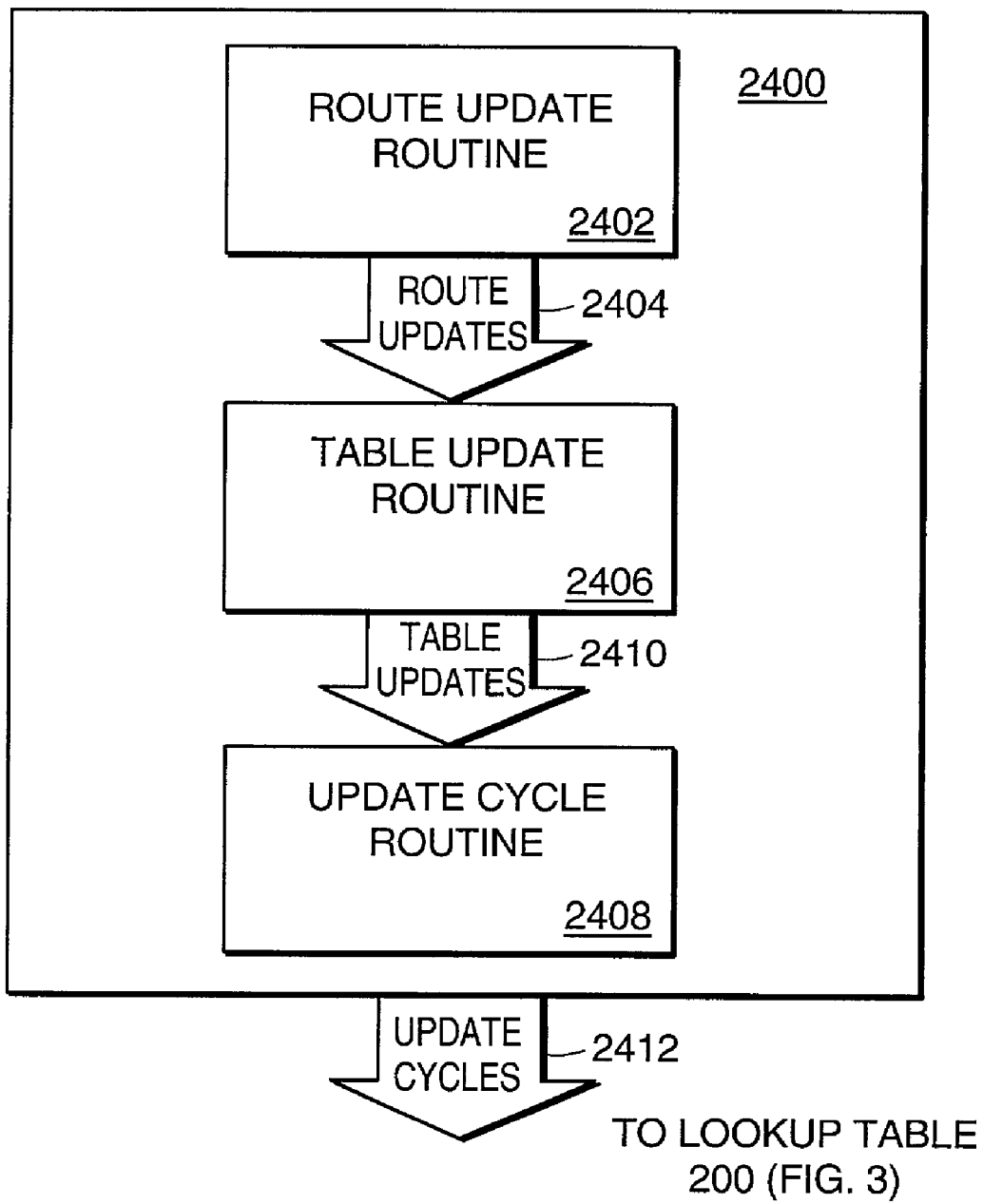
FIG. 24 illustrates update routes stored in a processor memory.

FIG. 24 illustrates update routes stored in a processor memory 2400. A copy of the binary tree stored in the lookup table 200 is also stored in processor memory 2400 separate from the lookup table 200. The routes stored for Subtree $B_2$ 2006 are copied to subtree $B_2'$ 2008 in the processor memory 2400 and the new route h2 is added to subtree $B_2'$ 2008.

A route update routine 2402 generates a sequence of route update instructions 2404 to add subtree $B_2'$ 2008 to the lookup table 200 and forwards the route updates 2404 to the table update routine 2406. The table update routine 2406 generates table updates 2410 for the route updates 2402 and forwards the update cycles 2412 to update the lookup table 200 with the route updates 2404. The update cycles 2412 write the route updates to the appropriate memory locations in the subtree memory 400 (FIG. 5) and the subtree mapper 418 (FIG. 5).

Returning to FIG. 23, the update cycles 2412 include instructions to allocate a portion of the subtree mapper 418 (FIG. 5) to store the routes for the new subtree $B_2'$ 2008 in mapper entries 504 (FIG. 6B). Subtree $B_2'$ 2008 includes route entries stored in mapper entries 504 (FIG. 6B) for routes h1 and r6 and new route h2. After the route entries for subtree $B_2'$ 2008 are stored in mapper entries 504 (FIG. 6B) in the subtree mapper 418 (FIG. 5), the node descriptors 1402 for the routes are created and stored in a sparse subtree descriptor 1400. The sparse subtree descriptor 1400 is stored in a subtree entry 404. The mode 1404 of the subtree entry 404 is related to the number of node descriptors 1402 stored in the sparse subtree descriptor 1400.

After the sparse subtree descriptor 1400 for subtree $B_2'$ 2008 is stored in a subtree entry 404 in subtree memory 400 in the lookup table 200, the subtree entry descriptor 304 (FIG. 4) represented by s5 is modified to point to subtree $B_2'$ 2008 instead of subtree $B_2$ 2006. While subtree $B_2'$ 2008 is being added to the lookup table, routes r6 and h1 stored in subtree $B_2$ 2006 can be accessed through s5. After subtree $B_2'$ 2008 is stored in the lookup table, and s5 is modified to point to subtree $B_2'$ 2008 and routes r6, h1 and the new route h2 can be accessed. Thus, subtree $B_2$ 2006 can continue to be searched for route indices corresponding to route r6 and h1 while the new route h2 is being added to the lookup table 200.

Figure 25:
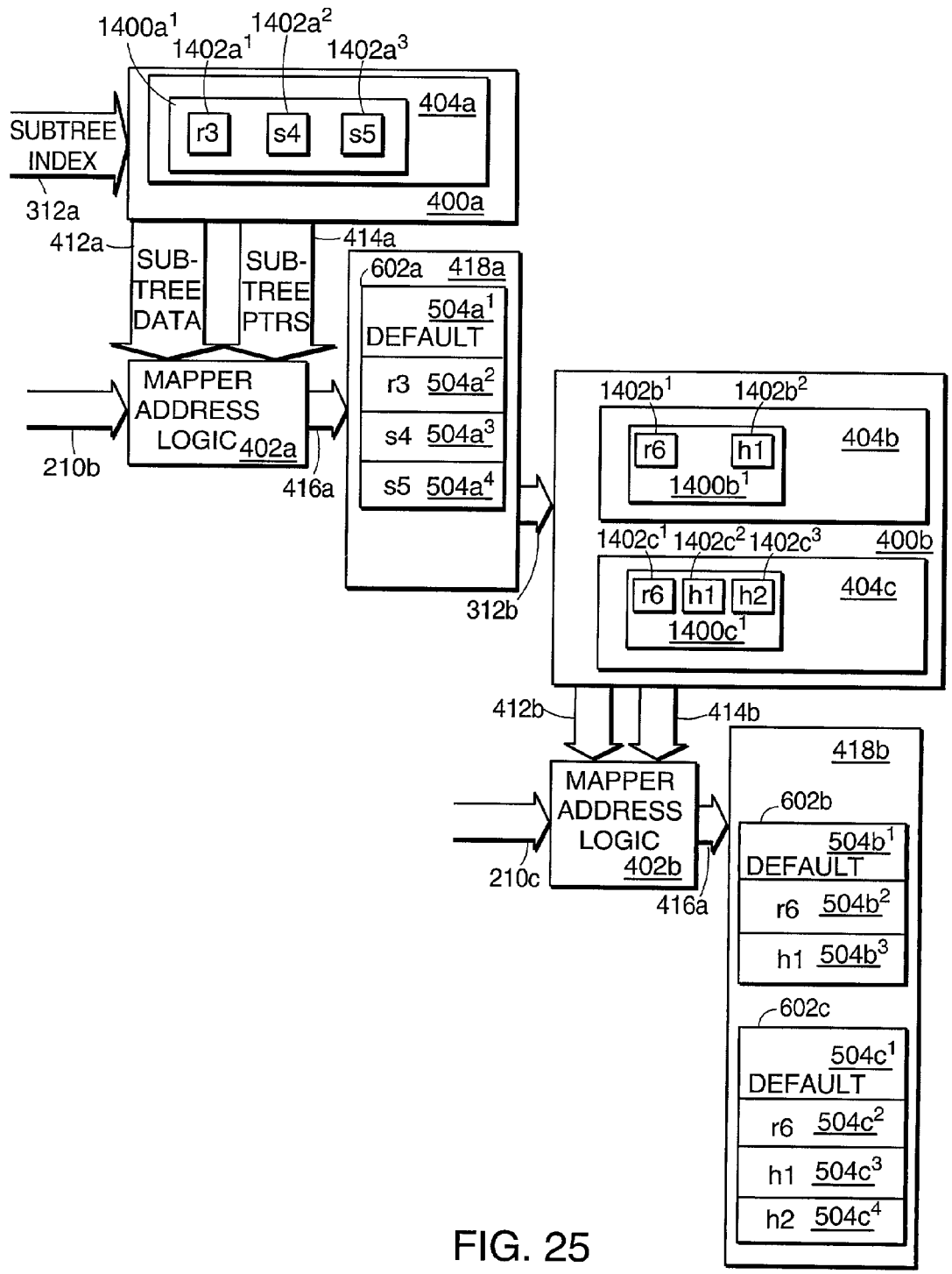
FIG. 25 illustrates the new route shown in FIG. 23 stored in the lookup table.

FIG. 25 illustrates the new route h2 shown in FIG. 23 stored in mapper entry $504c^4$ in subtree mapper 418b in the lookup table 200. FIG. 25 is described in conjunction with the binary tree representation shown in FIG. 24.

Subtree B in mapper level_2 2002 has three routes; that is r3, s4 and s5. Subtree B is a sparse subtree because it has less than sixteen routes. Node descriptors $1402a^1$-$1402a^3$ for the Subtree B r3, s4 and s5 are stored in a sparse subtree descriptor $1400a^1$ in subtree entry 404a in subtree memory 400a. A mapper entry $504a^2$-$504a^4$ is stored in subtree mapper 418a for each route in Subtree B. A default route for Subtree B is stored in mapper entry $504a^1$ in the subtree mapper 418a. Each mapper entry $504a^2$-$504a^4$ stores a route entry 302 (FIG. 4) or a subtree entry descriptor 304 (FIG. 4) for the node. A subtree entry descriptor 304 (FIG. 4) is stored for route s4 in $504a^3$ and s5 in $504a^4$. The subtree entry descriptor 304 (FIG. 4) stored in mapper entry $504a^4$ for s5 provides the subtree index 312b for subtree memory 400b to start the next level search; that is for mapper level_3 2004.

Subtree $B_2$ is also a sparse subtree because it has two routes; that is, h1 and r6. Node descriptors $1402b^1$-$1402b^2$ are stored in sparse subtree descriptor $1400b^1$ in subtree entry 404b in subtree memory 400b. Each route in Subtree $B_2$ is stored in a mapper entry $504b^2$-$504b^3$ and the default route for Subtree $B_2$ is stored in mapper entry $504b^1$.

To search for route h1 in Subtree $B_2$ 2006, the address of the subtree entry 404a storing the sparse subtree descriptor $1400a$ which stores the node descriptor 1402 for route s5 is forwarded on subtree index 312a to subtree memory 400a. The data field 406 and pointers field 408 stored in the selected subtree entry 404a are forwarded on subtree data 412a and subtree pointers 414a to the mapper address logic 402a. The mapper address logic 402a generates the mapper address 416a for the mapper entry $504a^4$ storing the subtree entry for s5. The mapper address 416a is dependent on the subtree data 412a, subtree pointers 414a and a next portion of the key 210b. The subtree entry for s5 is forwarded on subtree index 312b to subtree memory 400b.

Subtree memory 400b stores node descriptors $1402b^2$, $1402b^1$ for subtree $B_2$ 2006. The sparse subtree descriptor $1400b^1$ for $B_2$ is stored in subtree entry 404b. The data field 406 and pointers field 408 stored in subtree entry 404b are forwarded on subtree data 412b and subtree pointers 414b to mapper address logic 402b. The mapper address logic 402b generates the mapper address 416b for the mapper entry $504b^3$ storing the route entry for h1. The mapper address 416b is dependent on the subtree data 412b, subtree pointers 414b and a next portion of the key 210c.

To add route h2 to subtree $B_2$ 2006, a block of previously unused mapper entries 602c in subtree mapper 418b are allocated to store mapper entries $504c^2$-$504c^4$ storing routes r6, h1 and h2 for Subtree $B_2'$ 2008. Mapper entry $504c^1$ stores the default entry for Subtree $B_2'$ 2008; that is, the same value stored in mapper entry $504b^1$. Mapper entry $504c^2$ stores the route entry for route r6; that is, the same value stored in mapper entry $504b^2$. Mapper entry $504c^3$ stores the route entry for route h1; that is the same value stored in mapper entry $504b^3$. Mapper entry $504c^4$ stores the route entry for the new route h2. While the block of mapper entries $504c^{1-4}$ are being written, the route entries stored in mapper entries $504b^1$-$504b^3$ can be accessed through the subtree entry stored for route s5 in $504a^4$ in subtree mapper 418a.

Having stored the mapper entries $504c^{1-4}$ for subtree $B_2'$ 2008 in subtree mapper 418b, a sparse subtree descriptor $1400c^1$ is added to the subtree memory 400b. The number of node descriptors $1402c^{1-3}$ is less than sixteen, therefore, the node descriptors $1402c^{1-3}$ are stored in a sparse subtree descriptor $1400c^1$. The location of the subtree descriptor 1400 in the subtree memory 400b is dependent on the number of node descriptors $1402c^{1-3}$ associated with the sparse subtree descriptor $1400c^1$. By adding a new route to subtree $B_2$ 2006, the number of node descriptors $1402c^1$-$1402c^3$ to be stored for the sparse subtree descriptor $1400c^1$ has increased from two to three. The sparse subtree descriptor $1400c^1$ is stored in a subtree entry 404c with three node descriptors per sparse subtree descriptor and the mode field 1404 set to '2'. The sparse subtree descriptor $1400c^1$ is stored in a current mode 3 subtree entry 404c if there is space available or a new mode 3 subtree entry is allocated. Node descriptors for routes in $B_2'$ 2008 are stored in node descriptors $1402c^{1-3}$ in the sparse subtree descriptor $1400c^1$ in the mode 3 subtree entry 404c.

After the sparse subtree descriptor $1400c^1$ and node descriptors $1402c^{1-3}$ have been stored in subtree memory 400b, subtree $B_2'$ 2008 can be accessed. To provide access to $B_2'$ 2008, subtree entry $504a^4$ is modified to index sparse subtree descriptor $1400c^1$ in subtree entry 404c instead of sparse subtree descriptor $1400b^1$ in subtree entry 404b. The route entry for route h2 stored in mapper entry $504c^4$ and routes r6 and h1 stored in respective mapper entries $504c^2$ and $504c^3$ can be accessed.

Mapper entries $504b^1$-$504b^3$ can no longer be accessed and are deallocated and placed on a free list (not shown) for future allocation. Also, sparse subtree descriptor $1400b^1$ can no longer be accessed. Thus, sparse subtree descriptor $1400b^1$ is deallocated and placed on a free list (not shown) for future allocation.

The addition of a route to a sparse subtree has been described. A route can also be added to a dense subtree by storing a new dense subtree descriptor in a newly allocated subtree entry 404 and the corresponding mapper entries in the subtree mapper 418, and modifying the subtree entry stored in mapper entry $504a^4$ to index the newly allocated subtree entry 404.

Figure 26:
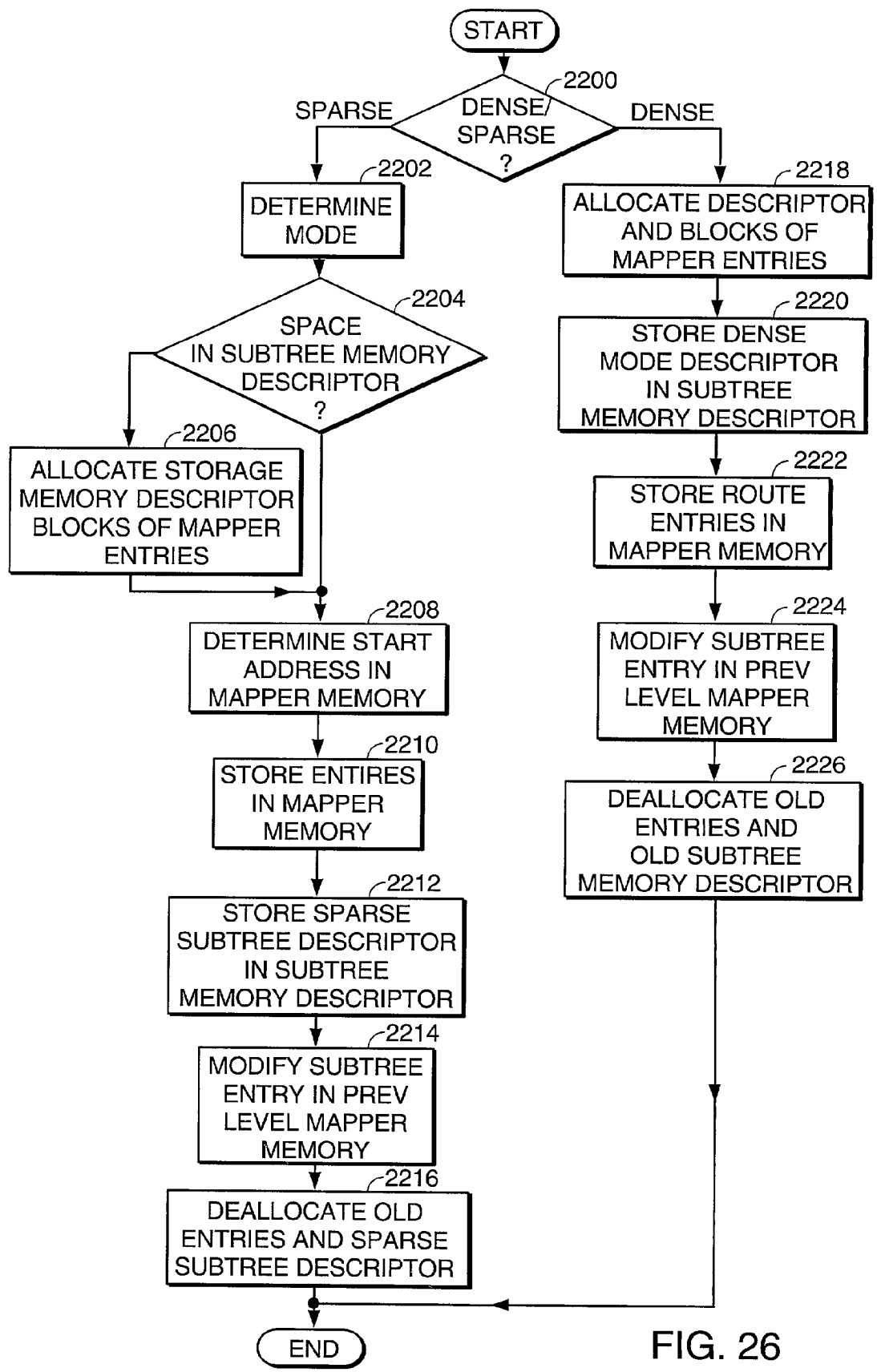
FIG. 26 is a flowchart illustrating the steps for adding the new route to the lookup table shown in FIG. 25.

FIG. 26 is a flowchart illustrating the steps for performing an incremental update to add a route to the lookup table 200 shown in FIG. 25.

At step 2200, the number of routes per subtree is computed to determine if the route update results in a sparse or dense subtree. If the subtree is dense after the route update, processing continues with step 2218. If the subtree is sparse after the route update, processing continues with step 2202.

At step 2202, the subtree is sparse. The sparse subtree mode is determined. Processing continues with step 2204.

At step 2204, a list of partially filled subtree entries 404 stored in the subtree mapper 418 (FIG. 5) is searched to determine if the new sparse subtree descriptor $1400c^1$ can be stored in a previously allocated subtree entry 404. For example, four sparse subtree descriptors $1400c^1$-$1400c^4$ can be stored in a mode 4 subtree entry 404. If only three are stored, the subtree entry 404 is partially filled and stored on the list of partially filled subtree entries 404. If there is a partially filled subtree entry 404 available, processing continues with step 2208. If not, processing continues with step 2206.

At step 2206, a new subtree entry 404c is allocated for storing the sparse subtree descriptor $1400c^1$ and mapper entries $504c^1$-$504c^4$ are allocated in the subtree mapper for storing the mapper entries 504 (FIG. 6B) for the node descriptors $1402c^1$-$1402c^3$ stored in the sparse subtree descriptor $1400c^1$ in the newly allocated subtree entry 404c. A pointer to an allocated block of mapper entries $504c^1$-$504c^4$ in subtree mapper 418 (FIG. 5) is stored in the pointers field 408 in the new subtree entry 404c. Processing continues with step 2208.

At step 2208, the location of the first mapper entry $504c^1$ in the subtree mapper for the sparse subtree descriptor $1400c^1$ is determined from pointers stored in the pointers field 408 in the subtree entry 404c and the mode stored in the mode field 1404 in the subtree entry 404c. Processing continues with step 2210.

At step 2210, the route entries for the sparse subtree are stored in the mapper entries $504c^1$-$504c^4$ in the subtree mapper 418b. Processing continues with step 2212.

At step 2212, the sparse subtree descriptor $1400c^1$ storing the node descriptors $1402c^1$-$1402c^3$ is stored in the subtree entry 404c. Processing continues with step 2214.

At step 2214, the subtree entry descriptor 304 (FIG. 4) stored in mapper entry $504a^4$ is modified to index the new sparse subtree descriptor $1400b^1$ stored in subtree entry 404c. The route entry for h2 stored in mapper entry $504c^4$ can now be accessed. Processing continues with step 2216.

At step 2216, mapper entries $504b^1$-$504b^3$ and sparse subtree descriptor 1400b can no longer be accessed. Mapper entries $504b^1$-$504b^3$ are placed on a free list of mapper entries 504 (FIG. 6B) for subtree mapper 418b and can be allocated for storing other routes. The first available location in subtree entry 404b is updated in the list of partially filled subtree entries. Processing is complete.

At step 2218, a new subtree entry 404 is allocated from a list of free subtree entries 404 stored in processor memory 2400 (FIG. 24). The new subtree entry 404 is allocated for storing a new dense subtree descriptor. Blocks of mapper entries 504 (FIG. 6B) in the subtree mapper 418b are allocated for storing the routes. The pointers to the blocks of allocated mapper entries 504 (FIG. 6B) are stored in the pointers field 408 (FIG. 7) in the subtree entry 404 (FIG.5). Processing continues with step 2220.

At step 2220, the new dense subtree descriptor is written in the data field 406 in the new subtree entry 404 as has been described earlier in conjunction with FIGS. 6A-B. Processing continues with step 2222.

At step 2222, the route entries for the dense subtree are stored in the mapper entries 504 (FIG. 6B) in subtree mapper 418 (FIG. 5) identified by the pointers stored in the pointers field 408 in the subtree entry 404. Processing continues with step 2224.

At step 2224, the subtree entry descriptor 304 (FIG. 4) stored in mapper entry $504a^4$ is modified to index the new dense subtree descriptor stored in the new subtree entry 404c. The route entry for h2 stored in mapper entry $504c^4$ can now be accessed. Processing continues with step 2226.

At step 2226, the mapper entries 504 (FIG. 6B) indexed by the pointers stored in the pointers field 408 in the old subtree entry 404 are returned to the free list of mapper entries stored in processor memory 2400 (FIG. 24). The old subtree entry 404b is added to a free list of subtree entries stored in processor memory 2400 (FIG. 24).

The process has been described for the addition of a route to the lookup table. A similar process is performed to delete a route from the lookup table. For example, to delete h2 $504c^4$ from Subtree $B_2$' requires storing a new sparse subtree descriptor with two node descriptors for routes r6 and h1, storing the sparse subtree descriptor in a mode 2 subtree entry, updating the corresponding subtree mapper and modifying the subtree entry descriptor 304 (FIG. 4) stored in mapper entry $504a^4$ to index the updated subtree descriptor stored in the new subtree entry 404.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for updating a lookup table comprising the steps of:
   providing access to a first set of routes stored in nodes of a first subtree within a tree, the first subtree being accessed through a first pointer to a first subtree root node of the first subtree;
   providing a second subtree disconnected from the tree, the second subtree being accessed through a second pointer to a second subtree root node of the second subtree and being initially inaccessible via the tree;
   storing a second set of routes in nodes of the second subtree while access via the tree is provided to the first set of routes stored in the first subtree by the first pointer, the second set of routes being a copy of the first set of routes with at least a new route added or an existing route deleted; and
   switching access to the second set of routes stored in the second subtree by replacing the first pointer to the first subtree root node with the second pointer to the second subtree root node to update the tree by replacing the first subtree with the second subtree.

2. The method as claimed in claim 1 further comprising the step of:
   deallocating memory used by the first set of routes after switching access.

3. The method as claimed in claim 1 wherein the number of routes in the first set of routes is less than the number of routes in the second set of routes.

4. The method as claimed in claim 1 wherein the number of routes in the first set of routes is greater than the number of routes in the second set of routes.

5. An apparatus for updating a lookup table comprising:
   a first subtree within a tree, the first subtree including a first subtree root node and a first set of routes stored in nodes of the first subtree, the first set of routes being initially accessible via the tree;
   a first pointer to the first subtree root node;
   a second subtree initially disconnected from the tree, the second subtree including a second subtree root node and a second set of routes stored in nodes of the second subtree, the second set of routes being a copy of the first set of routes with at least a new route added or an existing route deleted and being initially inaccessible via the tree;
   a second pointer to the second subtree root node; and
   logic to switch access to the second set of routes by replacing in the tree the first pointer to the first subtree root node with the second pointer to the second subtree root node to update the tree by replacing the first subtree with the second subtree.

6. The apparatus as claimed in claim 5 further comprising:
   deallocation logic to deallocate memory used by the first set of routes after switching access.

7. The apparatus as claimed in claim 5 wherein the number of routes in the first set of routes is less than the number of routes in the second set of routes.

8. The apparatus as claimed in claim 5 wherein the number of routes in the first set of routes is greater than the number of routes in the second set of routes.

9. An apparatus for updating a lookup table comprising:
a first pointer to a first subtree root node of a first subtree within a tree, the first pointer providing access to a first set of routes stored in nodes of the first subtree;
a second pointer to a second subtree root node of a second subtree disconnected from the tree, the second pointer providing access to a second set of routes stored in nodes of the second subtree, the second set of routes being a copy of the first set of routes with at least a new route added or an existing route deleted and being initially inaccessible via the tree while access via the tree is provided to the first set of routes stored in the first subtree by the first pointer; and
logic to provide access to the second set of routes by replacing the first pointer to the first subtree root node with the second pointer to the second subtree root node to update the tree by replacing the first subtree with the second subtree.

10. The apparatus as claimed in claim 9 further comprising:
deallocation logic to deallocate memory used by the first set of routes after the first pointer is replaced.

11. The apparatus as claimed in claim 9 wherein the number of routes in the first set of routes is less than the number of routes in the second set of routes.

12. The apparatus as claimed in claim 9 wherein the number of routes in the first set of routes is greater than the number of routes in the second set of routes.

13. A method for updating a lookup table, the lookup table providing a longest prefix match for a destination address, comprising the steps of:
providing access to a first set of routes stored in nodes of a first subtree within a tree, the first subtree being accessed through a first pointer to a first subtree root node of the first subtree;
providing a second subtree disconnected from the tree, the second subtree being accessed through a second pointer to a second subtree root node of the second subtree and being initially inaccessible via the tree;
storing a second set of routes in nodes of the second subtree while access via the tree is provided to the first set of routes stored in the first subtree by the first pointer, the second set of routes being a copy of the first set of routes with at least a new route added or an existing route deleted; and
switching access to the second set of routes stored in the second subtree by replacing the first pointer to the first subtree root node with the second pointer to the second subtree root node to update the tree by replacing the first subtree with the second subtree.

14. The method of claim 13, wherein the first set of routes and the second set of routes include a longest prefix route for the destination address.

15. The method of claim 14, wherein the destination address includes an Internet Protocol address.

16. The method of claim 14, wherein the second set of routes includes another route corresponding to the longest prefix route for another destination address.

17. The method of claim 13, wherein the first set of routes and the second set of routes are associated with nodes at the bottom level of a subtree.

* * * * *